United States Patent
Kazi et al.

(10) Patent No.: US 9,292,212 B2
(45) Date of Patent: Mar. 22, 2016

(54) DETECTING STORAGE ERRORS IN A DISPERSED STORAGE NETWORK

(71) Applicant: CLEVERSAFE, INC., Chicago, IL (US)

(72) Inventors: Asimuddin Kazi, Naperville, IL (US); Jason K. Resch, Chicago, IL (US)

(73) Assignee: International Business Machines Corporation, Armonk, NY (US)

( * ) Notice: Subject to any disclaimer, the term of this patent is extended or adjusted under 35 U.S.C. 154(b) by 249 days.

(21) Appl. No.: 13/890,438

(22) Filed: May 9, 2013

(65) Prior Publication Data

US 2013/0346809 A1 Dec. 26, 2013

Related U.S. Application Data

(60) Provisional application No. 61/663,796, filed on Jun. 25, 2012.

(51) Int. Cl.
| | |
|---|---|
| G06F 11/07 | (2006.01) |
| G06F 3/06 | (2006.01) |
| G06F 11/10 | (2006.01) |
| G06F 11/08 | (2006.01) |
| G06F 11/00 | (2006.01) |

(52) U.S. Cl.
CPC .............. *G06F 3/0619* (2013.01); *G06F 3/065* (2013.01); *G06F 3/067* (2013.01); *G06F 11/08* (2013.01); *G06F 11/1068* (2013.01); *G06F 11/1076* (2013.01); *G06F 11/1092* (2013.01); *G06F 11/008* (2013.01); *G06F 2211/109* (2013.01)

(58) Field of Classification Search
CPC ............ G06F 11/1092; G06F 11/0727; G06F 2211/1028
USPC ........................................................ 714/6.22
See application file for complete search history.

(56) References Cited

U.S. PATENT DOCUMENTS

| | | | |
|---|---|---|---|
| 4,092,732 | A | 5/1978 | Ouchi |
| 5,454,101 | A | 9/1995 | Mackay et al. |
| 5,485,474 | A | 1/1996 | Rabin |
| 5,774,643 | A | 6/1998 | Lubbers et al. |

(Continued)

OTHER PUBLICATIONS

Shamir; How to Share a Secret; Communications of the ACM; vol. 22, No. 11; Nov. 1979; pp. 612-613.

(Continued)

*Primary Examiner* — Chae Ko
(74) *Attorney, Agent, or Firm* — Garlick & Markison; Timothy W. Markison

(57) ABSTRACT

A method begins by a dispersed storage (DS) processing module detecting, in accordance with a rebuilding process, a storage error of an encoded data slice stored in a storage node of a dispersed storage network (DSN) and identifying the encoded data slice for rebuilding. The method continues with the DS processing module identifying one or more storage traits associated with the encoded data slice and identifying encoded data slices having at least one storage trait in common with the one or more storage traits of the encoded data slice to produce identified encoded data slices. The method continues with the DS processing module prioritizing storage error detection analysis of the identified encoded data slices over other encoded data slices stored in the DSN and when a storage error is detected for one of the identified encoded data slices, identifying the one of the identified encoded data slices for rebuilding.

20 Claims, 61 Drawing Sheets

(56) References Cited

U.S. PATENT DOCUMENTS

| | | | |
|---|---|---|---|
| 5,802,364 A | 9/1998 | Senator et al. | |
| 5,809,285 A | 9/1998 | Hilland | |
| 5,890,156 A | 3/1999 | Rekieta et al. | |
| 5,987,622 A | 11/1999 | Lo Verso et al. | |
| 5,991,414 A | 11/1999 | Garay et al. | |
| 6,012,159 A | 1/2000 | Fischer et al. | |
| 6,058,454 A | 5/2000 | Gerlach et al. | |
| 6,128,277 A | 10/2000 | Bruck et al. | |
| 6,175,571 B1 | 1/2001 | Haddock et al. | |
| 6,192,472 B1 | 2/2001 | Garay et al. | |
| 6,256,688 B1 | 7/2001 | Suetaka et al. | |
| 6,272,658 B1 | 8/2001 | Steele et al. | |
| 6,301,604 B1 | 10/2001 | Nojima | |
| 6,356,949 B1 | 3/2002 | Katsandres et al. | |
| 6,366,995 B1 | 4/2002 | Vilkov et al. | |
| 6,374,336 B1 | 4/2002 | Peters et al. | |
| 6,415,373 B1 | 7/2002 | Peters et al. | |
| 6,418,539 B1 | 7/2002 | Walker | |
| 6,449,688 B1 | 9/2002 | Peters et al. | |
| 6,567,948 B2 | 5/2003 | Steele et al. | |
| 6,571,282 B1 | 5/2003 | Bowman-Amuah | |
| 6,606,718 B1* | 8/2003 | Bessios | 714/701 |
| 6,609,223 B1 | 8/2003 | Wolfgang | |
| 6,718,361 B1 | 4/2004 | Basani et al. | |
| 6,760,808 B2 | 7/2004 | Peters et al. | |
| 6,785,768 B2 | 8/2004 | Peters et al. | |
| 6,785,783 B2 | 8/2004 | Buckland | |
| 6,826,711 B2 | 11/2004 | Moulton et al. | |
| 6,879,596 B1 | 4/2005 | Dooply | |
| 7,003,688 B1 | 2/2006 | Pittelkow et al. | |
| 7,024,451 B2 | 4/2006 | Jorgenson | |
| 7,024,609 B2 | 4/2006 | Wolfgang et al. | |
| 7,080,101 B1 | 7/2006 | Watson et al. | |
| 7,103,824 B2 | 9/2006 | Halford | |
| 7,103,915 B2 | 9/2006 | Redlich et al. | |
| 7,111,115 B2 | 9/2006 | Peters et al. | |
| 7,140,044 B2 | 11/2006 | Redlich et al. | |
| 7,146,644 B2 | 12/2006 | Redlich et al. | |
| 7,171,493 B2 | 1/2007 | Shu et al. | |
| 7,222,133 B1 | 5/2007 | Raipurkar et al. | |
| 7,240,236 B2 | 7/2007 | Cutts et al. | |
| 7,272,613 B2 | 9/2007 | Sim et al. | |
| 7,636,724 B2 | 12/2009 | de la Torre et al. | |
| 8,386,841 B1* | 2/2013 | Renade | 714/6.22 |
| 2002/0062422 A1 | 5/2002 | Butterworth et al. | |
| 2002/0166079 A1 | 11/2002 | Ulrich et al. | |
| 2003/0018927 A1 | 1/2003 | Gadir et al. | |
| 2003/0037261 A1 | 2/2003 | Meffert et al. | |
| 2003/0065617 A1 | 4/2003 | Watkins et al. | |
| 2003/0084020 A1 | 5/2003 | Shu | |
| 2004/0024963 A1 | 2/2004 | Talagala et al. | |
| 2004/0122917 A1 | 6/2004 | Menon et al. | |
| 2004/0215998 A1 | 10/2004 | Buxton et al. | |
| 2004/0228493 A1 | 11/2004 | Ma | |
| 2005/0100022 A1 | 5/2005 | Ramprashad | |
| 2005/0114594 A1 | 5/2005 | Corbett et al. | |
| 2005/0125593 A1 | 6/2005 | Karpoff et al. | |
| 2005/0131993 A1 | 6/2005 | Fatula, Jr. | |
| 2005/0132070 A1 | 6/2005 | Redlich et al. | |
| 2005/0144382 A1 | 6/2005 | Schmisseur | |
| 2005/0226325 A1* | 10/2005 | Dei et al. | 375/240.12 |
| 2005/0229069 A1 | 10/2005 | Hassner | |
| 2006/0047907 A1 | 3/2006 | Shiga et al. | |
| 2006/0136448 A1 | 6/2006 | Cialini et al. | |
| 2006/0156059 A1 | 7/2006 | Kitamura | |
| 2006/0224603 A1 | 10/2006 | Correll, Jr. | |
| 2007/0079081 A1 | 4/2007 | Gladwin et al. | |
| 2007/0079082 A1 | 4/2007 | Gladwin et al. | |
| 2007/0079083 A1 | 4/2007 | Gladwin et al. | |
| 2007/0088970 A1 | 4/2007 | Buxton et al. | |
| 2007/0174192 A1 | 7/2007 | Gladwin et al. | |
| 2007/0214285 A1 | 9/2007 | Au et al. | |
| 2007/0234110 A1 | 10/2007 | Soran et al. | |
| 2007/0283167 A1 | 12/2007 | Venters, III et al. | |
| 2009/0094251 A1 | 4/2009 | Gladwin et al. | |
| 2009/0094318 A1 | 4/2009 | Gladwin et al. | |
| 2009/0132755 A1* | 5/2009 | Radke | 711/103 |
| 2010/0023524 A1 | 1/2010 | Gladwin et al. | |
| 2011/0122523 A1* | 5/2011 | Gladwin et al. | 360/49 |
| 2011/0209032 A1* | 8/2011 | Choi et al. | 714/773 |
| 2011/0307424 A1* | 12/2011 | Jin et al. | 706/12 |
| 2012/0179870 A1* | 7/2012 | Wang et al. | 711/114 |
| 2014/0247516 A1* | 9/2014 | Gladwin et al. | 360/49 |
| 2015/0067245 A1* | 3/2015 | Kruger | 711/103 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68.

Satran, et al.; Internet Small Computer Systems Interface (iSCSI); IETF Network Working Group; RFC 3720; Apr. 2004; pp. 1-257.

Xin, et al.; Evaluation of Distributed Recovery in Large-Scale Storage Systems; 13th IEEE International Symposium on High Performance Distributed Computing; Jun. 2004; pp. 172-181.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

* cited by examiner

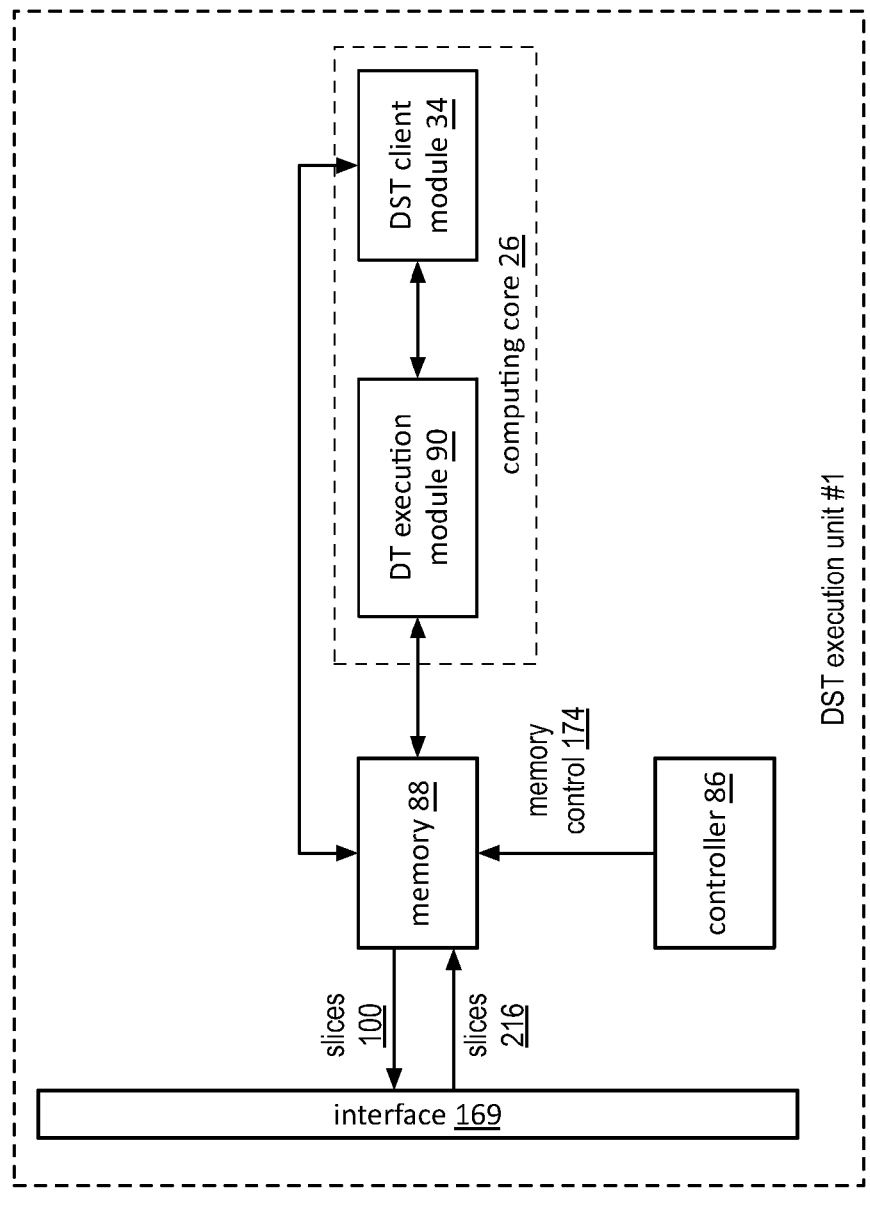
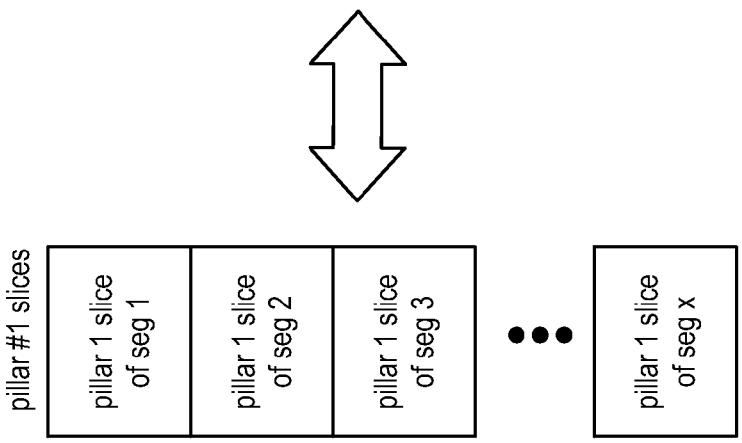
FIG. 24

| DST allocation info 242 | data partition info 320: ⓜ data ID; No. of partitions; Addr. info for each partition; format conversion indication |
|---|---| task execution info 322

| task 326 | task ordering 328 | data partition 330 | set of DT EX mods 332 | Name 334 | interm. result processing 336 | scratch pad storage 338 | intermediate result storage 340 |
|---|---|---|---|---|---|---|---|
| 1_1 | none | | 1_1, 2_1, 3_1, 4_1, & 5_1 | R1-1 | DST unit 1 | DST unit 1 | DST units 1-5 |
| 1_2 | none | 2_1 - 2_4 | 1_1, 2_1, 3_1, 4_1, & 5_1 | R1-2 | DST unit 1 | DST unit 1 | DST units 1-5 |
| 1_3 | none | 2_1 - 2_4 2_5 - 2_z | 1_1, 2_1, 3_1, 4_1, & 5_1 1_2, 2_2, 3_2, 4_2, & 5_2 | R1-3 | DST unit 2 | DST unit 2 | DST units 2-6 |
| 1_4 | after 1_3 | R1-3_1 - R1-3_4 R1-3_5 - R1-3_z | 1_1, 2_1, 3_1, 4_1, & 5_1 1_2, 2_2, 6_1, 7_1, & 7_2 | R1_4 | DST unit 3 | DST unit 3 | DST units 3-7 |
| 1_5 | after 1_4 | R1-4_1 - R1-4_z & 2_1 - 2_z | 1_1, 2_1, 3_1, 4_1, & 5_1 | R1-5 | DST unit 1 | DST unit 1 | DST units 1-5 |
| 1_6 | after 1_1 & 1_5 | R1-1_1 - R1-1_z & R1-5_1 - R1-5_z | 1_2, 2_2, 3_2, 4_2, & 5_2 | R1-6 | DST unit 2 | DST unit 2 | DST units 2-6 |
| 1_7 | after 1_2 & 1_5 | R1-2_1 - R1-2_z & R1-5_1 - R1-5_z | 1_2, 2_2, 3_2, 4_2, & 5_2 | R1-7 | DST unit 3 | DST unit 3 | DST units 3-7 |
| 2 | none | 2_1 - 2_z | 3_1, 4_1, 5_1, 6_1, & 7_1 | R2 | DST unit 7 | DST unit 7 | DST units 7, 1-4 |
| 3_1 | none (same as 1_3) | use R1_3 | | R1-1 | | | |
| 3_2 | after 3_1 | R1-3_1 - R1-3_z | 1_2, 2_2, 3_2, 4_2, & 5_2 | R3-2 | DST unit 5 | DST unit 5 | DST units 5,6, 1-3 | intermediate result info 324

FIG. 32

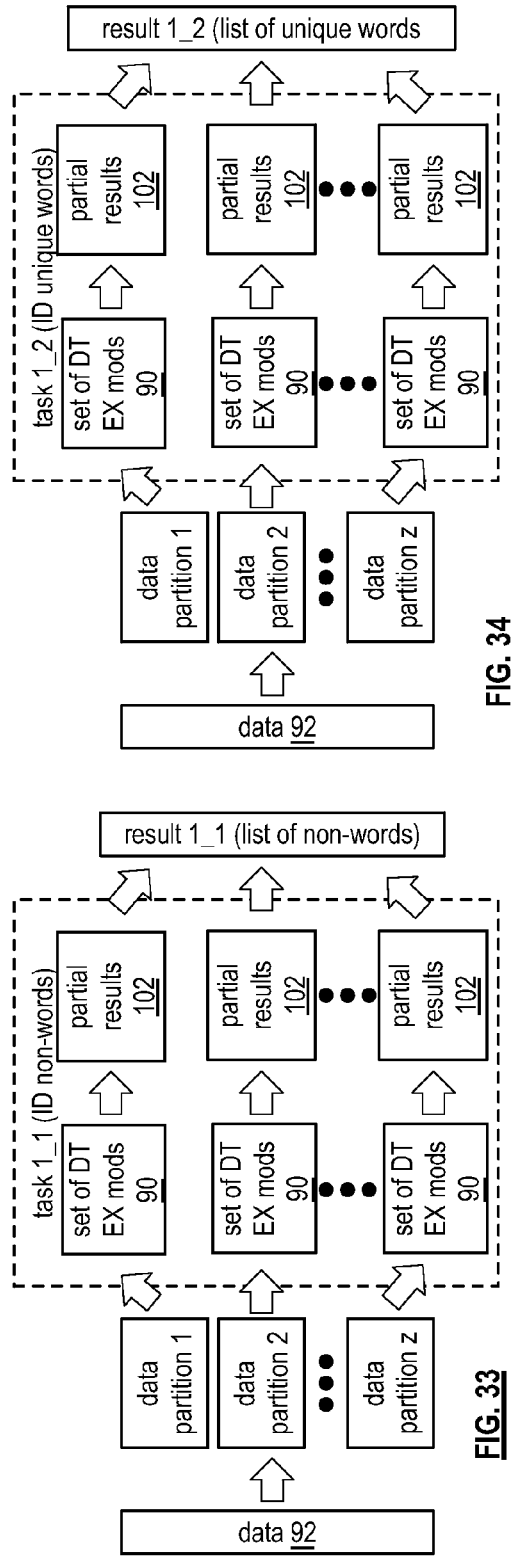
FIG. 33
FIG. 34
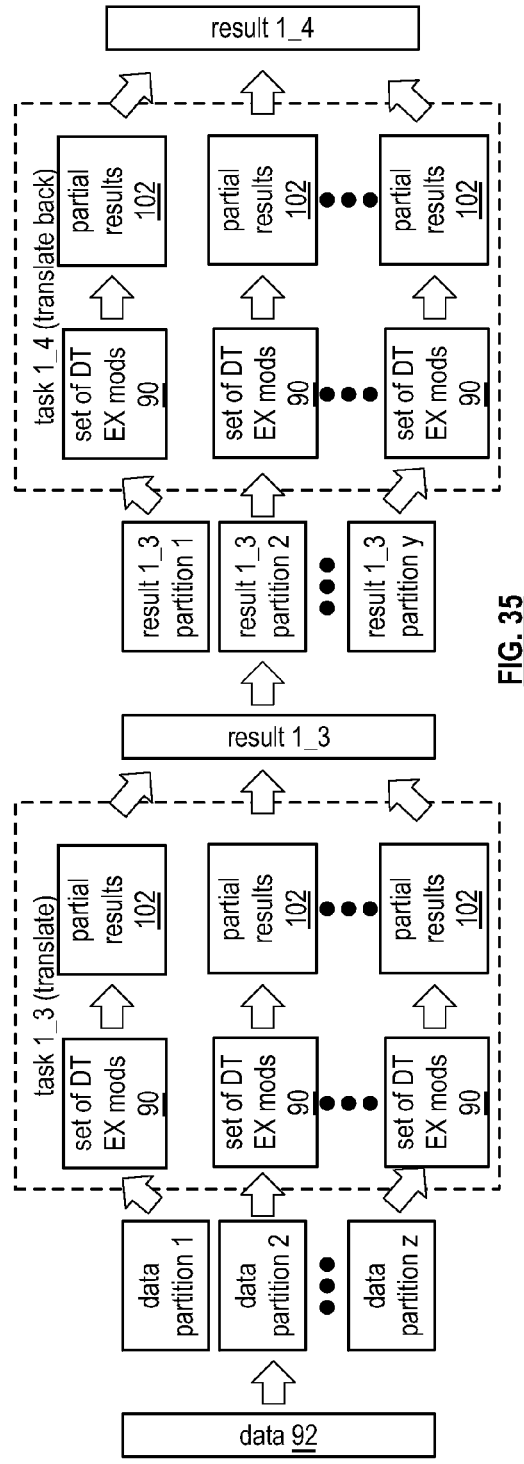
FIG. 35

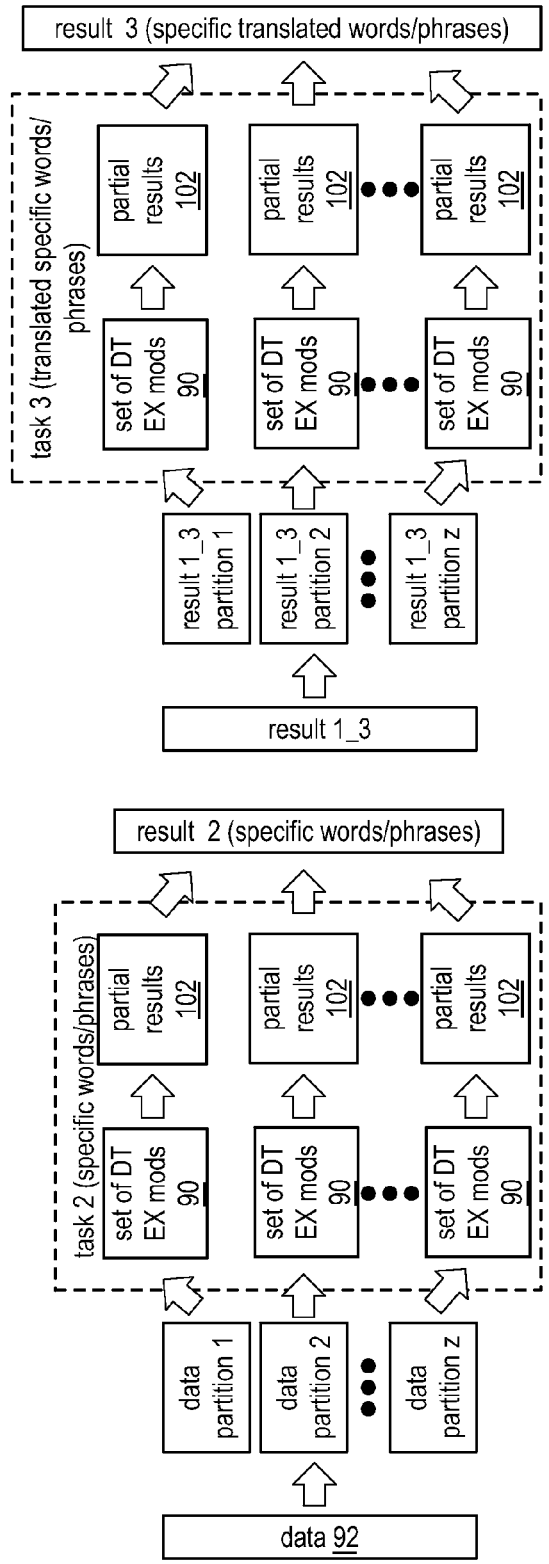
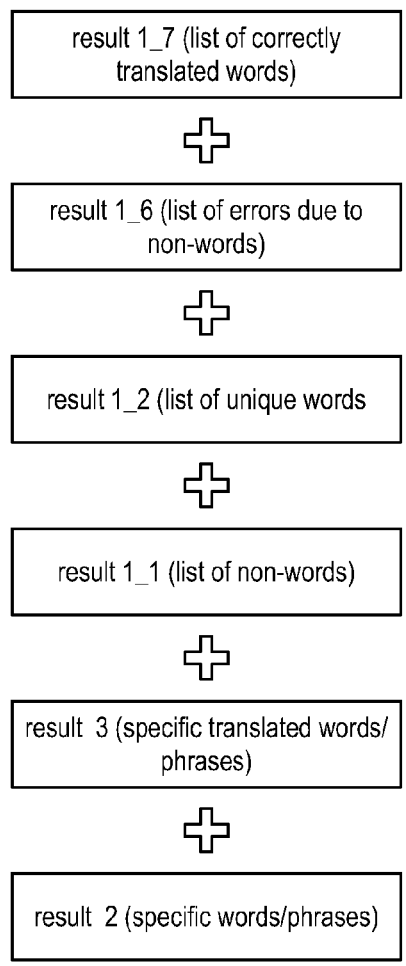
FIG. 37
FIG. 38
FIG. 39

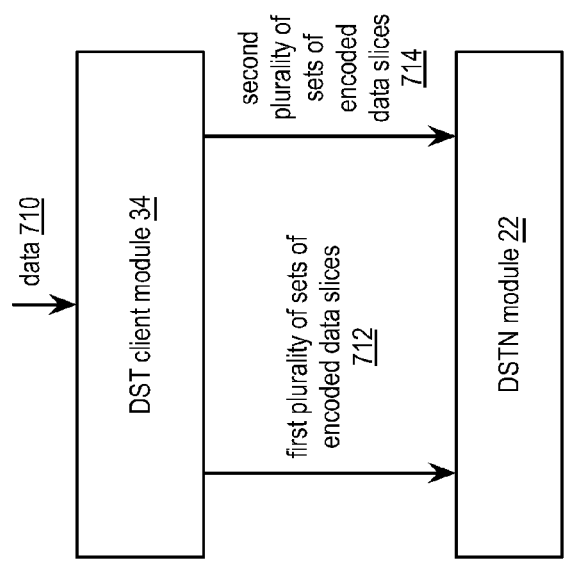

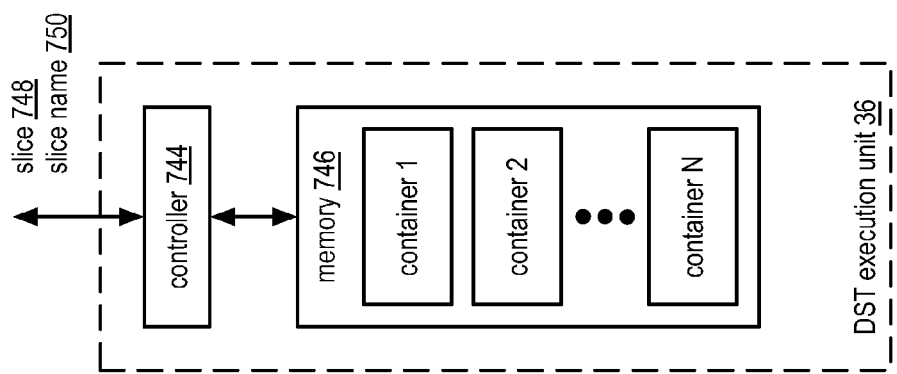

DETECTING STORAGE ERRORS IN A DISPERSED STORAGE NETWORK

CROSS REFERENCE TO RELATED PATENTS

The present U.S. Utility Patent Application claims priority under 35 U.S.C. §119(e) to a provisionally filed patent application entitled ACCESSING A DISTRIBUTED STORAGE AND TASK NETWORK having a provisional filing date of Jun. 25, 2012, and a provisional Ser. No. 61/663,796, which is incorporated herein by reference in its entirety.

STATEMENT REGARDING FEDERALLY SPONSORED RESEARCH OR DEVELOPMENT

NOT APPLICABLE

INCORPORATION-BY-REFERENCE OF MATERIAL SUBMITTED ON A COMPACT DISC

NOT APPLICABLE

BACKGROUND OF THE INVENTION

1. Technical Field of the Invention

This invention relates generally to computer networks and more particularly to dispersed storage of data and distributed task processing of data.

2. Description of Related Art

Computing devices are known to communicate data, process data, and/or store data. Such computing devices range from wireless smart phones, laptops, tablets, personal computers (PC), work station, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 24 is a schematic block diagram of an example of a storage operation of a DST execution unit in accordance with the present invention;

Figure 25:
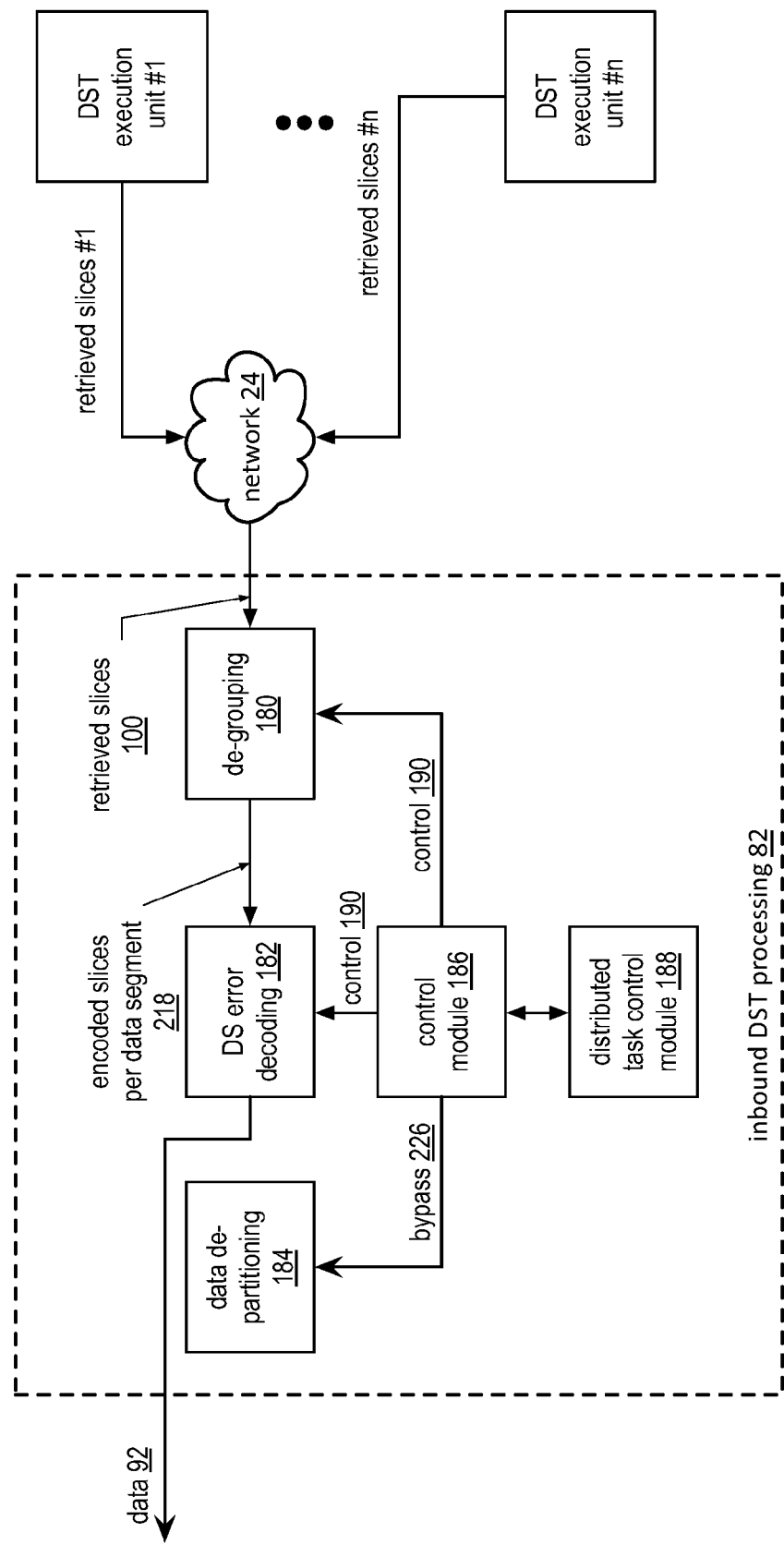
FIG. 25 is a schematic block diagram of an example of operation of inbound distributed storage and/or task (DST)
Figure 26:
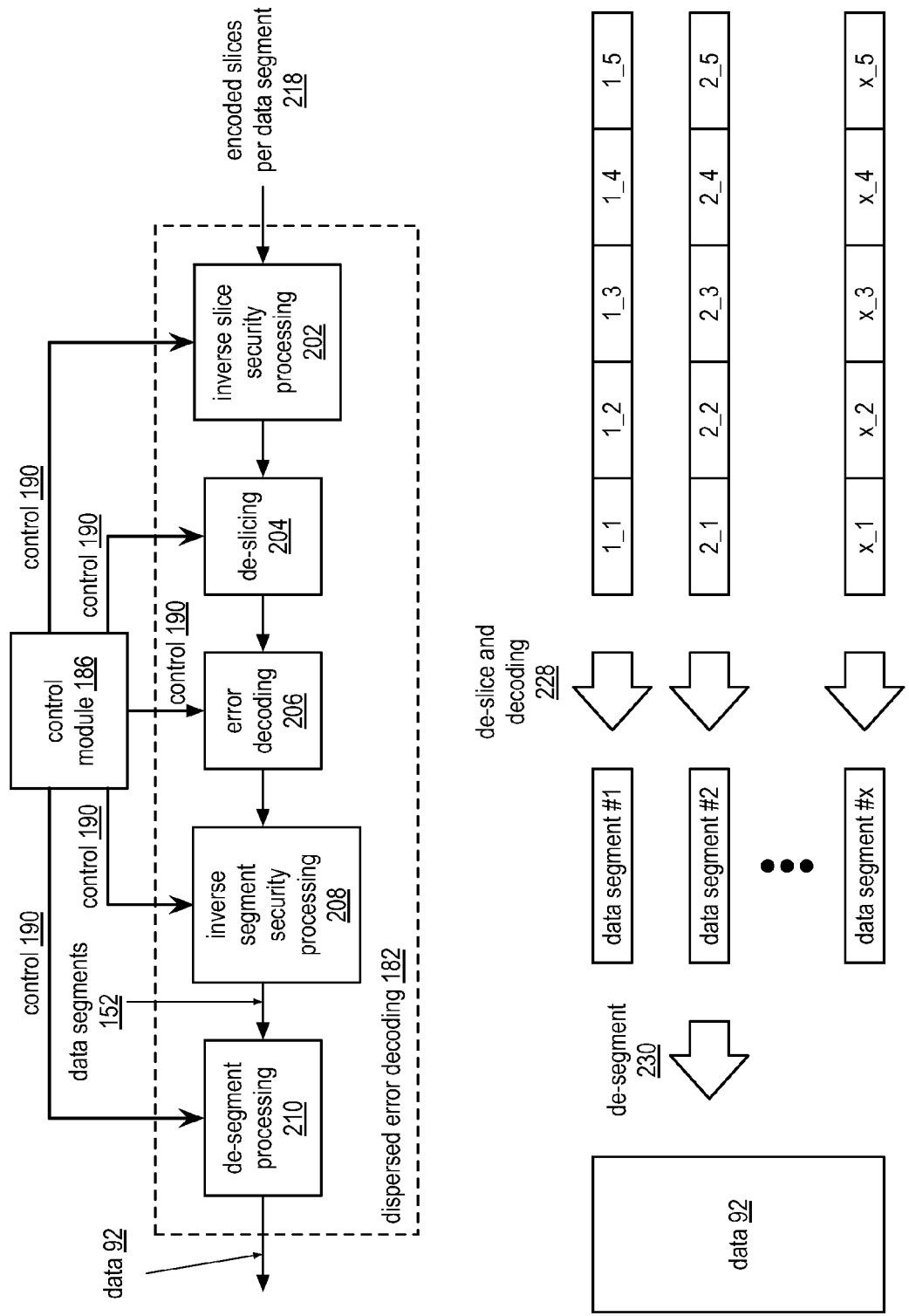
Figure 27:
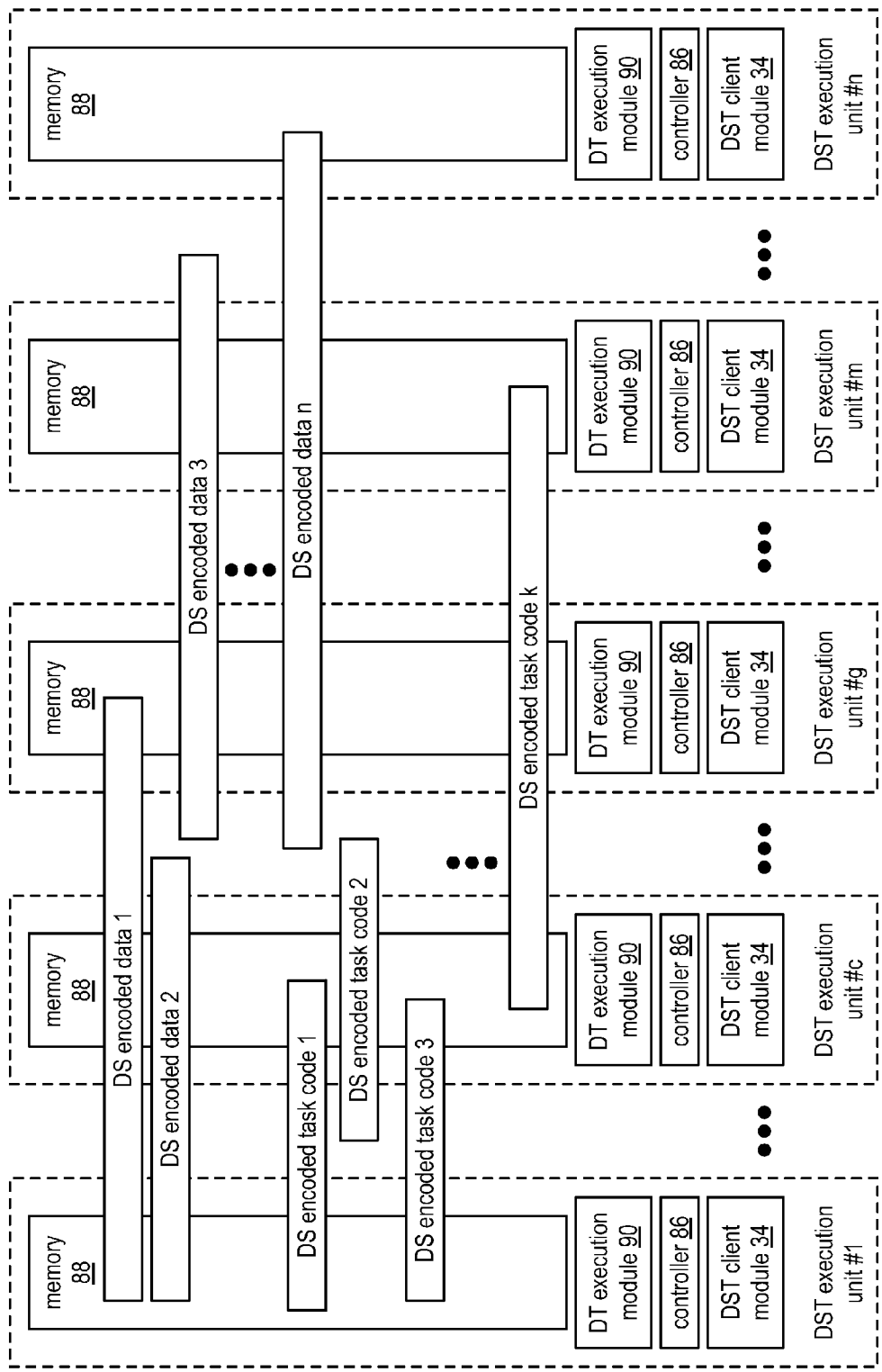
Figure 28:
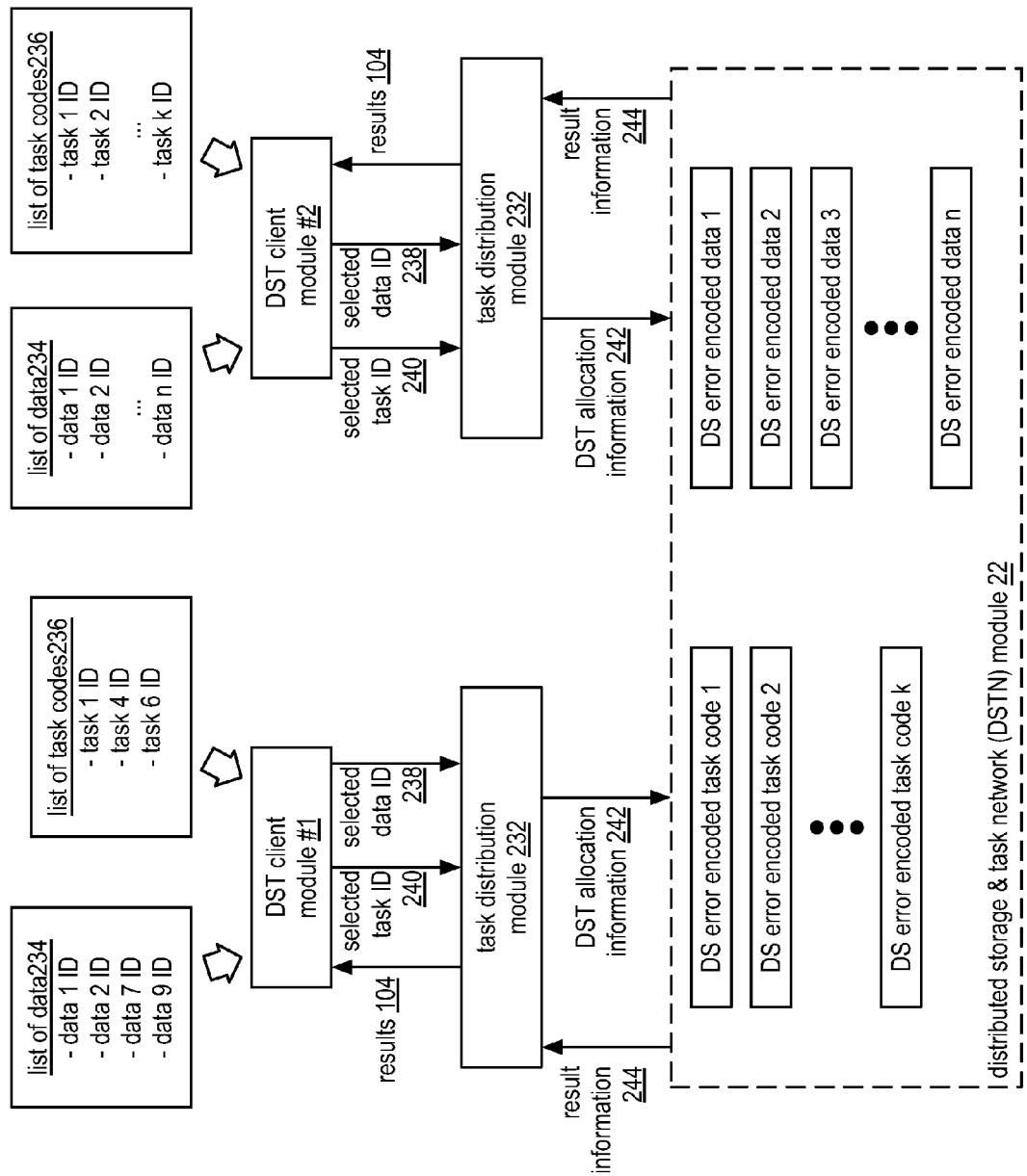
Figure 29:
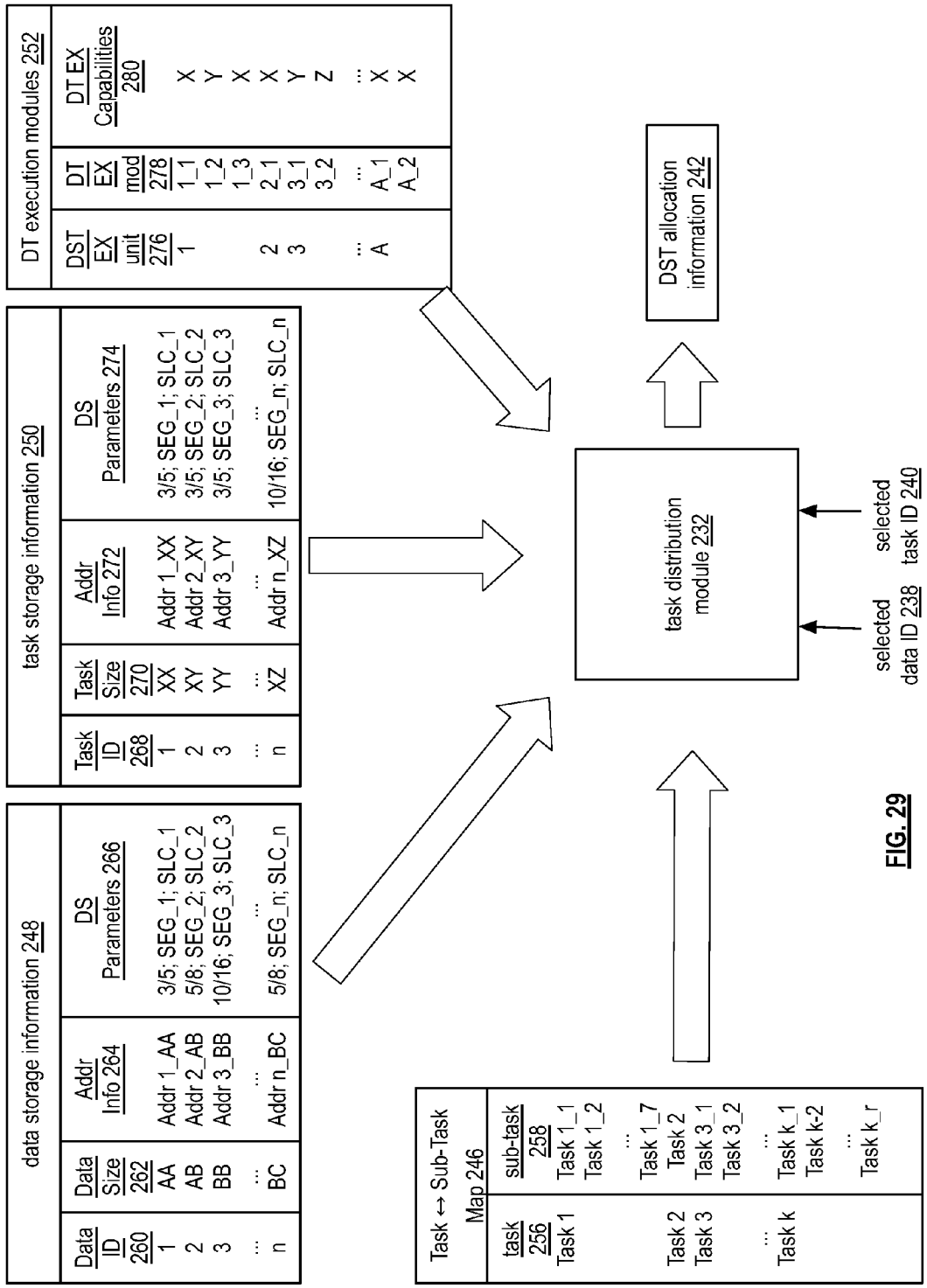
Figure 30:
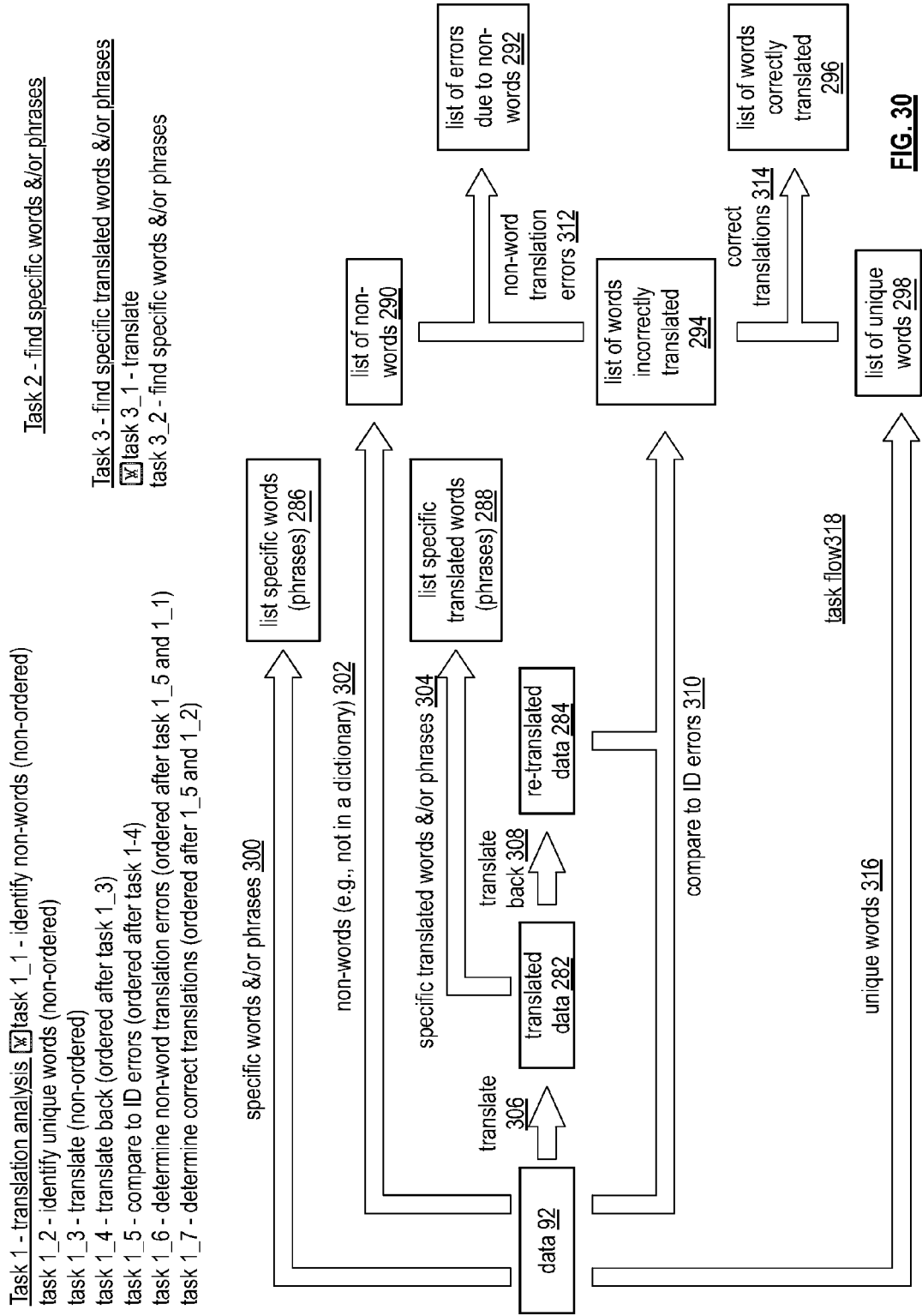
Figure 31:
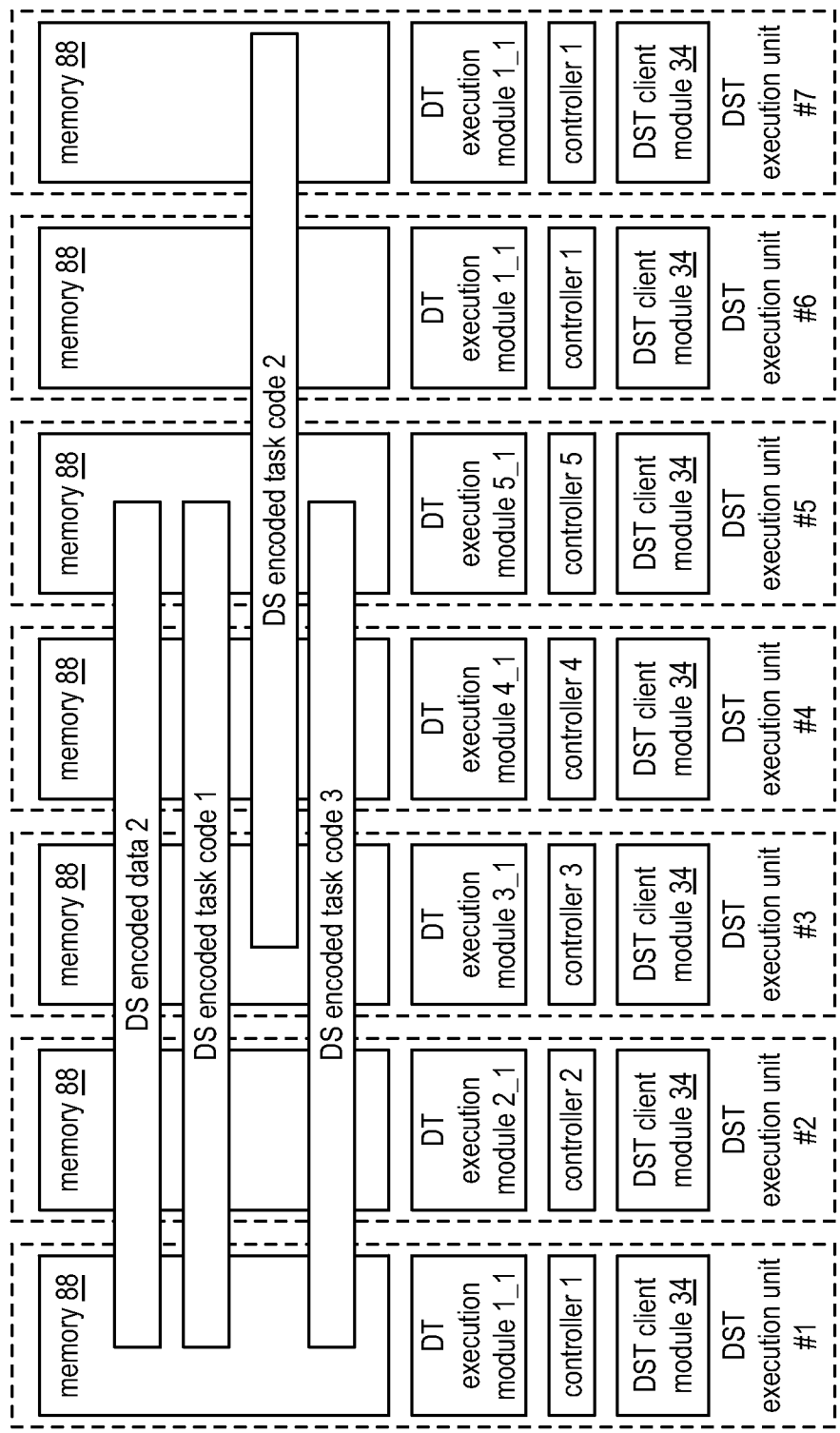
Figure 40A:
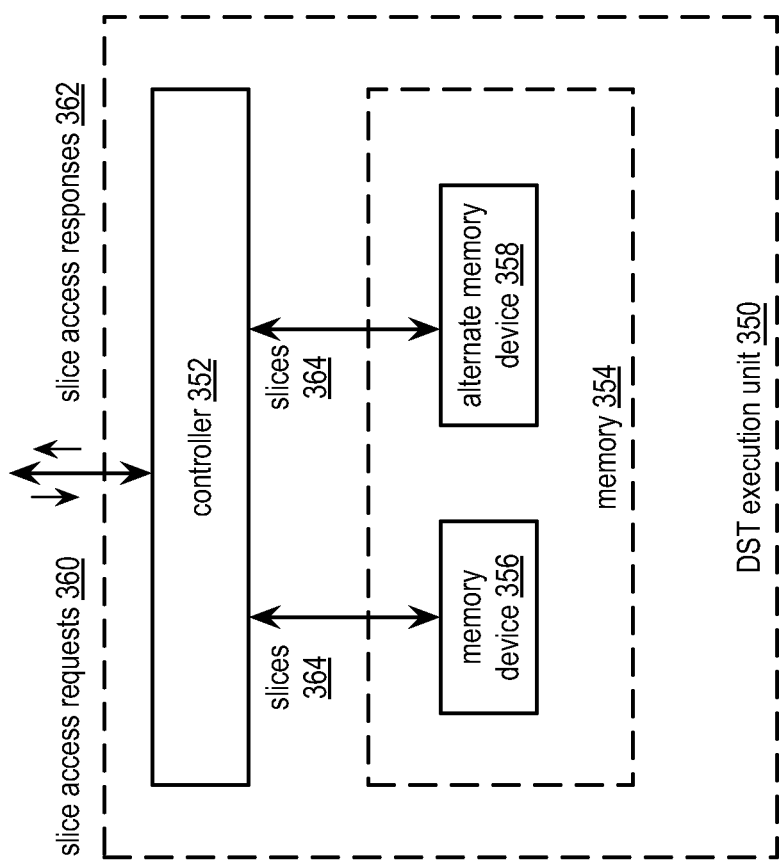
Figure 40B:
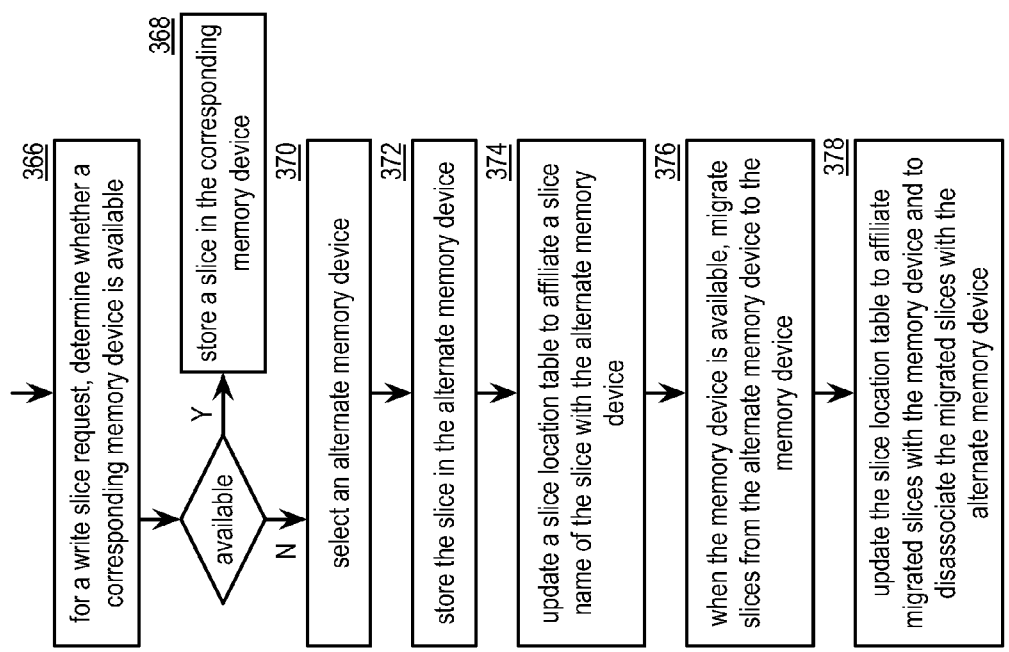
Figure 41A:
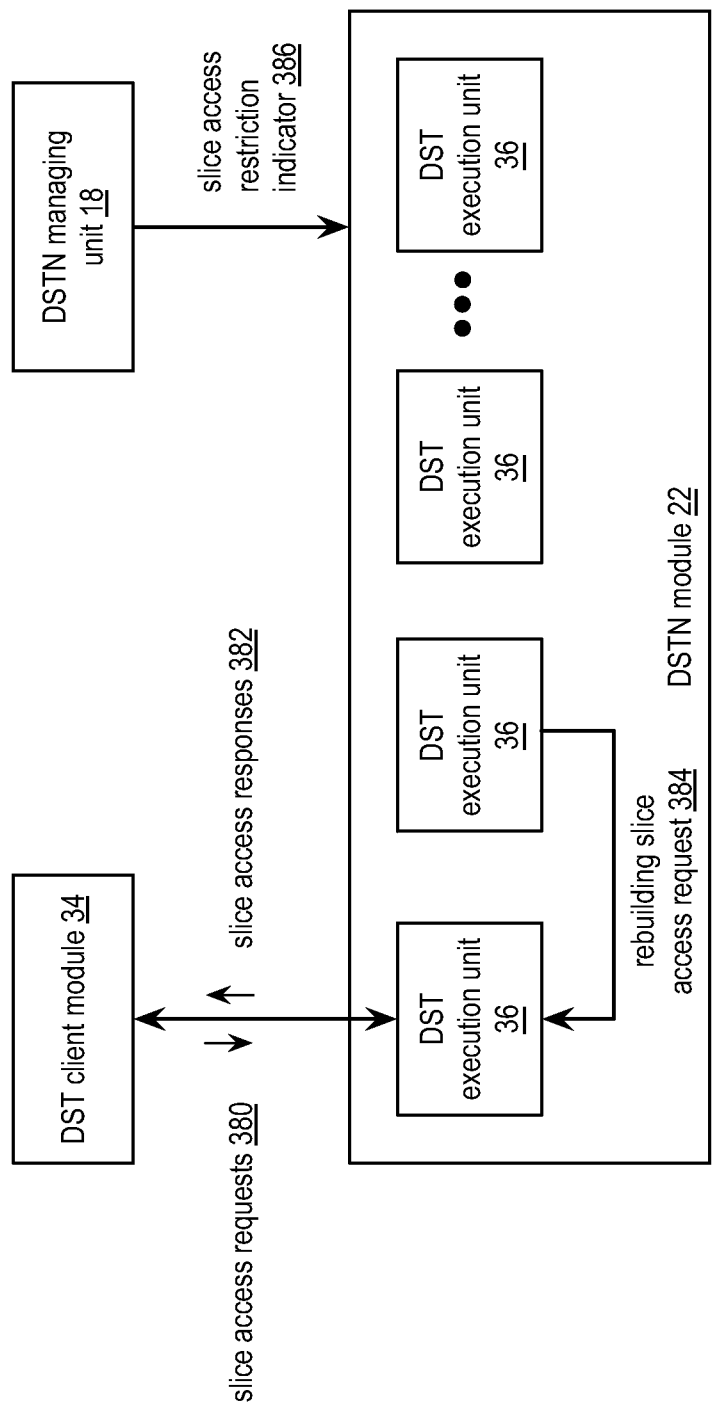
Figure 41B:
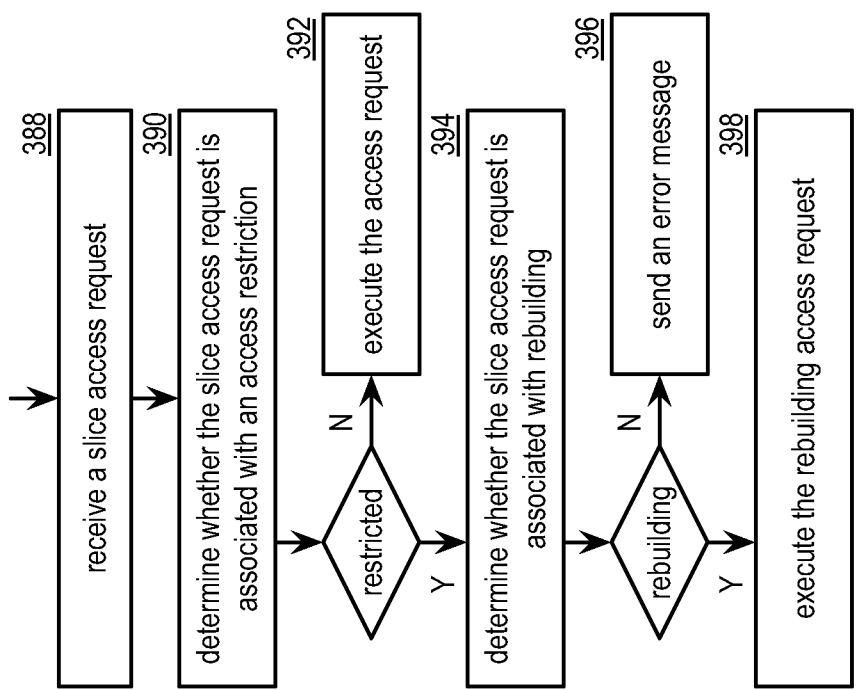
Figure 42:
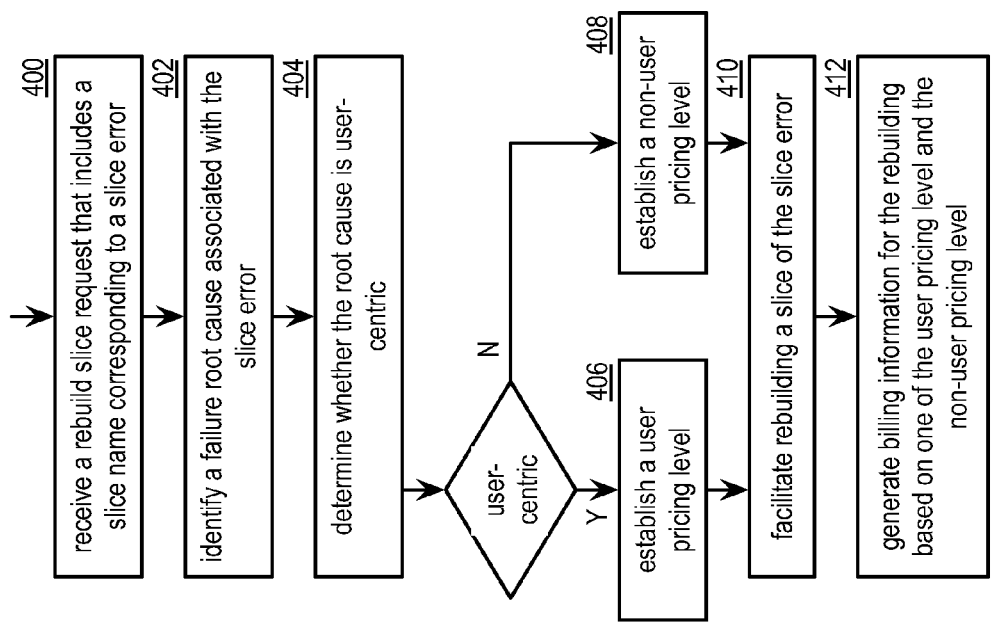
Figure 43B:
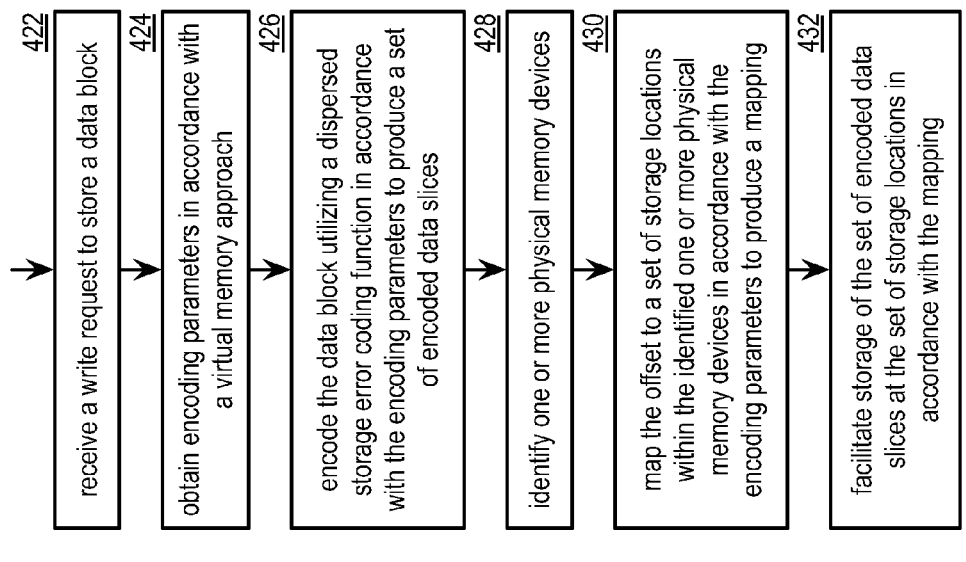
Figure 43A:
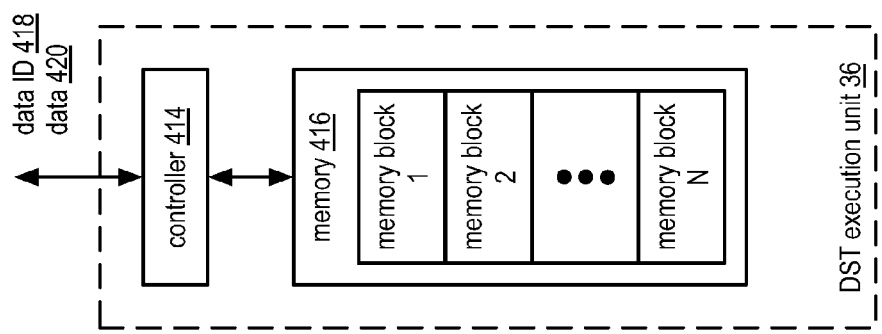
Figure 44A:
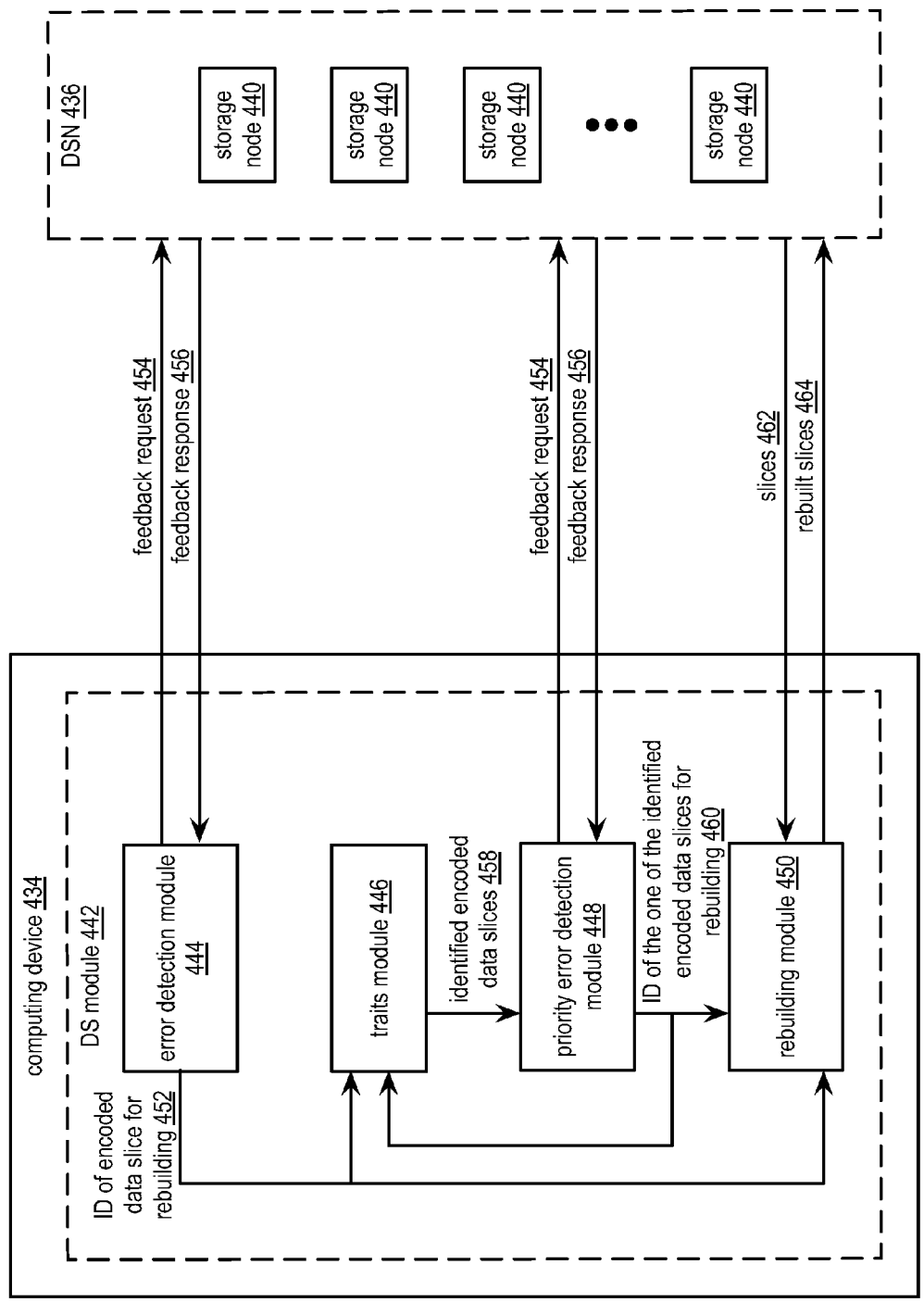
Figure 44B:
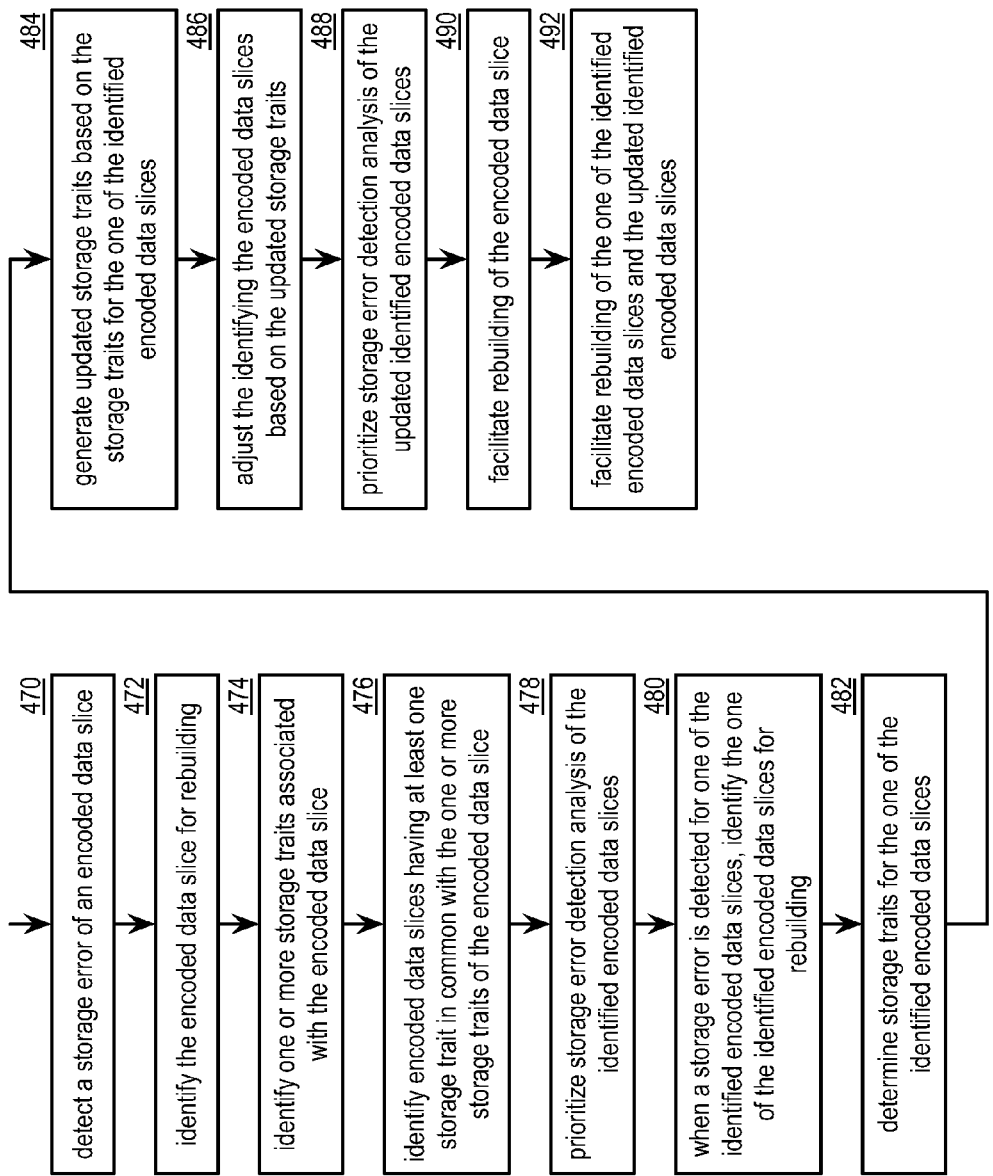
Figure 44C:
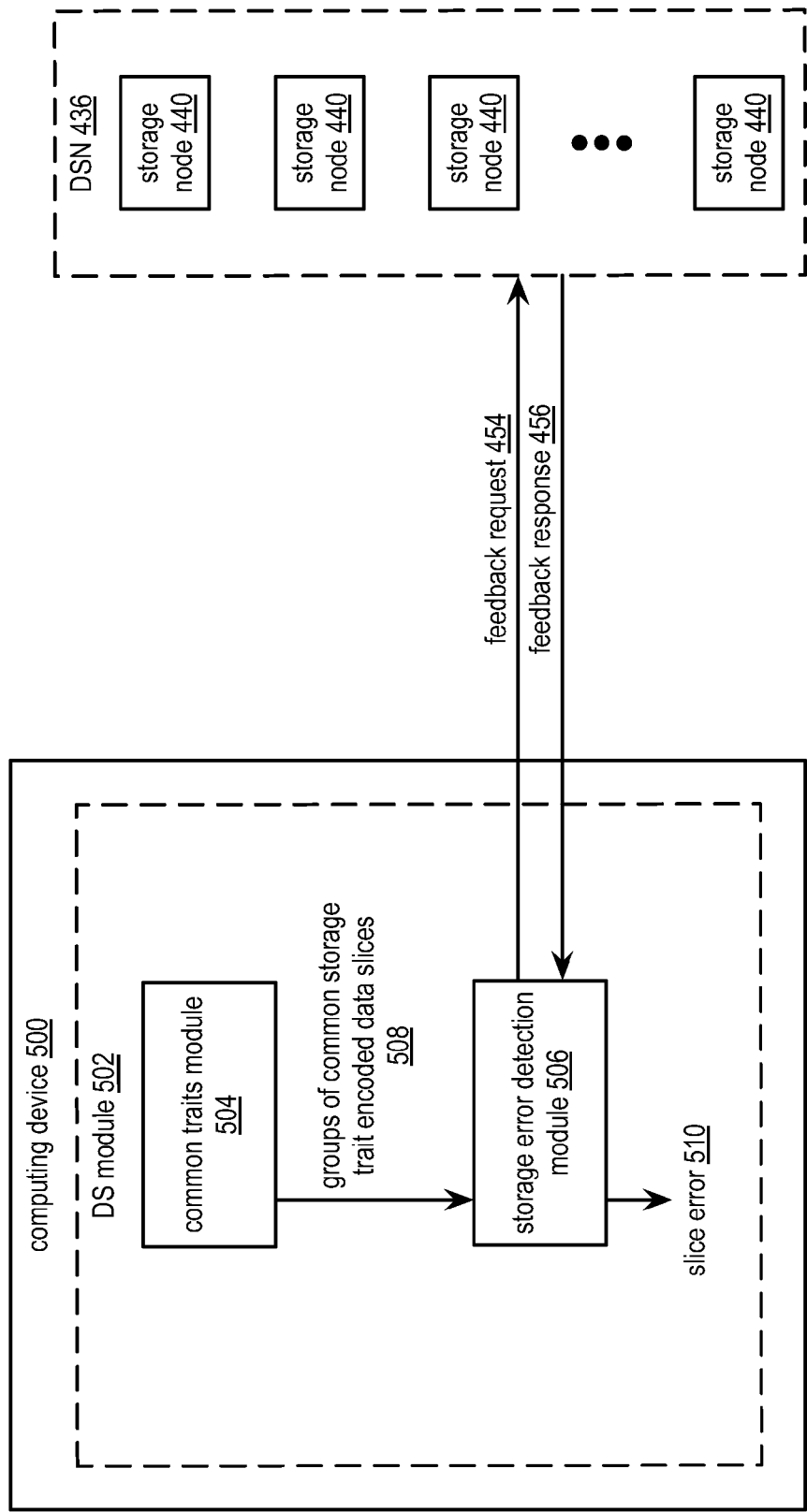
Figure 44D:
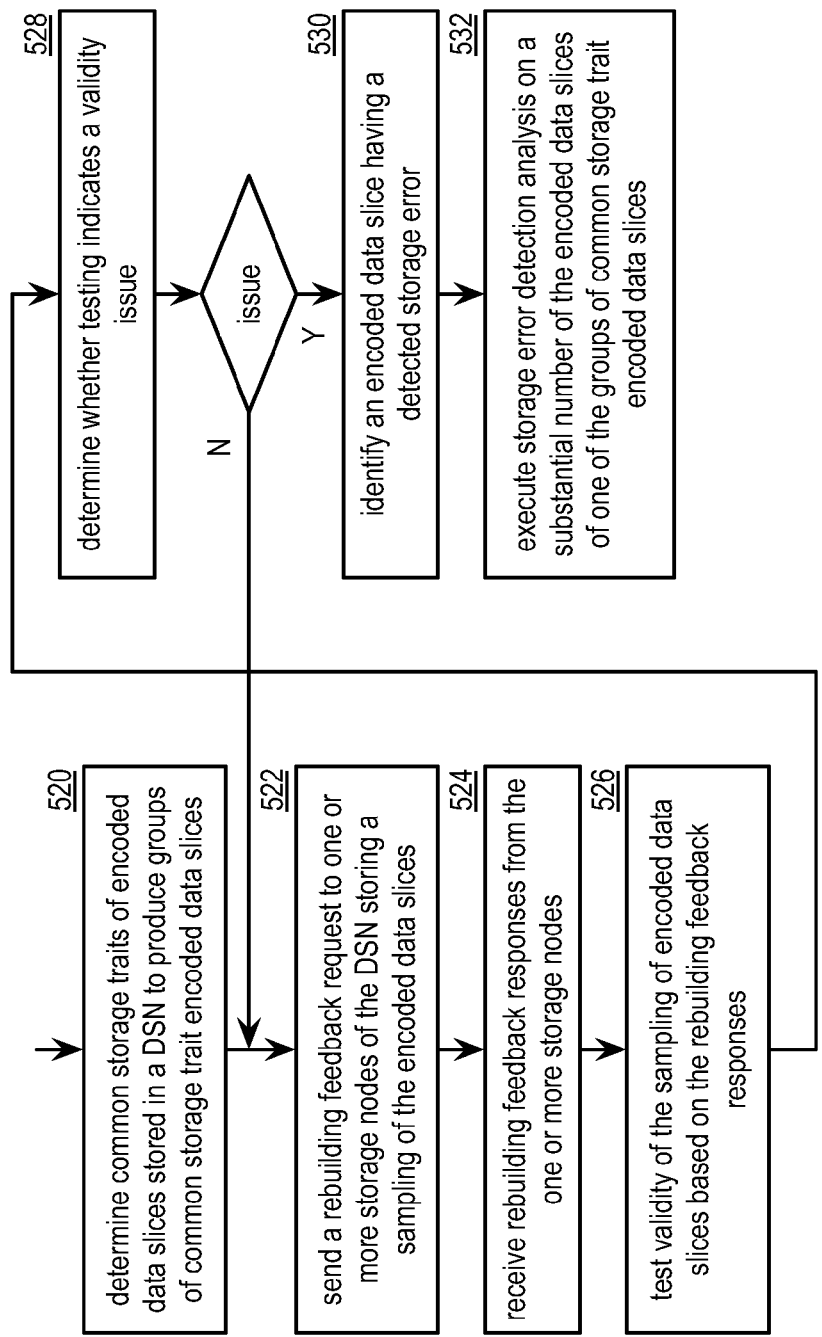
Figure 45:
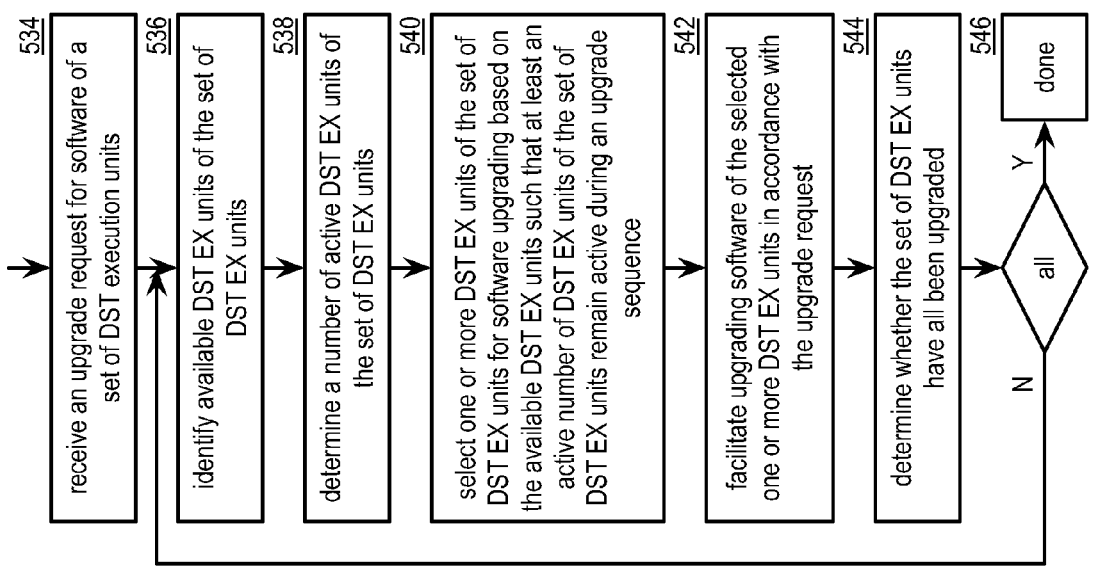
Figure 46:
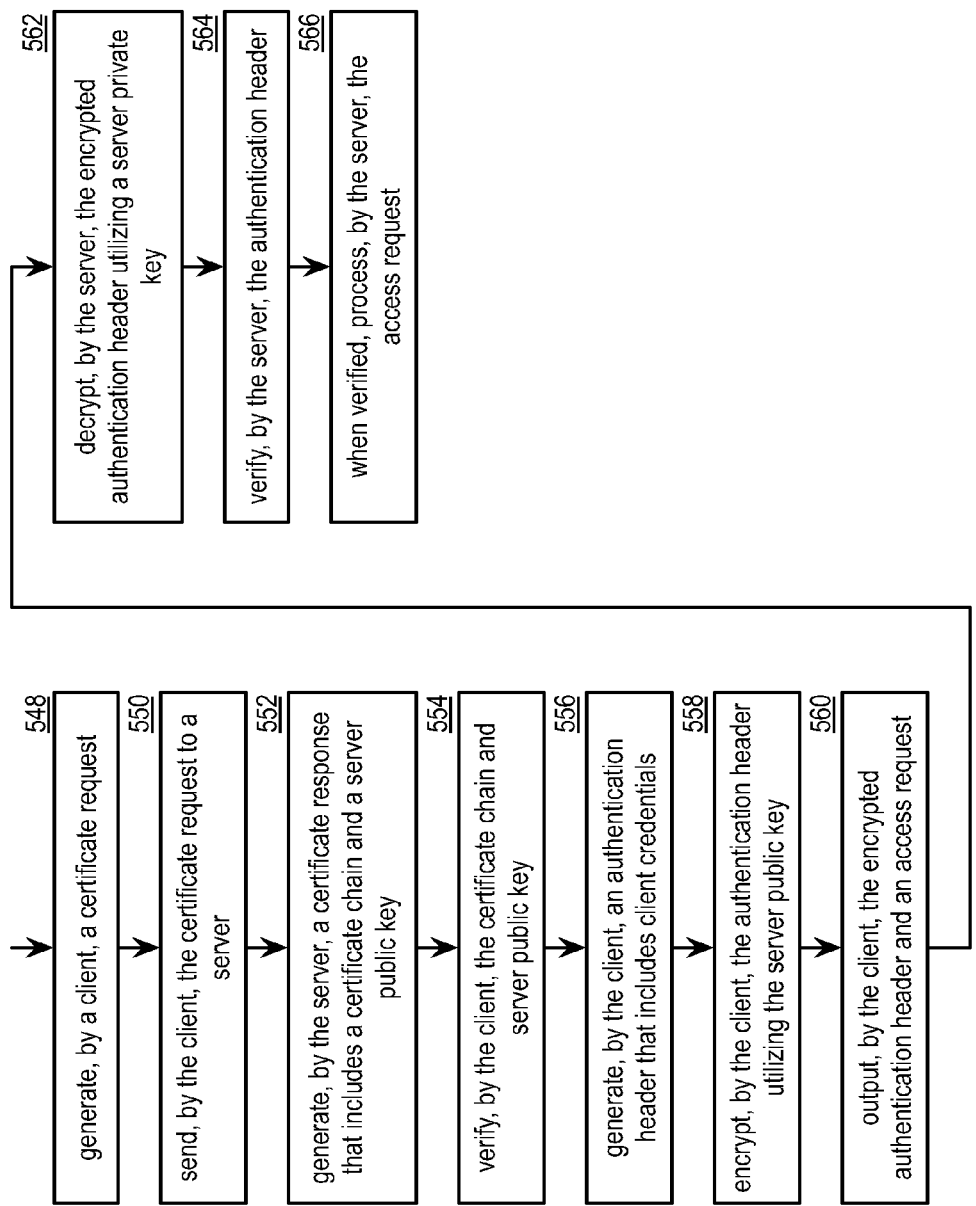
Figure 47A:
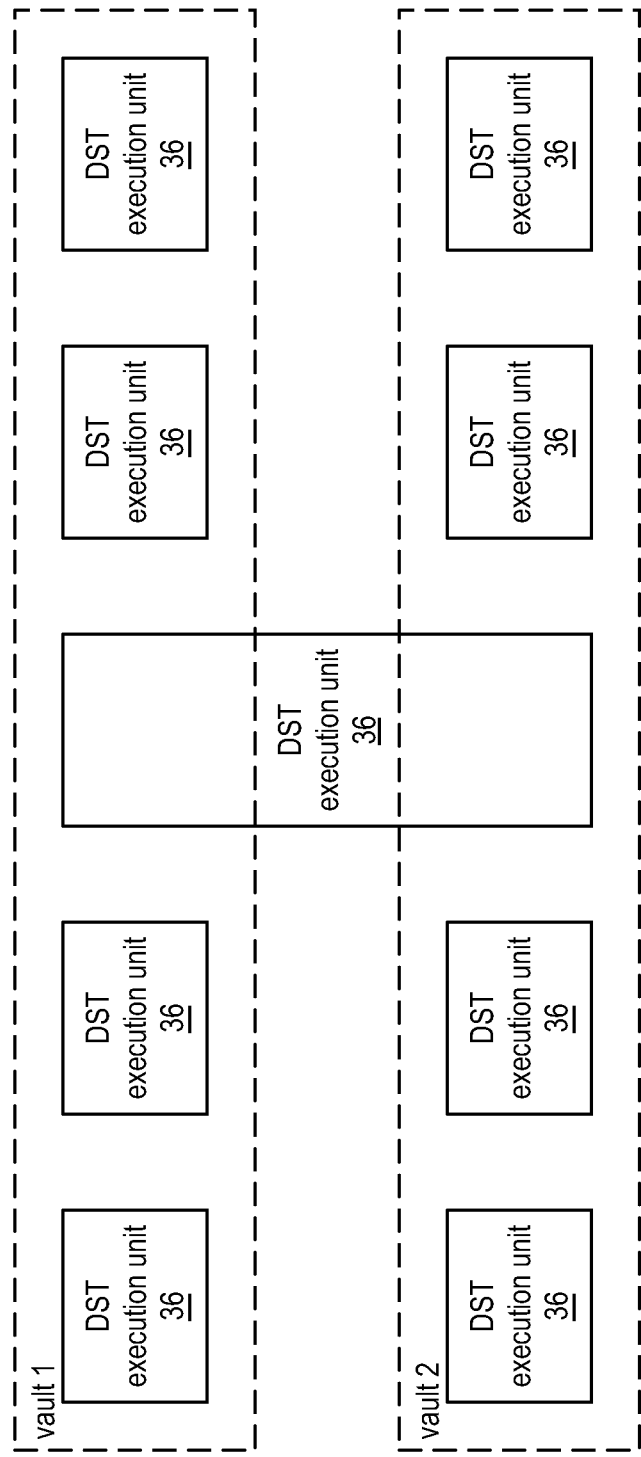
Figure 47B:
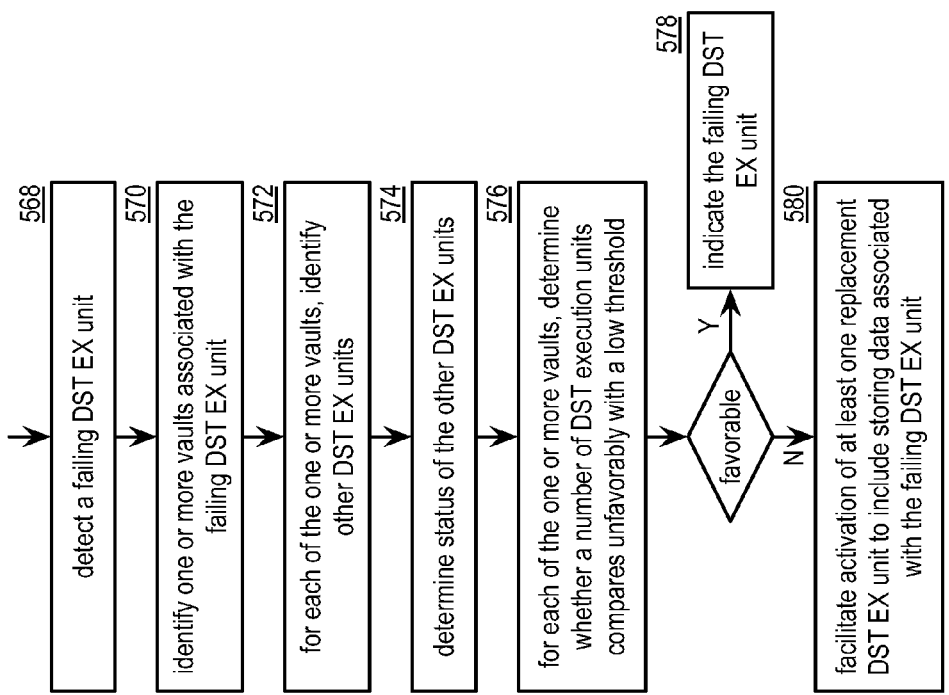
Figure 48A:
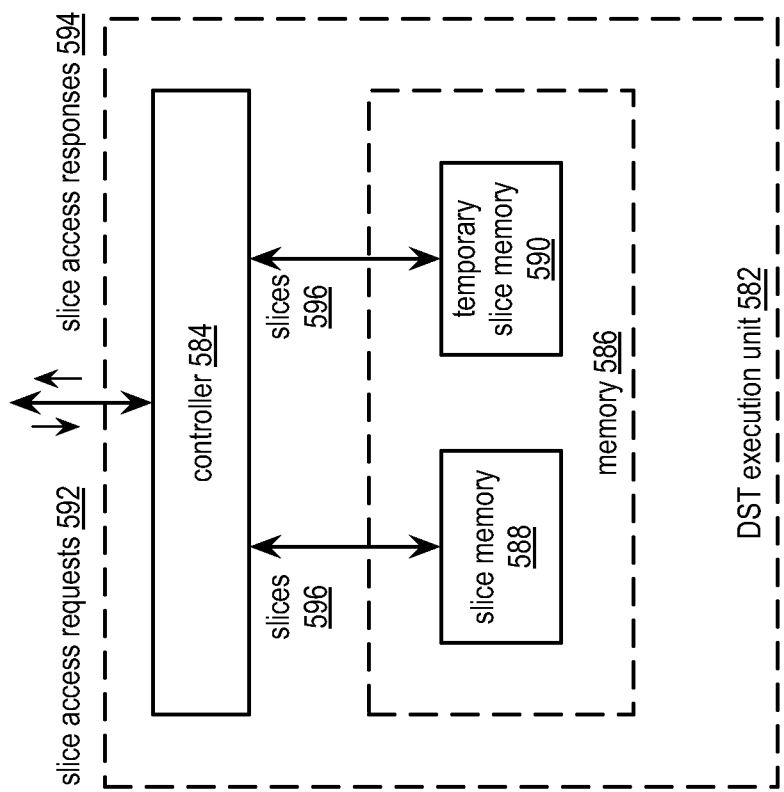
Figure 48B:
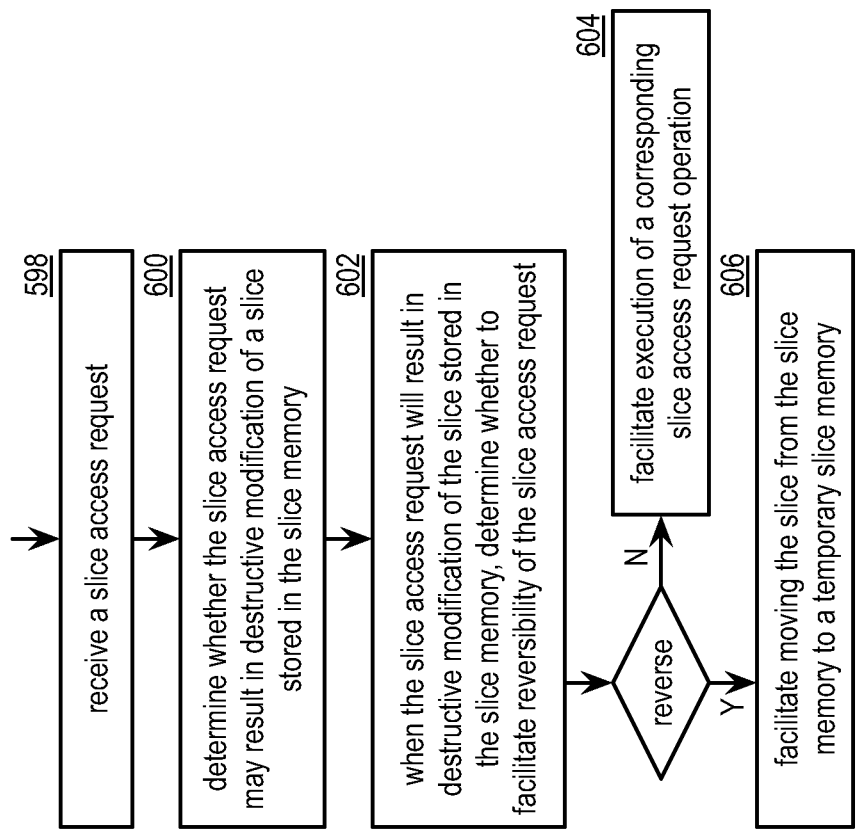
Figure 49:
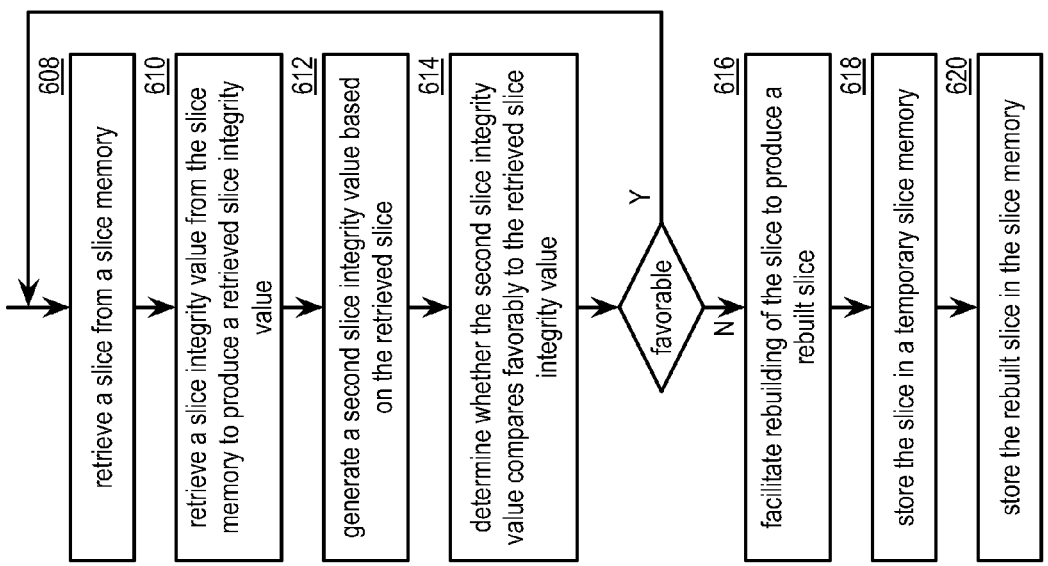
Figure 50A:
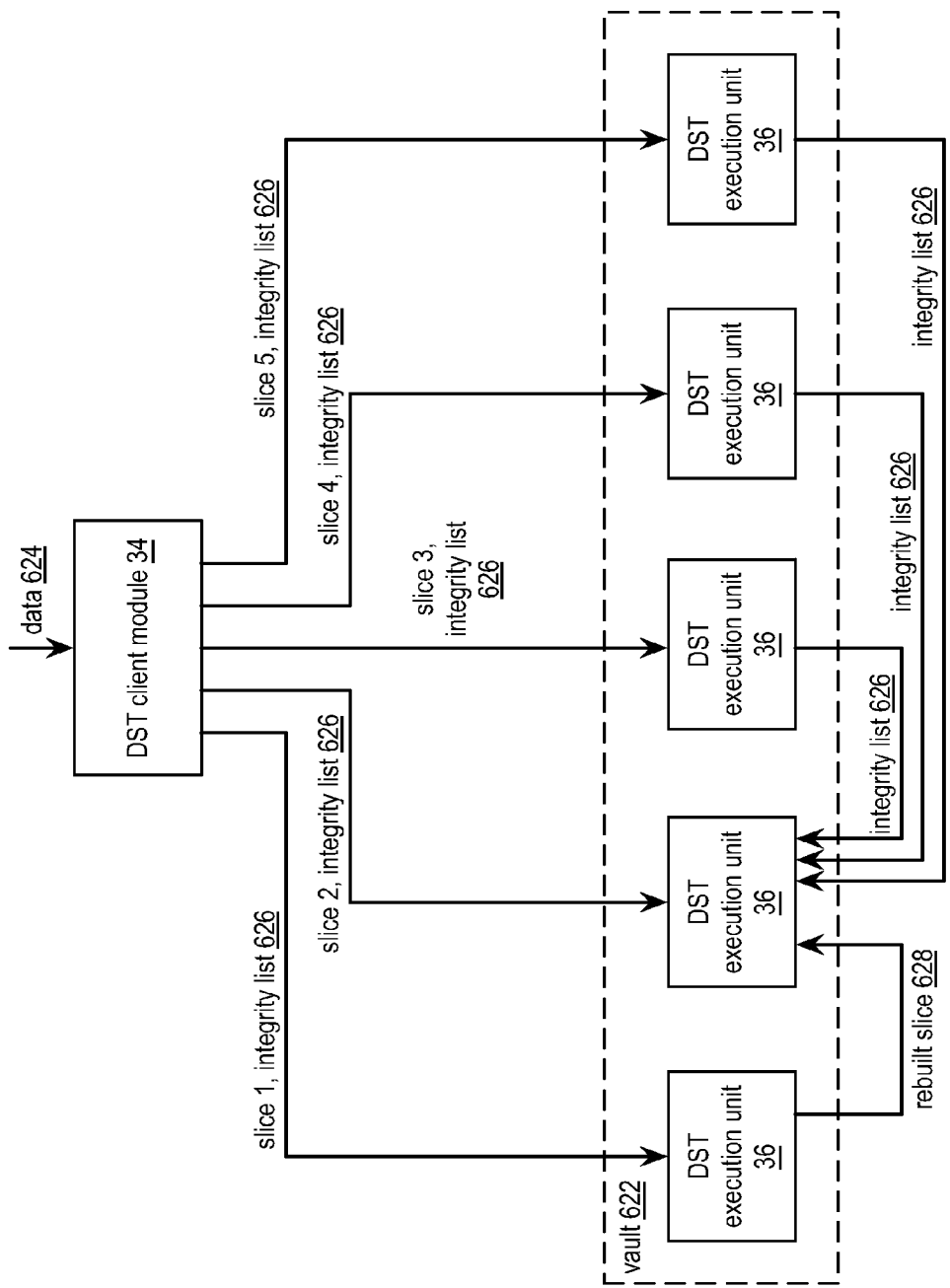
Figure 50B:
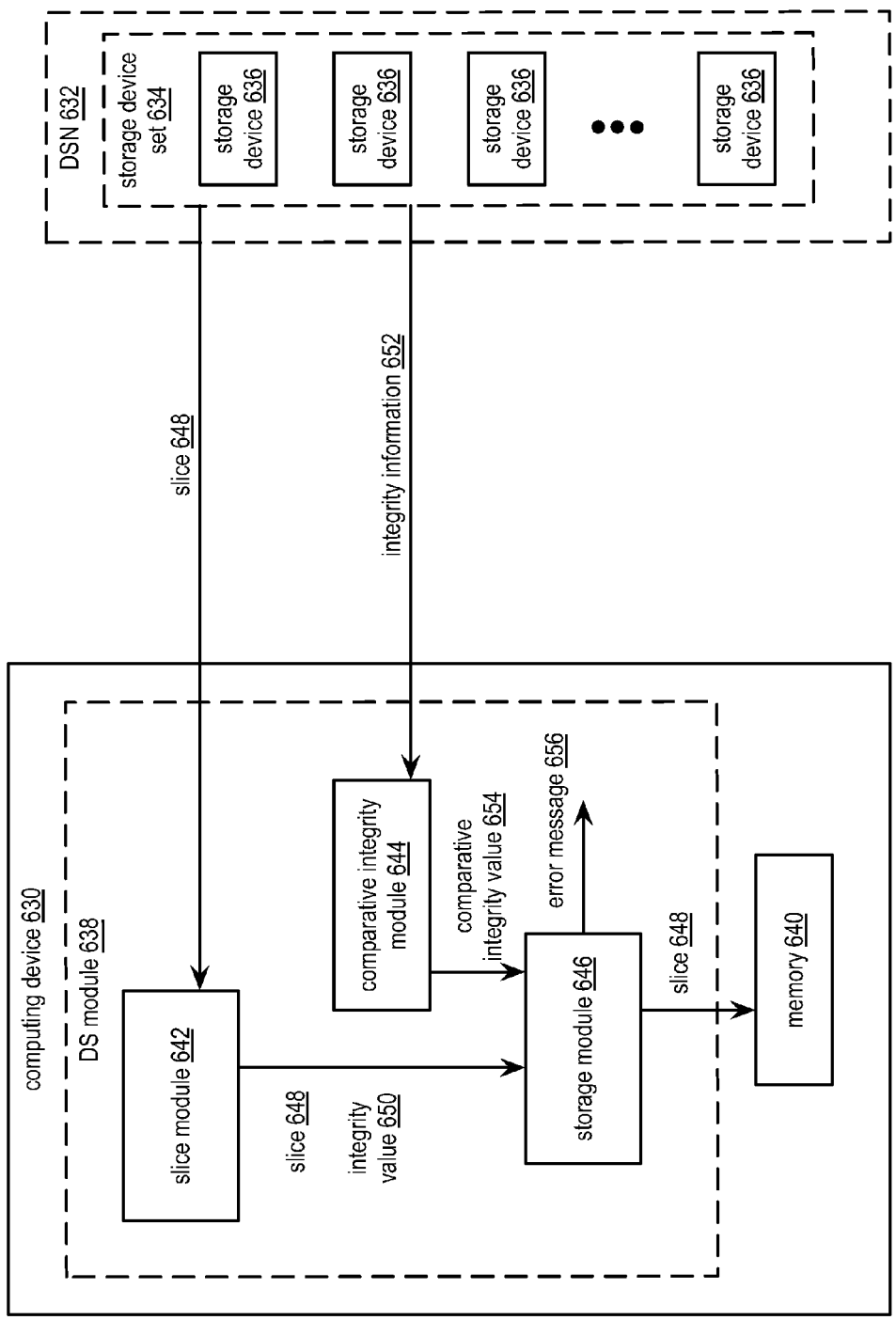
Figure 50C:
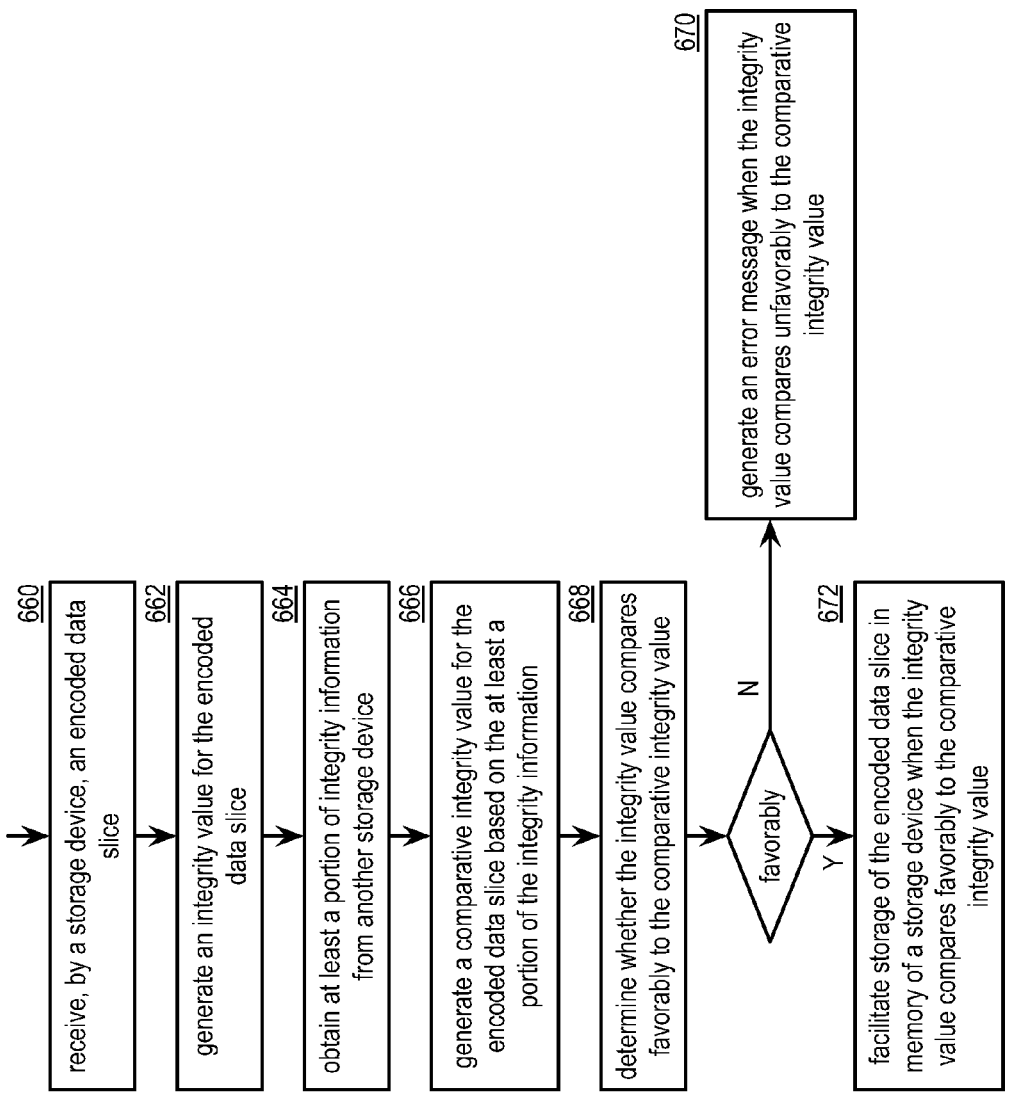
Figure 50D:
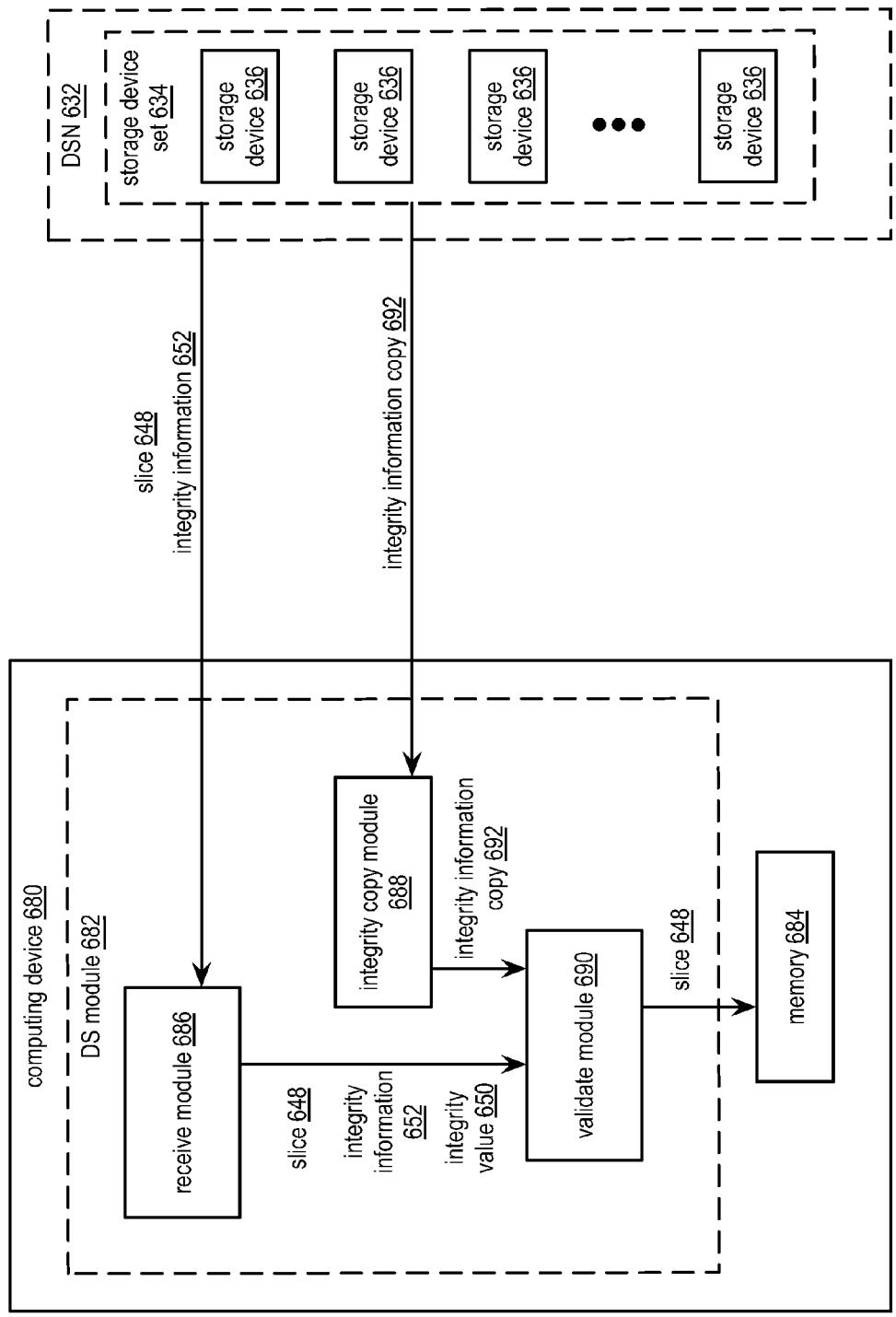
Figure 50E:
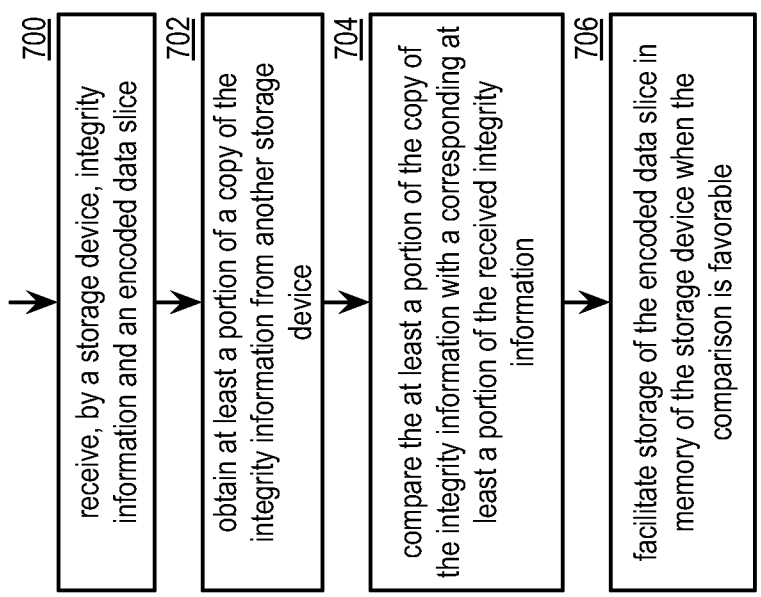
Figure 51D:
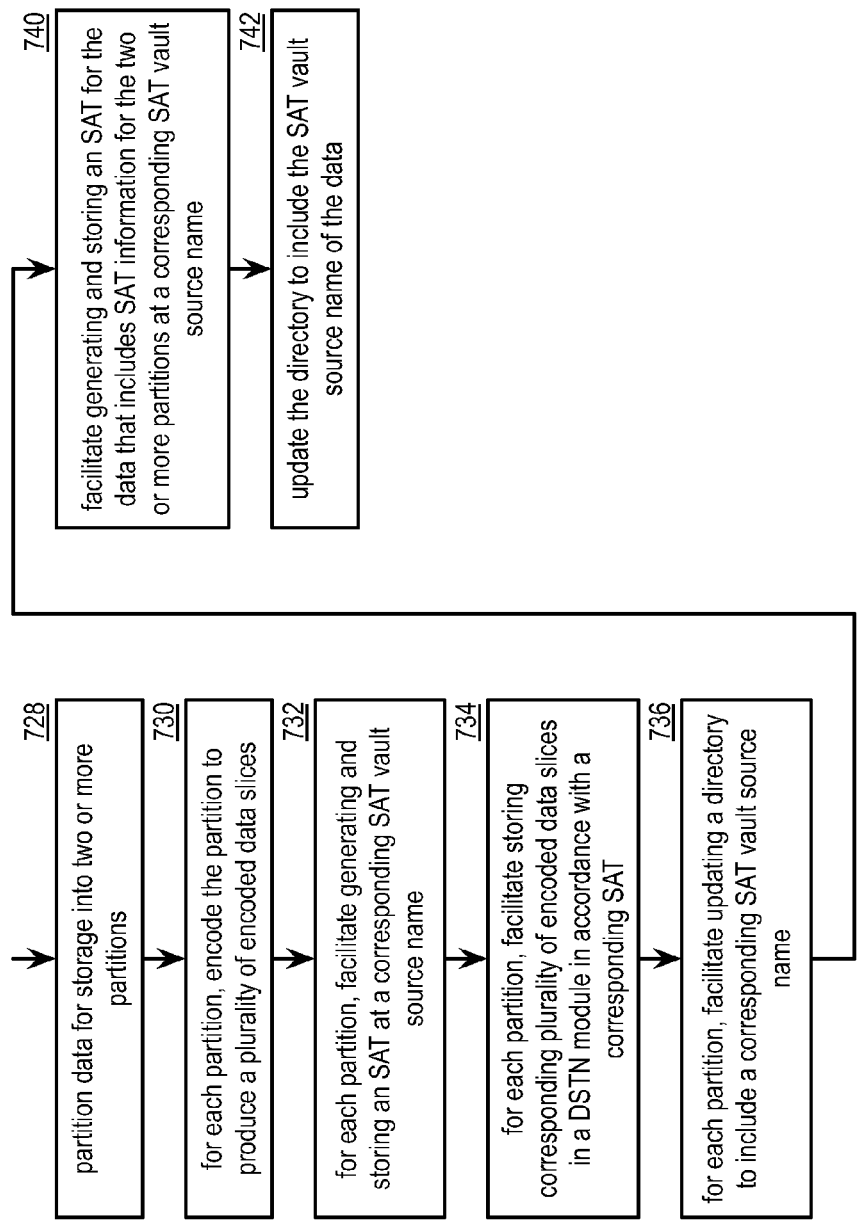
Figure 52D:
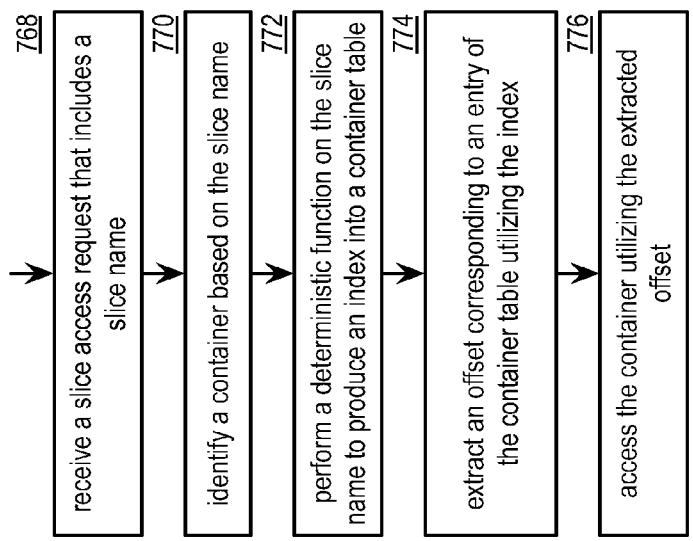

processing for retrieving dispersed error encoded data in accordance with the present invention;

FIG. 26 is a schematic block diagram of an example of a dispersed error decoding for the example of FIG. 25 in accordance with the present invention;

FIG. 27 is a schematic block diagram of an example of a distributed storage and task processing network (DSTN) module storing a plurality of data and a plurality of task codes in accordance with the present invention;

FIG. 28 is a schematic block diagram of an example of the distributed computing system performing tasks on stored data in accordance with the present invention;

FIG. 29 is a schematic block diagram of an embodiment of a task distribution module facilitating the example of FIG. 28 in accordance with the present invention;

FIG. 30 is a diagram of a specific example of the distributed computing system performing tasks on stored data in accordance with the present invention;

FIG. 31 is a schematic block diagram of an example of a distributed storage and task processing network (DSTN) module storing data and task codes for the example of FIG. 30 in accordance with the present invention;

FIG. 32 is a diagram of an example of DST allocation information for the example of FIG. 30 in accordance with the present invention;

FIGS. 33-38 are schematic block diagrams of the DSTN module performing the example of FIG. 30 in accordance with the present invention;

FIG. 39 is a diagram of an example of combining result information into final results for the example of FIG. 30 in accordance with the present invention;

FIG. 40A is a schematic block diagram of another embodiment of a distributed storage and task execution unit in accordance with the present invention;

FIG. 40B is a flowchart illustrating an example of storing slices in accordance with the present invention;

FIG. 41A is a schematic block diagram of another embodiment of a distributed computing system in accordance with the present invention;

FIG. 41B is a flowchart illustrating an example of accessing a stored slice in accordance with the present invention;

FIG. 42 is a flowchart illustrating an example of establishing a billing rate in accordance with the present invention;

FIG. 43A is a schematic block diagram of another embodiment of a distributed storage and task execution unit in accordance with the present invention;

FIG. 43B is a flowchart illustrating an example of storing data in accordance with the present invention;

FIG. 44A is a schematic block diagram of an embodiment of a dispersed storage network (DSN) system in accordance with the present invention;

FIG. 44B is a flowchart illustrating an example of detecting storage errors in accordance with the present invention;

FIG. 44C is a schematic block diagram of another embodiment of a dispersed storage network (DSN) system in accordance with the present invention;

FIG. 44D is a flowchart illustrating another example of detecting storage errors in accordance with the present invention;

FIG. 45 is a flowchart illustrating an example of upgrading software in accordance with the present invention;

FIG. 46 is a flowchart illustrating an example of authenticating a client in accordance with the present invention;

FIG. 47A is a schematic block diagram of another embodiment of a distributed storage and task network module in accordance with the present invention;

FIG. 47B is a flowchart illustrating an example of protecting data in accordance with the present invention;

FIG. 48A is a schematic block diagram illustrating another embodiment of a distributed storage and task execution unit in accordance with the present invention;

FIG. 48B is a flowchart illustrating an example of processing a slice access request in accordance with the present invention;

FIG. 49 is a flowchart illustrating an example of verifying slice integrity in accordance with the present invention;

FIG. 50A is a schematic block diagram of another embodiment of a distributed computing system in accordance with the present invention;

FIG. 50B is a schematic block diagram of another embodiment of a dispersed storage network (DSN) system in accordance with the present invention;

FIG. 50C is a flowchart illustrating an example of verifying a slice in accordance with the present invention;

FIG. 50D is a schematic block diagram of another embodiment of a dispersed storage network (DSN) system in accordance with the present invention;

FIG. 50E is a flowchart illustrating another example of verifying a slice in accordance with the present invention;

FIG. 51A is a schematic block diagram of another embodiment of a distributed computing system in accordance with the present invention;

FIG. 51B is a diagram illustrating an example of a directory in accordance with the present invention;

FIG. 51C is a set of diagrams illustrating examples of segment allocation tables in accordance with the present invention;

FIG. 51D is a flowchart illustrating an example of parallel storage of data in accordance with the present invention;

FIG. 52A is a schematic block diagram of another embodiment of a distributed storage and task execution unit in accordance with the present invention;

FIG. 52B is a diagram illustrating an example of a slice name structure in accordance with the present invention;

FIG. 52C is a diagram illustrating an example of a container directory in accordance with the present invention; and FIG. 52D is a flowchart illustrating an example of accessing memory in accordance with the present invention.

DETAILED DESCRIPTION OF THE INVENTION

Figure 1:
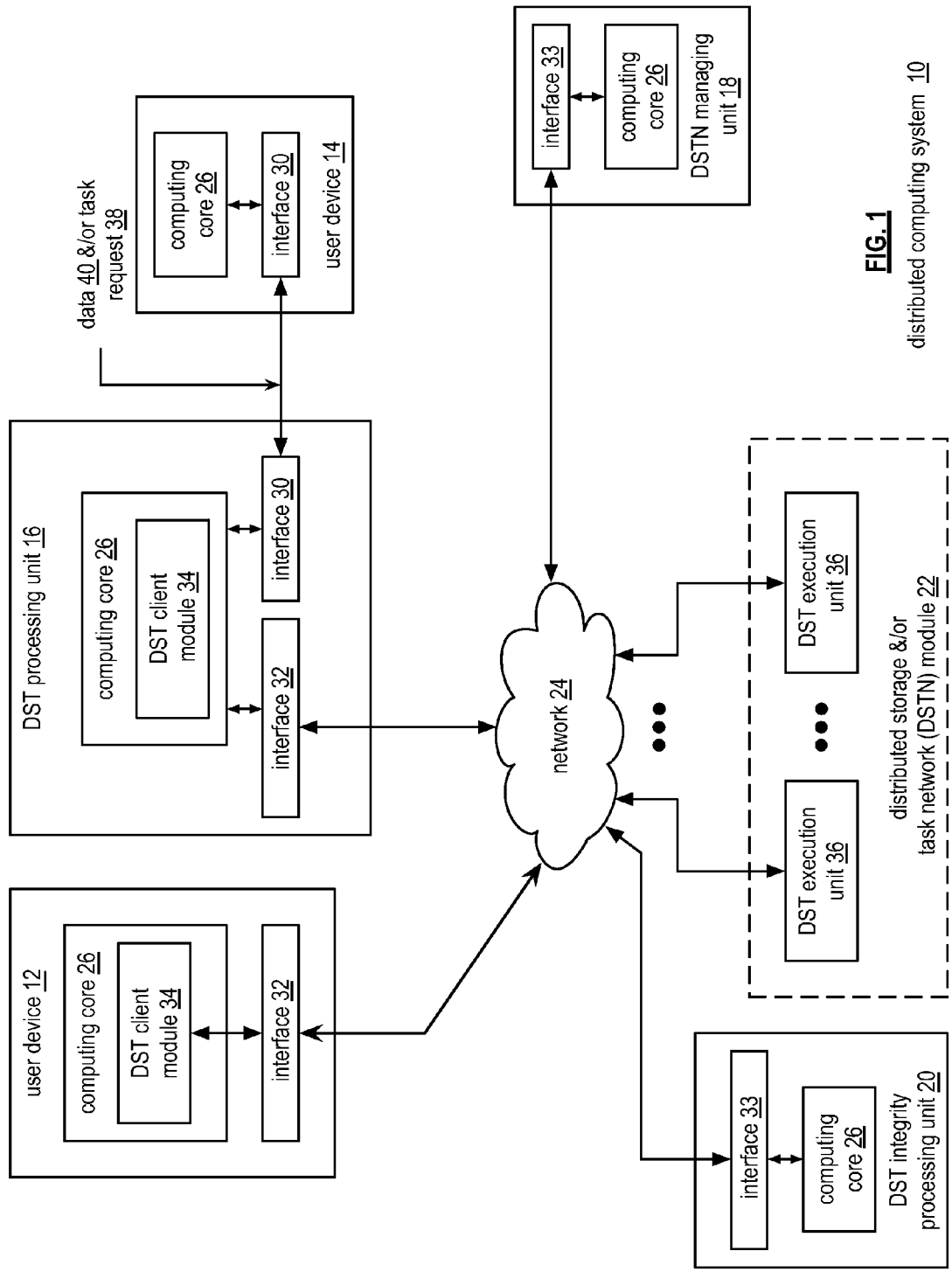
FIG. 1 is a schematic block diagram of an embodiment of a distributed computing system in accordance with the present invention.

FIG. 1 is a schematic block diagram of an embodiment of a distributed computing system 10 that includes a user device 12 and/or a user device 14, a distributed storage and/or task (DST) processing unit 16, a distributed storage and/or task network (DSTN) managing unit 18, a DST integrity processing unit 20, and a distributed storage and/or task network (DSTN) module 22. The components of the distributed computing system 10 are coupled via a network 24, which may include one or more wireless and/or wire lined communication systems; one or more private intranet systems and/or public internet systems; and/or one or more local area networks (LAN) and/or wide area networks (WAN).

The DSTN module 22 includes a plurality of distributed storage and/or task (DST) execution units 36 that may be located at geographically different sites (e.g., one in Chicago, one in Milwaukee, etc.). Each of the DST execution units is operable to store dispersed error encoded data and/or to execute, in a distributed manner, one or more tasks on data. The tasks may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc.

Each of the user devices 12-14, the DST processing unit 16, the DSTN managing unit 18, and the DST integrity processing unit 20 include a computing core 26 and may be a portable computing device and/or a fixed computing device. A portable computing device may be a social networking device, a gaming device, a cell phone, a smart phone, a personal digital assistant, a digital music player, a digital video player, a laptop computer, a handheld computer, a tablet, a video game controller, and/or any other portable device that includes a computing core. A fixed computing device may be a personal computer (PC), a computer server, a cable set-top box, a satellite receiver, a television set, a printer, a fax machine, home entertainment equipment, a video game console, and/or any type of home or office computing equipment. User device 12 and DST processing unit 16 are configured to include a DST client module 34.

With respect to interfaces, each interface 30, 32, and 33 includes software and/or hardware to support one or more communication links via the network 24 indirectly and/or directly. For example, interface 30 supports a communication link (e.g., wired, wireless, direct, via a LAN, via the network 24, etc.) between user device 14 and the DST processing unit 16. As another example, interface 32 supports communication links (e.g., a wired connection, a wireless connection, a LAN connection, and/or any other type of connection to/from the network 24) between user device 12 and the DSTN module 22 and between the DST processing unit 16 and the DSTN module 22. As yet another example, interface 33 supports a communication link for each of the DSTN managing unit 18 and DST integrity processing unit 20 to the network 24.

The distributed computing system 10 is operable to support dispersed storage (DS) error encoded data storage and retrieval, to support distributed task processing on received data, and/or to support distributed task processing on stored data. In general and with respect to DS error encoded data storage and retrieval, the distributed computing system 10 supports three primary operations: storage management, data storage and retrieval (an example of which will be discussed with reference to FIGS. 20-26), and data storage integrity verification. In accordance with these three primary functions, data can be encoded, distributedly stored in physically different locations, and subsequently retrieved in a reliable and secure manner. Such a system is tolerant of a significant number of failures (e.g., up to a failure level, which may be greater than or equal to a pillar width minus a decode threshold minus one) that may result from individual storage device failures and/or network equipment failures without loss of data and without the need for a redundant or backup copy. Further, the system allows the data to be stored for an indefinite period of time without data loss and does so in a secure manner (e.g., the system is very resistant to attempts at hacking the data).

The second primary function (i.e., distributed data storage and retrieval) begins and ends with a user device 12-14. For instance, if a second type of user device 14 has data 40 to store in the DSTN module 22, it sends the data 40 to the DST processing unit 16 via its interface 30. The interface 30 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). In addition, the interface 30 may attach a user identification code (ID) to the data 40.

To support storage management, the DSTN managing unit 18 performs DS management services. One such DS management service includes the DSTN managing unit 18 establishing distributed data storage parameters (e.g., vault creation, distributed storage parameters, security parameters, billing information, user profile information, etc.) for a user device 12-14 individually or as part of a group of user devices. For example, the DSTN managing unit 18 coordinates creation of a vault (e.g., a virtual memory block) within memory of the DSTN module 22 for a user device, a group of devices, or for public access and establishes per vault dispersed storage (DS) error encoding parameters for a vault. The DSTN managing unit 18 may facilitate storage of DS error encoding parameters for each vault of a plurality of vaults by updating registry information for the distributed computing system 10. The facilitating includes storing updated registry information in one or more of the DSTN module 22, the user device 12, the DST processing unit 16, and the DST integrity processing unit 20.

The DS error encoding parameters (e.g. or dispersed storage error coding parameters) include data segmenting information (e.g., how many segments data (e.g., a file, a group of files, a data block, etc.) is divided into), segment security information (e.g., per segment encryption, compression, integrity checksum, etc.), error coding information (e.g., pillar width, decode threshold, read threshold, write threshold, etc.), slicing information (e.g., the number of encoded data slices that will be created for each data segment); and slice security information (e.g., per encoded data slice encryption, compression, integrity checksum, etc.).

The DSTN managing unit 18 creates and stores user profile information (e.g., an access control list (ACL)) in local memory and/or within memory of the DSTN module 22. The user profile information includes authentication information, permissions, and/or the security parameters. The security parameters may include encryption/decryption scheme, one or more encryption keys, key generation scheme, and/or data encoding/decoding scheme.

The DSTN managing unit 18 creates billing information for a particular user, a user group, a vault access, public vault access, etc. For instance, the DSTN managing unit 18 tracks the number of times a user accesses a private vault and/or public vaults, which can be used to generate a per-access billing information. In another instance, the DSTN managing unit 18 tracks the amount of data stored and/or retrieved by a user device and/or a user group, which can be used to generate a per-data-amount billing information.

Another DS management service includes the DSTN managing unit 18 performing network operations, network administration, and/or network maintenance. Network operations includes authenticating user data allocation requests (e.g., read and/or write requests), managing creation of vaults, establishing authentication credentials for user devices, adding/deleting components (e.g., user devices, DST execution units, and/or DST processing units) from the distributed computing system 10, and/or establishing authentication credentials for DST execution units 36. Network administration includes monitoring devices and/or units for failures, maintaining vault information, determining device and/or unit activation status, determining device and/or unit loading, and/or determining any other system level operation that affects the performance level of the system 10. Network maintenance includes facilitating replacing, upgrading, repairing, and/or expanding a device and/or unit of the system 10.

To support data storage integrity verification within the distributed computing system 10, the DST integrity processing unit 20 performs rebuilding of 'bad' or missing encoded data slices. At a high level, the DST integrity processing unit 20 performs rebuilding by periodically attempting to retrieve/list encoded data slices, and/or slice names of the encoded data slices, from the DSTN module 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in memory of the DSTN module 22. Note that the DST integrity processing unit 20 may be a separate unit as shown, it may be included in the DSTN module 22, it may be included in the DST processing unit 16, and/or distributed among the DST execution units 36.

To support distributed task processing on received data, the distributed computing system 10 has two primary operations: DST (distributed storage and/or task processing) management and DST execution on received data (an example of which will be discussed with reference to FIGS. 3-19). With respect to the storage portion of the DST management, the DSTN managing unit 18 functions as previously described. With respect to the tasking processing of the DST management, the DSTN managing unit 18 performs distributed task processing (DTP) management services. One such DTP management service includes the DSTN managing unit 18 establishing DTP parameters (e.g., user-vault affiliation information, billing information, user-task information, etc.) for a user device 12-14 individually or as part of a group of user devices.

Another DTP management service includes the DSTN managing unit 18 performing DTP network operations, network administration (which is essentially the same as described above), and/or network maintenance (which is essentially the same as described above). Network operations include, but are not limited to, authenticating user task processing requests (e.g., valid request, valid user, etc.), authenticating results and/or partial results, establishing DTP authentication credentials for user devices, adding/deleting components (e.g., user devices, DST execution units, and/or DST processing units) from the distributed computing system, and/or establishing DTP authentication credentials for DST execution units.

To support distributed task processing on stored data, the distributed computing system 10 has two primary operations: DST (distributed storage and/or task) management and DST execution on stored data. With respect to the DST execution on stored data, if the second type of user device 14 has a task request 38 for execution by the DSTN module 22, it sends the task request 38 to the DST processing unit 16 via its interface 30. An example of DST execution on stored data will be discussed in greater detail with reference to FIGS. 27-39. With respect to the DST management, it is substantially similar to the DST management to support distributed task processing on received data.

Figure 2:
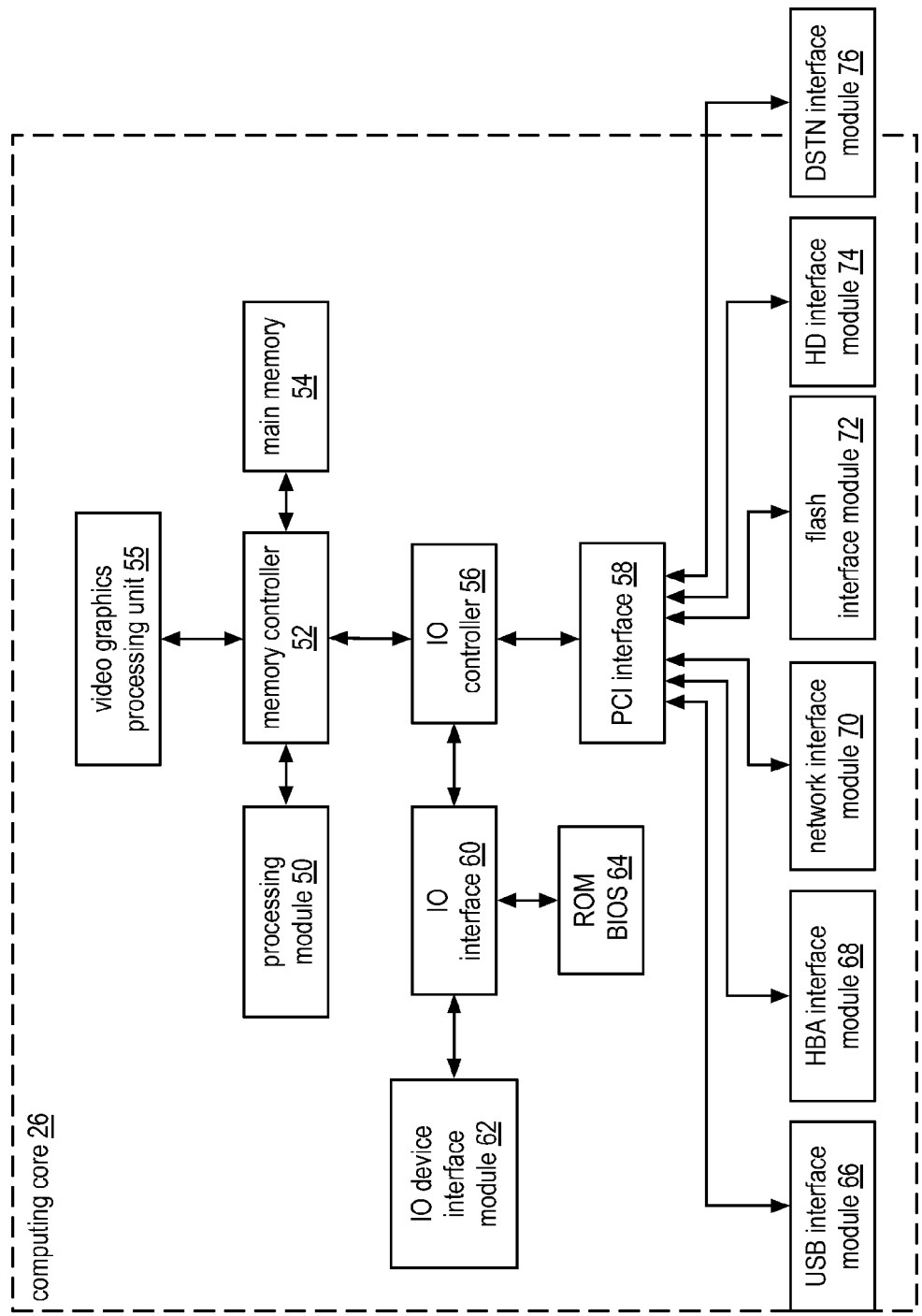
FIG. 2 is a schematic block diagram of an embodiment of a computing core in accordance with the present invention.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSTN interface module 76.

The DSTN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSTN interface module 76 and/or the network interface module 70 may function as the interface 30 of the user device 14 of FIG. 1. Further note that the IO device interface module 62 and/or the memory interface modules may be collectively or individually referred to as IO ports.

Figure 3:
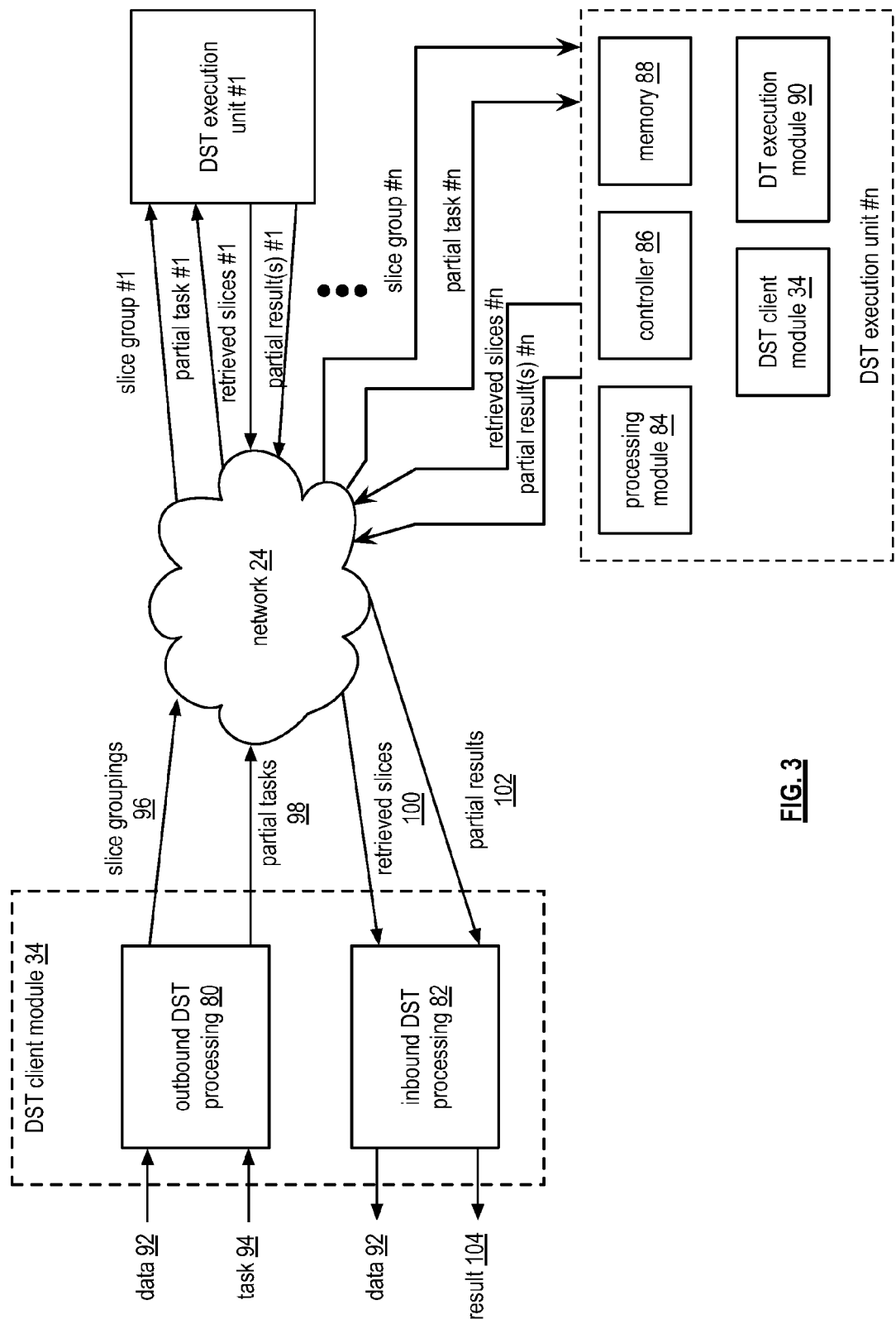
FIG. 3 is a diagram of an example of a distributed storage and task processing in accordance with the present invention.

FIG. 3 is a diagram of an example of the distributed computing system performing a distributed storage and task processing operation. The distributed computing system includes a DST (distributed storage and/or task) client module 34 (which may be in user device 14 and/or in DST processing unit 16 of FIG. 1), a network 24, a plurality of DST execution units 1-n that includes two or more DST execution units 36 of FIG. 1 (which form at least a portion of DSTN module 22 of FIG. 1), a DST managing module (not shown), and a DST integrity verification module (not shown). The DST client module 34 includes an outbound DST processing section 80 and an inbound DST processing section 82. Each of the DST execution units 1-n includes a controller 86, a processing module 84, memory 88, a DT (distributed task) execution module 90, and a DST client module 34.

In an example of operation, the DST client module 34 receives data 92 and one or more tasks 94 to be performed upon the data 92. The data 92 may be of any size and of any content, where, due to the size (e.g., greater than a few Terra-Bytes), the content (e.g., secure data, etc.), and/or task(s) (e.g., MIPS intensive), distributed processing of the task(s) on the data is desired. For example, the data 92 may be one or more digital books, a copy of a company's emails, a large-scale Internet search, a video security file, one or more entertainment video files (e.g., television programs, movies, etc.), data files, and/or any other large amount of data (e.g., greater than a few Terra-Bytes).

Within the DST client module 34, the outbound DST processing section 80 receives the data 92 and the task(s) 94. The outbound DST processing section 80 processes the data 92 to produce slice groupings 96. As an example of such processing, the outbound DST processing section 80 partitions the data 92 into a plurality of data partitions. For each data partition, the outbound DST processing section 80 dispersed storage (DS) error encodes the data partition to produce encoded data slices and groups the encoded data slices into a slice grouping 96. In addition, the outbound DST processing section 80 partitions the task 94 into partial tasks 98, where the number of partial tasks 98 may correspond to the number of slice groupings 96.

The outbound DST processing section 80 then sends, via the network 24, the slice groupings 96 and the partial tasks 98 to the DST execution units 1-n of the DSTN module 22 of FIG. 1. For example, the outbound DST processing section 80 sends slice group 1 and partial task 1 to DST execution unit 1. As another example, the outbound DST processing section 80 sends slice group #n and partial task #n to DST execution unit #n.

Each DST execution unit performs its partial task 98 upon its slice group 96 to produce partial results 102. For example, DST execution unit #1 performs partial task #1 on slice group #1 to produce a partial result #1, for results. As a more specific example, slice group #1 corresponds to a data partition of a series of digital books and the partial task #1 corresponds to searching for specific phrases, recording where the phrase is found, and establishing a phrase count. In this more specific example, the partial result #1 includes information as to where the phrase was found and includes the phrase count.

Upon completion of generating their respective partial results 102, the DST execution units send, via the network 24, their partial results 102 to the inbound DST processing section 82 of the DST client module 34. The inbound DST processing section 82 processes the received partial results 102 to produce a result 104. Continuing with the specific example of the preceding paragraph, the inbound DST processing section 82 combines the phrase count from each of the DST execution units 36 to produce a total phrase count. In addition, the inbound DST processing section 82 combines the 'where the phrase was found' information from each of the DST execution units 36 within their respective data partitions to produce 'where the phrase was found' information for the series of digital books.

In another example of operation, the DST client module 34 requests retrieval of stored data within the memory of the DST execution units 36 (e.g., memory of the DSTN module). In this example, the task 94 is retrieve data stored in the memory of the DSTN module. Accordingly, the outbound DST processing section 80 converts the task 94 into a plurality of partial tasks 98 and sends the partial tasks 98 to the respective DST execution units 1-n.

In response to the partial task 98 of retrieving stored data, a DST execution unit 36 identifies the corresponding encoded data slices 100 and retrieves them. For example, DST execution unit #1 receives partial task #1 and retrieves, in response thereto, retrieved slices #1. The DST execution units 36 send their respective retrieved slices 100 to the inbound DST processing section 82 via the network 24.

The inbound DST processing section 82 converts the retrieved slices 100 into data 92. For example, the inbound DST processing section 82 de-groups the retrieved slices 100 to produce encoded slices per data partition. The inbound DST processing section 82 then DS error decodes the encoded slices per data partition to produce data partitions. The inbound DST processing section 82 de-partitions the data partitions to recapture the data 92.

Figure 4:
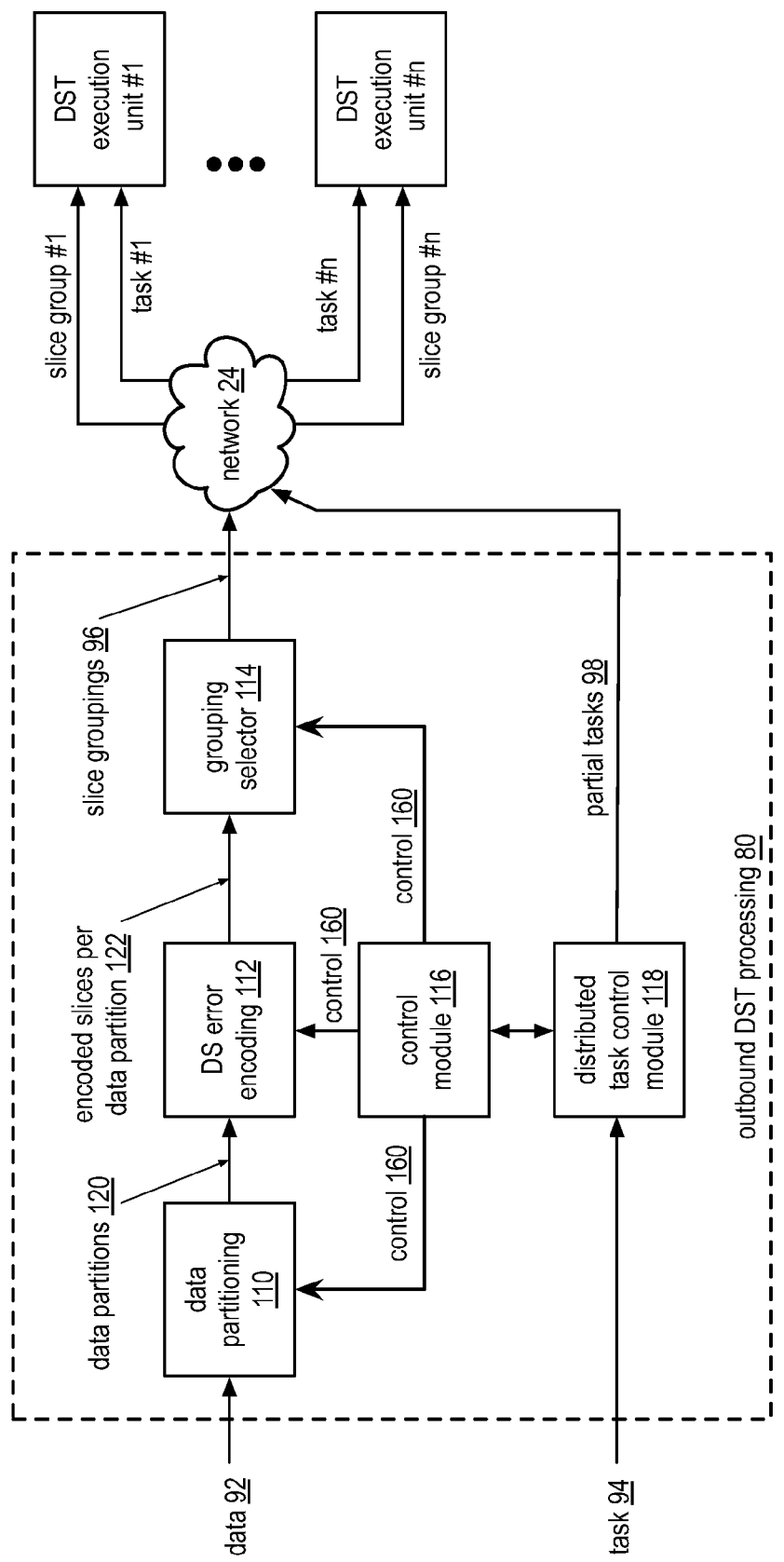
FIG. 4 is a schematic block diagram of an embodiment of an outbound distributed storage and/or task (DST) processing in accordance with the present invention.

FIG. 4 is a schematic block diagram of an embodiment of an outbound distributed storage and/or task (DST) processing section 80 of a DST client module 34 FIG. 1 coupled to a DSTN module 22 of a FIG. 1 (e.g., a plurality of n DST execution units 36) via a network 24. The outbound DST processing section 80 includes a data partitioning module 110, a dispersed storage (DS) error encoding module 112, a grouping selector module 114, a control module 116, and a distributed task control module 118.

In an example of operation, the data partitioning module 110 partitions data 92 into a plurality of data partitions 120. The number of partitions and the size of the partitions may be selected by the control module 116 via control 160 based on the data 92 (e.g., its size, its content, etc.), a corresponding task 94 to be performed (e.g., simple, complex, single step, multiple steps, etc.), DS encoding parameters (e.g., pillar width, decode threshold, write threshold, segment security parameters, slice security parameters, etc.), capabilities of the DST execution units 36 (e.g., processing resources, availability of processing recourses, etc.), and/or as may be inputted by a user, system administrator, or other operator (human or automated). For example, the data partitioning module 110 partitions the data 92 (e.g., 100 Terra-Bytes) into 100,000 data segments, each being 1 Giga-Byte in size. Alternatively, the data partitioning module 110 partitions the data 92 into a plurality of data segments, where some of data segments are of a different size, are of the same size, or a combination thereof.

The DS error encoding module 112 receives the data partitions 120 in a serial manner, a parallel manner, and/or a combination thereof. For each data partition 120, the DS error encoding module 112 DS error encodes the data partition 120 in accordance with control information 160 from the control module 116 to produce encoded data slices 122. The DS error encoding includes segmenting the data partition into data segments, segment security processing (e.g., encryption, compression, watermarking, integrity check (e.g., CRC), etc.), error encoding, slicing, and/or per slice security processing (e.g., encryption, compression, watermarking, integrity check (e.g., CRC), etc.). The control information 160 indicates which steps of the DS error encoding are active for a given data partition and, for active steps, indicates the parameters for the step. For example, the control information 160 indicates that the error encoding is active and includes error encoding parameters (e.g., pillar width, decode threshold, write threshold, read threshold, type of error encoding, etc.).

The grouping selector module 114 groups the encoded slices 122 of a data partition into a set of slice groupings 96. The number of slice groupings corresponds to the number of DST execution units 36 identified for a particular task 94. For example, if five DST execution units 36 are identified for the particular task 94, the grouping selector module groups the encoded slices 122 of a data partition into five slice groupings 96. The grouping selector module 114 outputs the slice groupings 96 to the corresponding DST execution units 36 via the network 24.

The distributed task control module 118 receives the task 94 and converts the task 94 into a set of partial tasks 98. For example, the distributed task control module 118 receives a task to find where in the data (e.g., a series of books) a phrase occurs and a total count of the phrase usage in the data. In this example, the distributed task control module 118 replicates the task 94 for each DST execution unit 36 to produce the partial tasks 98. In another example, the distributed task control module 118 receives a task to find where in the data a first phrase occurs, where in the data a second phrase occurs, and a total count for each phrase usage in the data. In this example, the distributed task control module 118 generates a first set of partial tasks 98 for finding and counting the first phrase and a second set of partial tasks for finding and counting the second phrase. The distributed task control module 118 sends respective first and/or second partial tasks 98 to each DST execution unit 36.

Figure 5:
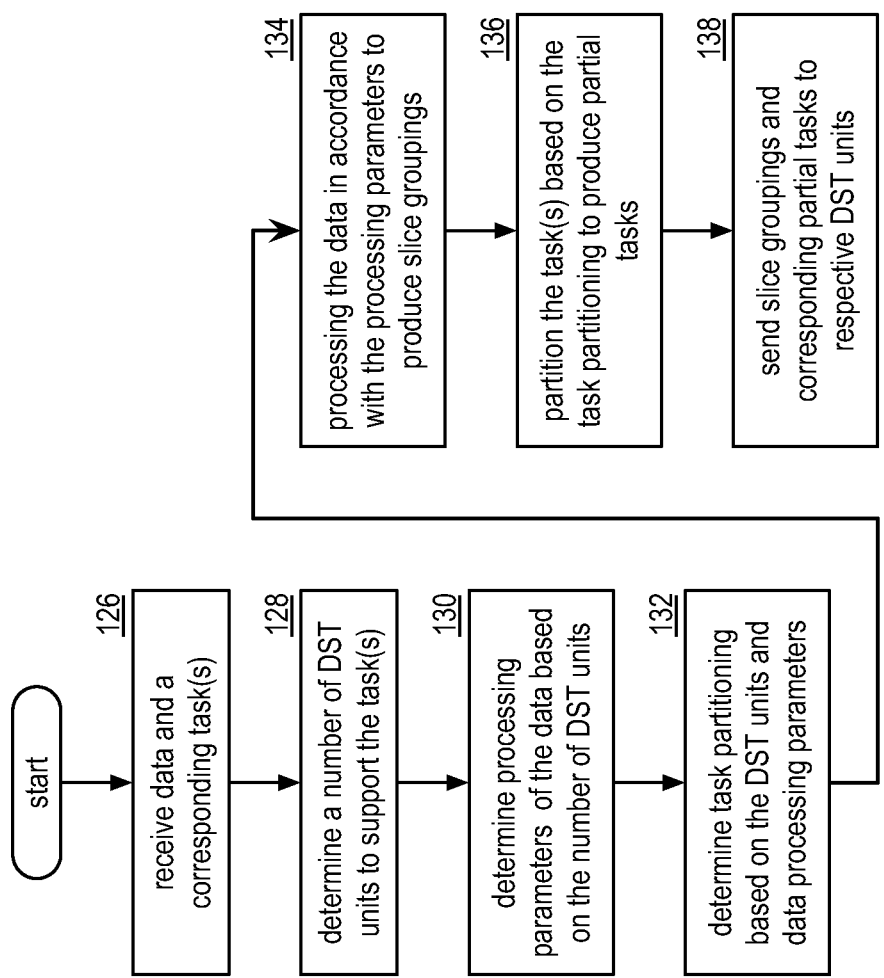
FIG. 5 is a logic diagram of an example of a method for outbound DST processing in accordance with the present invention.

FIG. 5 is a logic diagram of an example of a method for outbound distributed storage and task (DST) processing that begins at step 126 where a DST client module receives data and one or more corresponding tasks. The method continues at step 128 where the DST client module determines a number of DST units to support the task for one or more data partitions. For example, the DST client module may determine the number of DST units to support the task based on the size of the data, the requested task, the content of the data, a predetermined number (e.g., user indicated, system administrator determined, etc.), available DST units, capability of the DST units, and/or any other factor regarding distributed task processing of the data. The DST client module may select the same DST units for each data partition, may select different DST units for the data partitions, or a combination thereof.

The method continues at step 130 where the DST client module determines processing parameters of the data based on the number of DST units selected for distributed task processing. The processing parameters include data partitioning information, DS encoding parameters, and/or slice grouping information. The data partitioning information includes a number of data partitions, size of each data partition, and/or organization of the data partitions (e.g., number of data blocks in a partition, the size of the data blocks, and arrangement of the data blocks). The DS encoding parameters include segmenting information, segment security information, error encoding information (e.g., dispersed storage error encoding function parameters including one or more of pillar width, decode threshold, write threshold, read threshold, generator matrix), slicing information, and/or per slice security information. The slice grouping information includes information regarding how to arrange the encoded data slices into groups for the selected DST units. As a specific example, if the DST client module determines that five DST units are needed to support the task, then it determines that the error encoding parameters include a pillar width of five and a decode threshold of three.

The method continues at step 132 where the DST client module determines task partitioning information (e.g., how to partition the tasks) based on the selected DST units and data processing parameters. The data processing parameters include the processing parameters and DST unit capability information. The DST unit capability information includes the number of DT (distributed task) execution units, execution capabilities of each DT execution unit (e.g., MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, memory information (e.g., type, size, availability, etc.), and/or any information germane to executing one or more tasks.

The method continues at step 134 where the DST client module processes the data in accordance with the processing parameters to produce slice groupings. The method continues at step 136 where the DST client module partitions the task based on the task partitioning information to produce a set of partial tasks. The method continues at step 138 where the DST client module sends the slice groupings and the corresponding partial tasks to respective DST units.

Figure 6:
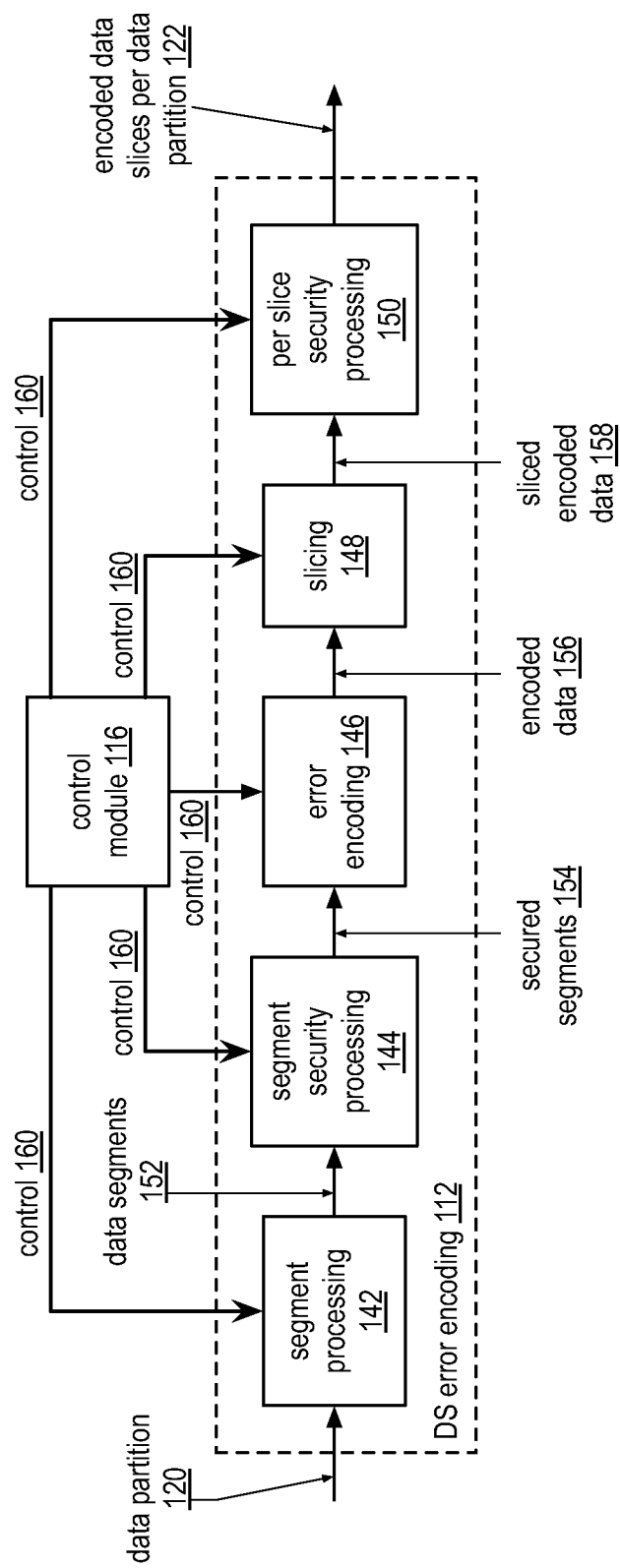
FIG. 6 is a schematic block diagram of an embodiment of a dispersed error encoding in accordance with the present invention.

FIG. 6 is a schematic block diagram of an embodiment of the dispersed storage (DS) error encoding module 112 of an outbound distributed storage and task (DST) processing section. The DS error encoding module 112 includes a segment processing module 142, a segment security processing module 144, an error encoding module 146, a slicing module 148, and a per slice security processing module 150. Each of these modules is coupled to a control module 116 to receive control information 160 therefrom.

In an example of operation, the segment processing module 142 receives a data partition 120 from a data partitioning module and receives segmenting information as the control information 160 from the control module 116. The segmenting information indicates how the segment processing module 142 is to segment the data partition 120. For example, the segmenting information indicates how many rows to segment the data based on a decode threshold of an error encoding scheme, indicates how many columns to segment the data into based on a number and size of data blocks within the data partition 120, and indicates how many columns to include in a data segment 152. The segment processing module 142 segments the data 120 into data segments 152 in accordance with the segmenting information.

The segment security processing module 144, when enabled by the control module 116, secures the data segments 152 based on segment security information received as control information 160 from the control module 116. The segment security information includes data compression, encryption, watermarking, integrity check (e.g., cyclic redundancy check (CRC), etc.), and/or any other type of digital security. For example, when the segment security processing module 144 is enabled, it may compress a data segment 152, encrypt the compressed data segment, and generate a CRC value for the encrypted data segment to produce a secure data segment 154. When the segment security processing module 144 is not enabled, it passes the data segments 152 to the error encoding module 146 or is bypassed such that the data segments 152 are provided to the error encoding module 146.

The error encoding module 146 encodes the secure data segments 154 in accordance with error correction encoding parameters received as control information 160 from the control module 116. The error correction encoding parameters (e.g., also referred to as dispersed storage error coding parameters) include identifying an error correction encoding scheme (e.g., forward error correction algorithm, a Reed-Solomon based algorithm, an online coding algorithm, an information dispersal algorithm, etc.), a pillar width, a decode threshold, a read threshold, a write threshold, etc. For example, the error correction encoding parameters identify a specific error correction encoding scheme, specifies a pillar width of five, and specifies a decode threshold of three. From these parameters, the error encoding module 146 encodes a data segment 154 to produce an encoded data segment 156.

The slicing module 148 slices the encoded data segment 156 in accordance with the pillar width of the error correction encoding parameters received as control information 160. For example, if the pillar width is five, the slicing module 148 slices an encoded data segment 156 into a set of five encoded data slices. As such, for a plurality of encoded data segments 156 for a given data partition, the slicing module outputs a plurality of sets of encoded data slices 158.

The per slice security processing module 150, when enabled by the control module 116, secures each encoded data slice 158 based on slice security information received as control information 160 from the control module 116. The slice security information includes data compression, encryption, watermarking, integrity check (e.g., CRC, etc.), and/or any other type of digital security. For example, when the per slice security processing module 150 is enabled, it compresses an encoded data slice 158, encrypts the compressed encoded data slice, and generates a CRC value for the encrypted encoded data slice to produce a secure encoded data slice 122. When the per slice security processing module 150 is not enabled, it passes the encoded data slices 158 or is bypassed such that the encoded data slices 158 are the output of the DS error encoding module 112. Note that the control module 116 may be omitted and each module stores its own parameters.

Figure 7:
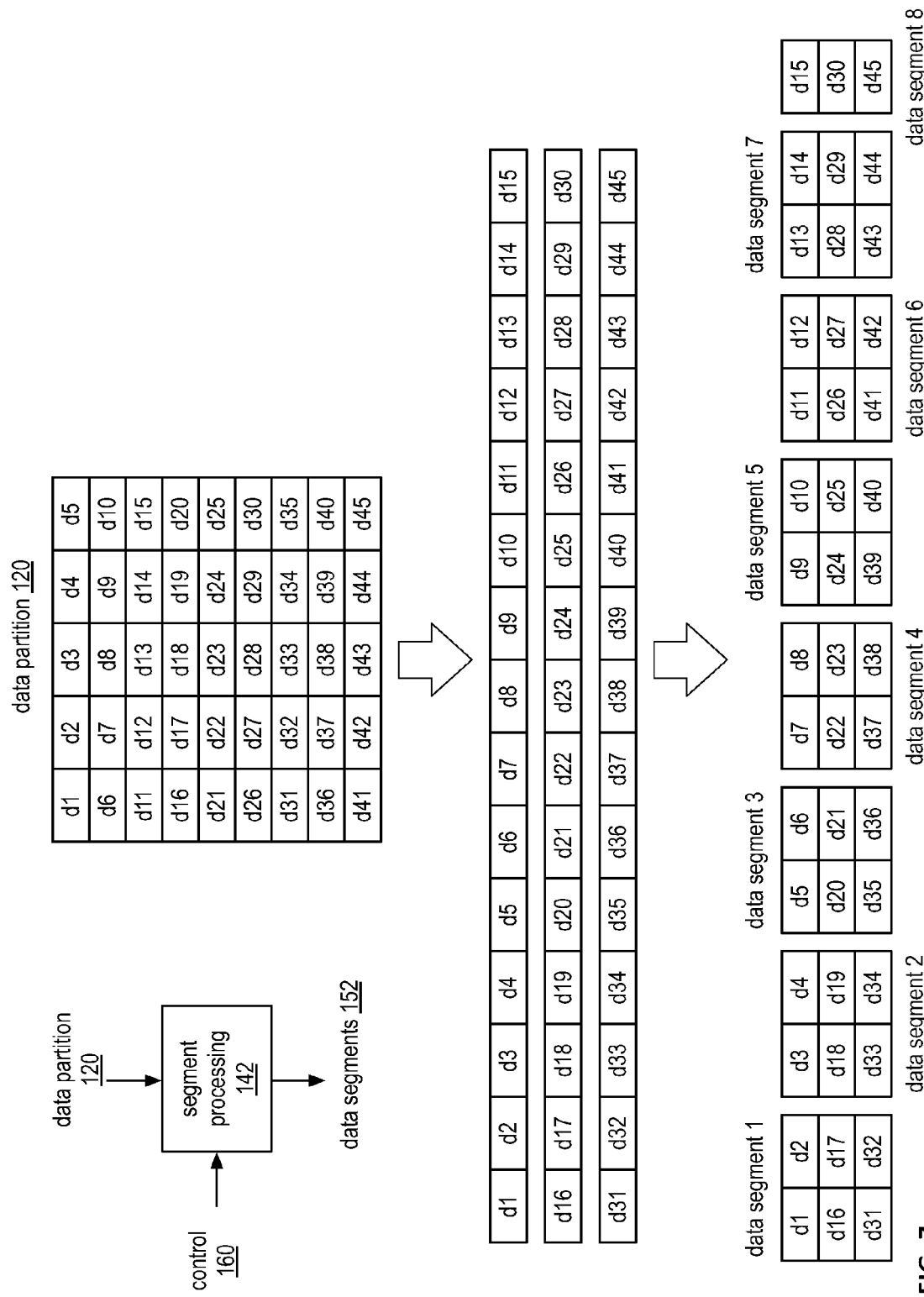
FIG. 7 is a diagram of an example of a segment processing of the dispersed error encoding in accordance with the present invention.

FIG. 7 is a diagram of an example of a segment processing of a dispersed storage (DS) error encoding module. In this example, a segment processing module 142 receives a data partition 120 that includes 45 data blocks (e.g., d1-d45), receives segmenting information (i.e., control information 160) from a control module, and segments the data partition 120 in accordance with the control information 160 to produce data segments 152. Each data block may be of the same size as other data blocks or of a different size. In addition, the size of each data block may be a few bytes to megabytes of data. As previously mentioned, the segmenting information indicates how many rows to segment the data partition into, indicates how many columns to segment the data partition into, and indicates how many columns to include in a data segment.

In this example, the decode threshold of the error encoding scheme is three; as such the number of rows to divide the data partition into is three. The number of columns for each row is set to 15, which is based on the number and size of data blocks. The data blocks of the data partition are arranged in rows and columns in a sequential order (i.e., the first row includes the first 15 data blocks; the second row includes the second 15 data blocks; and the third row includes the last 15 data blocks).

With the data blocks arranged into the desired sequential order, they are divided into data segments based on the segmenting information. In this example, the data partition is divided into 8 data segments; the first 7 include 2 columns of three rows and the last includes 1 column of three rows. Note that the first row of the 8 data segments is in sequential order of the first 15 data blocks; the second row of the 8 data segments in sequential order of the second 15 data blocks; and the third row of the 8 data segments in sequential order of the last 15 data blocks. Note that the number of data blocks, the grouping of the data blocks into segments, and size of the data blocks may vary to accommodate the desired distributed task processing function.

Figure 8:
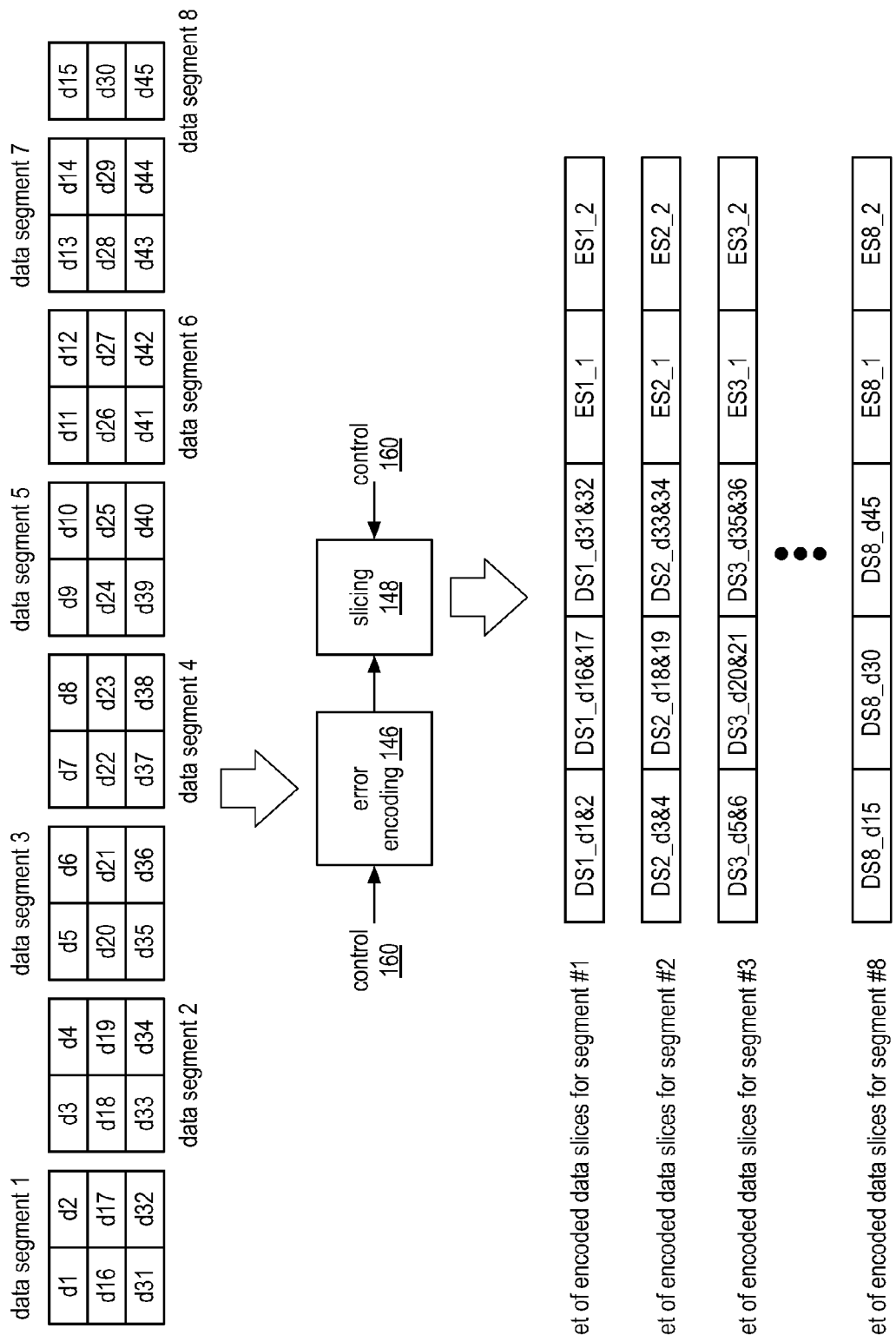
FIG. 8 is a diagram of an example of error encoding and slicing processing of the dispersed error encoding in accordance with the present invention.

FIG. 8 is a diagram of an example of error encoding and slicing processing of the dispersed error encoding processing the data segments of FIG. 7. In this example, data segment 1 includes 3 rows with each row being treated as one word for encoding. As such, data segment 1 includes three words for encoding: word 1 including data blocks d1 and d2, word 2 including data blocks d16 and d17, and word 3 including data blocks d31 and d32. Each of data segments 2-7 includes three words where each word includes two data blocks. Data segment 8 includes three words where each word includes a single data block (e.g., d15, d30, and d45).

In operation, an error encoding module 146 and a slicing module 148 convert each data segment into a set of encoded data slices in accordance with error correction encoding parameters as control information 160. More specifically, when the error correction encoding parameters indicate a unity matrix Reed-Solomon based encoding algorithm, 5 pillars, and decode threshold of 3, the first three encoded data slices of the set of encoded data slices for a data segment are substantially similar to the corresponding word of the data segment. For instance, when the unity matrix Reed-Solomon based encoding algorithm is applied to data segment 1, the content of the first encoded data slice (DS1_d1&2) of the first set of encoded data slices (e.g., corresponding to data segment 1) is substantially similar to content of the first word (e.g., d1 & d2); the content of the second encoded data slice (DS1_d16&17) of the first set of encoded data slices is substantially similar to content of the second word (e.g., d16 & d17); and the content of the third encoded data slice (DS1_d31&32) of the first set of encoded data slices is substantially similar to content of the third word (e.g., d31 & d32).

The content of the fourth and fifth encoded data slices (e.g., ES1_1 and ES1_2) of the first set of encoded data slices include error correction data based on the first-third words of the first data segment. With such an encoding and slicing scheme, retrieving any three of the five encoded data slices allows the data segment to be accurately reconstructed.

The encoding and slicing of data segments 2-7 yield sets of encoded data slices similar to the set of encoded data slices of data segment 1. For instance, the content of the first encoded data slice (DS2_d3&4) of the second set of encoded data slices (e.g., corresponding to data segment 2) is substantially similar to content of the first word (e.g., d3 & d4); the content of the second encoded data slice (DS2_d18&19) of the second set of encoded data slices is substantially similar to content of the second word (e.g., d18 & d19); and the content of the third encoded data slice (DS2_d33&34) of the second set of encoded data slices is substantially similar to content of the third word (e.g., d33 & d34). The content of the fourth and fifth encoded data slices (e.g., ES1_1 and ES1_2) of the second set of encoded data slices includes error correction data based on the first-third words of the second data segment.

Figure 9:
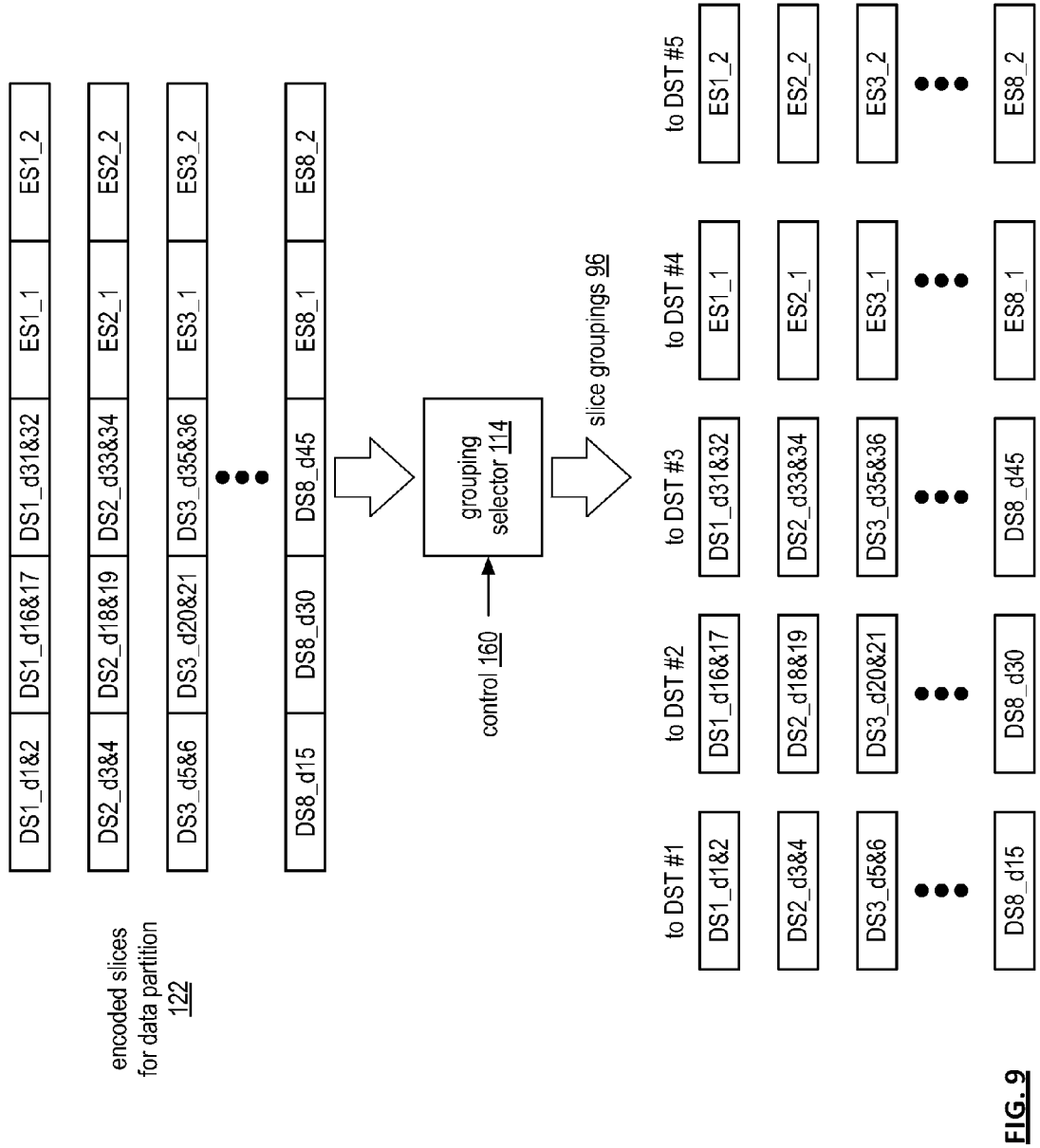
FIG. 9 is a diagram of an example of grouping selection processing of the outbound DST processing in accordance with the present invention.

FIG. 9 is a diagram of an example of grouping selection processing of an outbound distributed storage and task (DST) processing in accordance with group selection information as control information 160 from a control module. Encoded slices for data partition 122 are grouped in accordance with the control information 160 to produce slice groupings 96. In this example, a grouping selector module 114 organizes the encoded data slices into five slice groupings (e.g., one for each DST execution unit of a distributed storage and task network (DSTN) module). As a specific example, the grouping selector module 114 creates a first slice grouping for a DST execution unit #1, which includes first encoded slices of each of the sets of encoded slices. As such, the first DST execution unit receives encoded data slices corresponding to data blocks 1-15 (e.g., encoded data slices of contiguous data).

The grouping selector module 114 also creates a second slice grouping for a DST execution unit #2, which includes second encoded slices of each of the sets of encoded slices. As such, the second DST execution unit receives encoded data slices corresponding to data blocks 16-30. The grouping selector module 114 further creates a third slice grouping for DST execution unit #3, which includes third encoded slices of each of the sets of encoded slices. As such, the third DST execution unit receives encoded data slices corresponding to data blocks 31-45.

The grouping selector module 114 creates a fourth slice grouping for DST execution unit #4, which includes fourth encoded slices of each of the sets of encoded slices. As such, the fourth DST execution unit receives encoded data slices corresponding to first error encoding information (e.g., encoded data slices of error coding (EC) data). The grouping selector module 114 further creates a fifth slice grouping for DST execution unit #5, which includes fifth encoded slices of each of the sets of encoded slices. As such, the fifth DST execution unit receives encoded data slices corresponding to second error encoding information.

Figure 10:
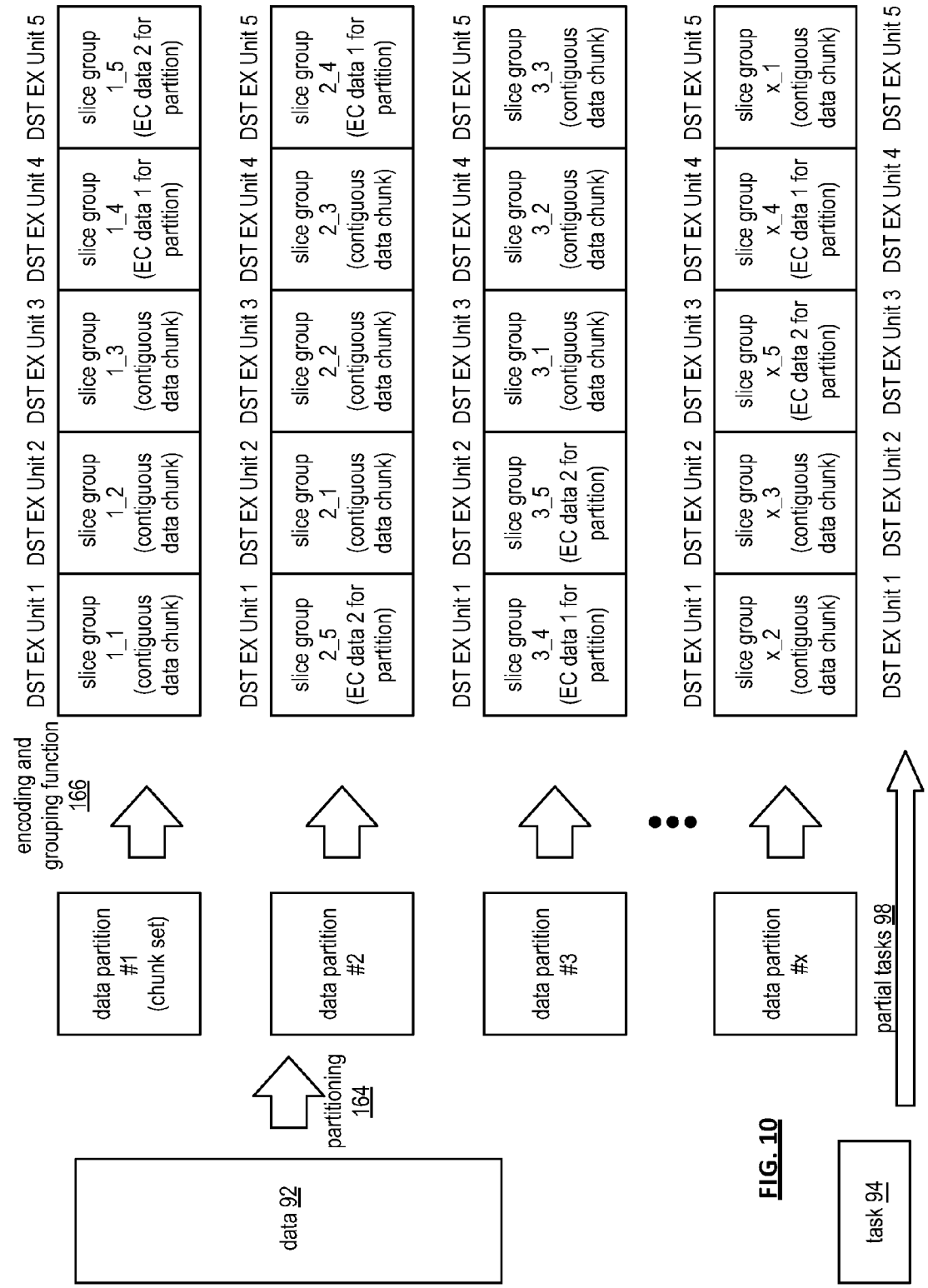
FIG. 10 is a diagram of an example of converting data into slice groups in accordance with the present invention.

FIG. 10 is a diagram of an example of converting data 92 into slice groups that expands on the preceding figures. As shown, the data 92 is partitioned in accordance with a partitioning function 164 into a plurality of data partitions (1-x, where x is an integer greater than 4). Each data partition (or chunkset of data) is encoded and grouped into slice groupings as previously discussed by an encoding and grouping function 166. For a given data partition, the slice groupings are sent to distributed storage and task (DST) execution units. From data partition to data partition, the ordering of the slice groupings to the DST execution units may vary.

For example, the slice groupings of data partition #1 is sent to the DST execution units such that the first DST execution receives first encoded data slices of each of the sets of encoded data slices, which corresponds to a first continuous data chunk of the first data partition (e.g., refer to FIG. 9), a second DST execution receives second encoded data slices of each of the sets of encoded data slices, which corresponds to a second continuous data chunk of the first data partition, etc.

For the second data partition, the slice groupings may be sent to the DST execution units in a different order than it was done for the first data partition. For instance, the first slice grouping of the second data partition (e.g., slice group 2_1) is sent to the second DST execution unit; the second slice grouping of the second data partition (e.g., slice group 2_2) is sent to the third DST execution unit; the third slice grouping of the second data partition (e.g., slice group 2_3) is sent to the fourth DST execution unit; the fourth slice grouping of the second data partition (e.g., slice group 2_4, which includes first error coding information) is sent to the fifth DST execution unit; and the fifth slice grouping of the second data partition (e.g., slice group 2_5, which includes second error coding information) is sent to the first DST execution unit.

The pattern of sending the slice groupings to the set of DST execution units may vary in a predicted pattern, a random pattern, and/or a combination thereof from data partition to data partition. In addition, from data partition to data partition, the set of DST execution units may change. For example, for the first data partition, DST execution units 1-5 may be used; for the second data partition, DST execution units 6-10 may be used; for the third data partition, DST execution units 3-7 may be used; etc. As is also shown, the task is divided into partial tasks that are sent to the DST execution units in conjunction with the slice groupings of the data partitions.

Figure 11:
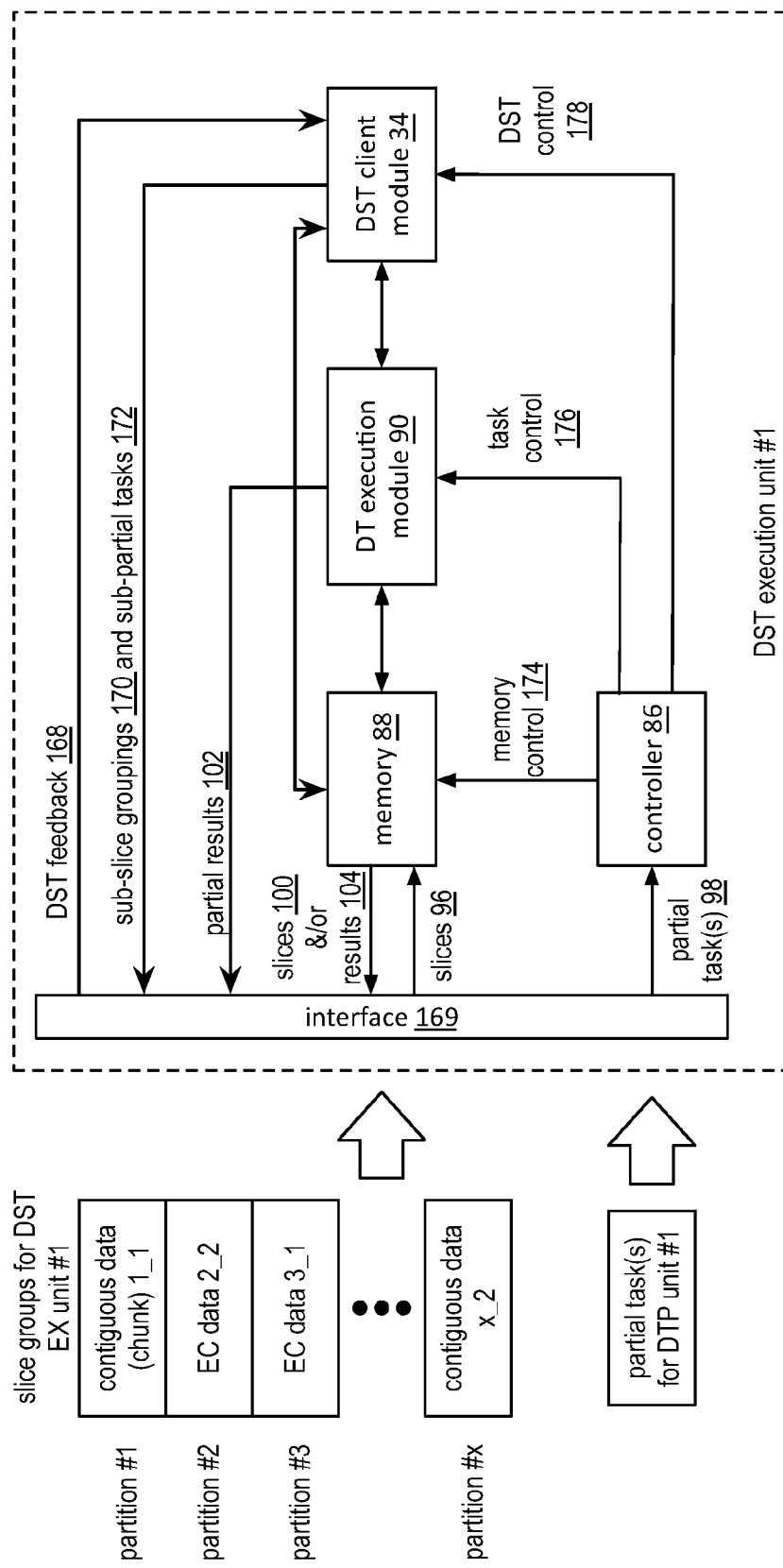
FIG. 11 is a schematic block diagram of an embodiment of a DST execution unit in accordance with the present invention.

FIG. 11 is a schematic block diagram of an embodiment of a DST (distributed storage and/or task) execution unit that includes an interface 169, a controller 86, memory 88, one or more DT (distributed task) execution modules 90, and a DST client module 34. The memory 88 is of sufficient size to store a significant number of encoded data slices (e.g., thousands of slices to hundreds-of-millions of slices) and may include one or more hard drives and/or one or more solid-state memory devices (e.g., flash memory, DRAM, etc.).

In an example of storing a slice group, the DST execution module receives a slice grouping 96 (e.g., slice group #1) via interface 169. The slice grouping 96 includes, per partition, encoded data slices of contiguous data or encoded data slices of error coding (EC) data. For slice group #1, the DST execution module receives encoded data slices of contiguous data for partitions #1 and #x (and potentially others between 3 and x) and receives encoded data slices of EC data for partitions #2 and #3 (and potentially others between 3 and x). Examples of encoded data slices of contiguous data and encoded data slices of error coding (EC) data are discussed with reference to FIG. 9. The memory 88 stores the encoded data slices of slice groupings 96 in accordance with memory control information 174 it receives from the controller 86.

The controller 86 (e.g., a processing module, a CPU, etc.) generates the memory control information 174 based on a partial task(s) 98 and distributed computing information (e.g., user information (e.g., user ID, distributed computing permissions, data access permission, etc.), vault information (e.g., virtual memory assigned to user, user group, temporary storage for task processing, etc.), task validation information, etc.). For example, the controller 86 interprets the partial task(s) 98 in light of the distributed computing information to determine whether a requestor is authorized to perform the task 98, is authorized to access the data, and/or is authorized to perform the task on this particular data. When the requestor is authorized, the controller 86 determines, based on the task 98 and/or another input, whether the encoded data slices of the slice grouping 96 are to be temporarily stored or permanently stored. Based on the foregoing, the controller 86 generates the memory control information 174 to write the encoded data slices of the slice grouping 96 into the memory 88 and to indicate whether the slice grouping 96 is permanently stored or temporarily stored.

With the slice grouping 96 stored in the memory 88, the controller 86 facilitates execution of the partial task(s) 98. In an example, the controller 86 interprets the partial task 98 in light of the capabilities of the DT execution module(s) 90. The capabilities include one or more of MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, etc. If the controller 86 determines that the DT execution module(s) 90 have sufficient capabilities, it generates task control information 176.

The task control information 176 may be a generic instruction (e.g., perform the task on the stored slice grouping) or a series of operational codes. In the former instance, the DT execution module 90 includes a co-processor function specifically configured (fixed or programmed) to perform the desired task 98. In the latter instance, the DT execution module 90 includes a general processor topology where the controller stores an algorithm corresponding to the particular task 98. In this instance, the controller 86 provides the operational codes (e.g., assembly language, source code of a programming language, object code, etc.) of the algorithm to the DT execution module 90 for execution.

Depending on the nature of the task 98, the DT execution module 90 may generate intermediate partial results 102 that are stored in the memory 88 or in a cache memory (not shown) within the DT execution module 90. In either case, when the DT execution module 90 completes execution of the partial task 98, it outputs one or more partial results 102. The partial results 102 may also be stored in memory 88.

If, when the controller 86 is interpreting whether capabilities of the DT execution module(s) 90 can support the partial task 98, the controller 86 determines that the DT execution module(s) 90 cannot adequately support the task 98 (e.g., does not have the right resources, does not have sufficient available resources, available resources would be too slow, etc.), it then determines whether the partial task 98 should be fully offloaded or partially offloaded.

If the controller 86 determines that the partial task 98 should be fully offloaded, it generates DST control information 178 and provides it to the DST client module 34. The DST control information 178 includes the partial task 98, memory storage information regarding the slice grouping 96, and distribution instructions. The distribution instructions instruct the DST client module 34 to divide the partial task 98 into sub-partial tasks 172, to divide the slice grouping 96 into sub-slice groupings 170, and identify other DST execution units. The DST client module 34 functions in a similar manner as the DST client module 34 of FIGS. 3-10 to produce the sub-partial tasks 172 and the sub-slice groupings 170 in accordance with the distribution instructions.

The DST client module 34 receives DST feedback 168 (e.g., sub-partial results), via the interface 169, from the DST execution units to which the task was offloaded. The DST client module 34 provides the sub-partial results to the DST execution unit, which processes the sub-partial results to produce the partial result(s) 102.

If the controller 86 determines that the partial task 98 should be partially offloaded, it determines what portion of the task 98 and/or slice grouping 96 should be processed locally and what should be offloaded. For the portion that is being locally processed, the controller 86 generates task control information 176 as previously discussed. For the portion that is being offloaded, the controller 86 generates DST control information 178 as previously discussed.

When the DST client module 34 receives DST feedback 168 (e.g., sub-partial results) from the DST executions units to which a portion of the task was offloaded, it provides the sub-partial results to the DT execution module 90. The DT execution module 90 processes the sub-partial results with the sub-partial results it created to produce the partial result(s) 102.

The memory 88 may be further utilized to retrieve one or more of stored slices 100, stored results 104, partial results 102 when the DT execution module 90 stores partial results 102 and/or results 104 in the memory 88. For example, when the partial task 98 includes a retrieval request, the controller 86 outputs the memory control 174 to the memory 88 to facilitate retrieval of slices 100 and/or results 104.

Figure 12:
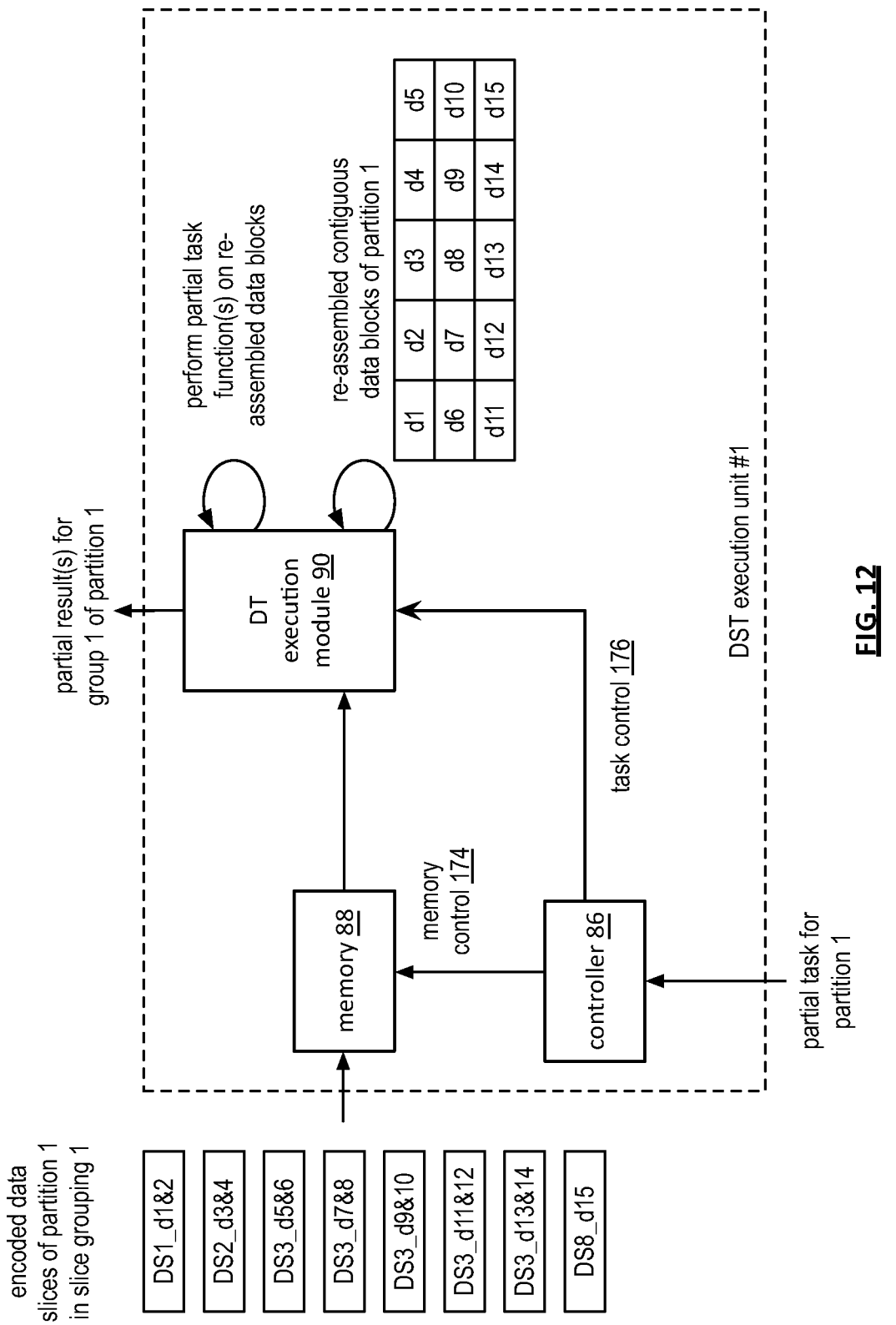
FIG. 12 is a schematic block diagram of an example of operation of a DST execution unit in accordance with the present invention.

FIG. 12 is a schematic block diagram of an example of operation of a distributed storage and task (DST) execution unit storing encoded data slices and executing a task thereon. To store the encoded data slices of a partition 1 of slice grouping 1, a controller 86 generates write commands as memory control information 174 such that the encoded slices are stored in desired locations (e.g., permanent or temporary) within memory 88.

Once the encoded slices are stored, the controller 86 provides task control information 176 to a distributed task (DT) execution module 90. As a first step of executing the task in accordance with the task control information 176, the DT execution module 90 retrieves the encoded slices from memory 88. The DT execution module 90 then reconstructs contiguous data blocks of a data partition. As shown for this example, reconstructed contiguous data blocks of data partition 1 include data blocks 1-15 (e.g., d1-d15).

With the contiguous data blocks reconstructed, the DT execution module 90 performs the task on the reconstructed contiguous data blocks. For example, the task may be to search the reconstructed contiguous data blocks for a particular word or phrase, identify where in the reconstructed contiguous data blocks the particular word or phrase occurred, and/or count the occurrences of the particular word or phrase on the reconstructed contiguous data blocks. The DST execution unit continues in a similar manner for the encoded data slices of other partitions in slice grouping 1. Note that with using the unity matrix error encoding scheme previously discussed, if the encoded data slices of contiguous data are uncorrupted, the decoding of them is a relatively straightforward process of extracting the data.

If, however, an encoded data slice of contiguous data is corrupted (or missing), it can be rebuilt by accessing other DST execution units that are storing the other encoded data slices of the set of encoded data slices of the corrupted encoded data slice. In this instance, the DST execution unit having the corrupted encoded data slices retrieves at least three encoded data slices (of contiguous data and of error coding data) in the set from the other DST execution units (recall for this example, the pillar width is 5 and the decode threshold is 3). The DST execution unit decodes the retrieved data slices using the DS error encoding parameters to recapture the corresponding data segment. The DST execution unit then re-encodes the data segment using the DS error encoding parameters to rebuild the corrupted encoded data slice. Once the encoded data slice is rebuilt, the DST execution unit functions as previously described.

Figure 13:
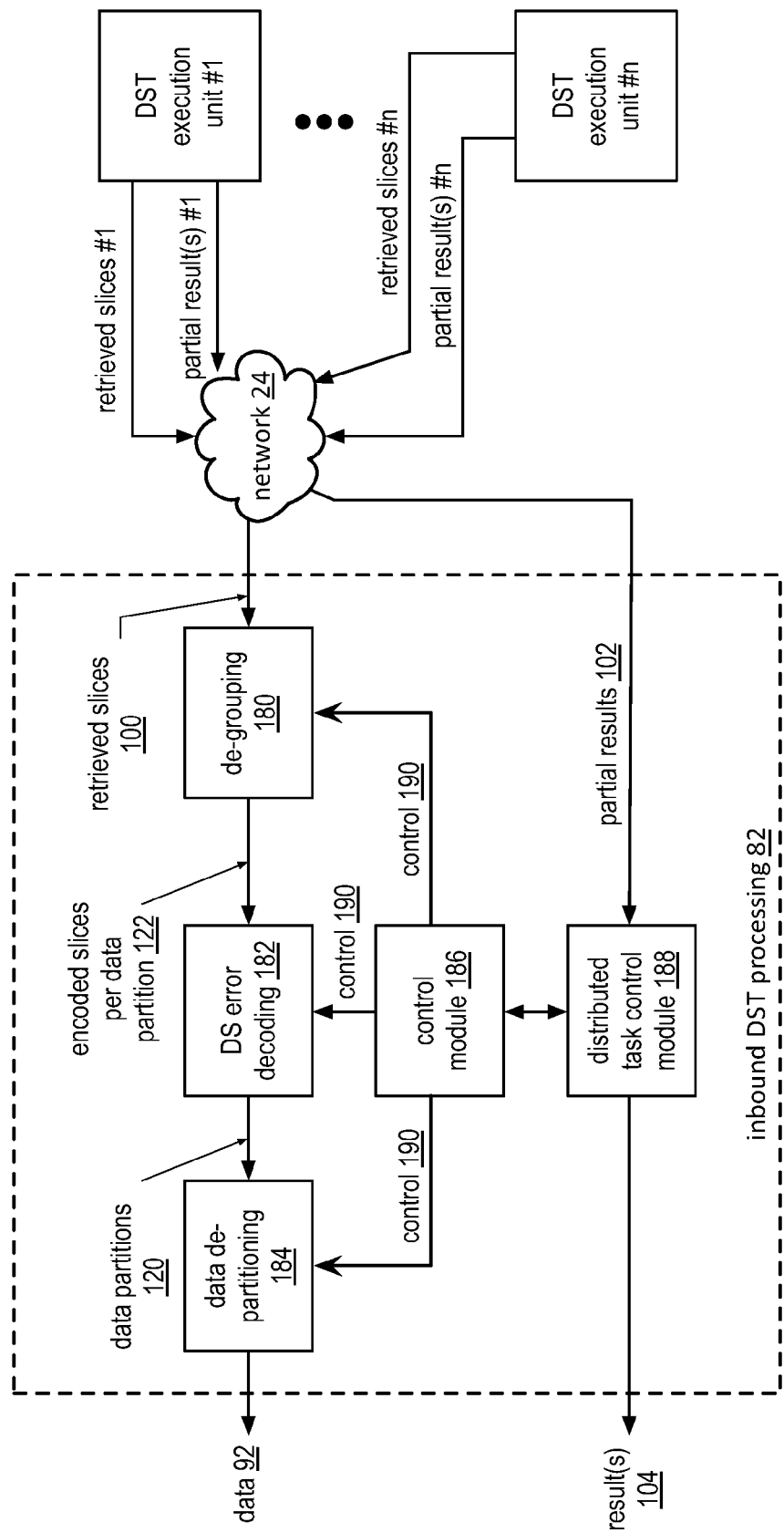
FIG. 13 is a schematic block diagram of an embodiment of an inbound distributed storage and/or task (DST) processing in accordance with the present invention.

FIG. 13 is a schematic block diagram of an embodiment of an inbound distributed storage and/or task (DST) processing section 82 of a DST client module coupled to DST execution units of a distributed storage and task network (DSTN) module via a network 24. The inbound DST processing section 82 includes a de-grouping module 180, a DS (dispersed storage) error decoding module 182, a data de-partitioning module 184, a control module 186, and a distributed task control module 188. Note that the control module 186 and/or the distributed task control module 188 may be separate modules from corresponding ones of outbound DST processing section or may be the same modules.

In an example of operation, the DST execution units have completed execution of corresponding partial tasks on the corresponding slice groupings to produce partial results 102. The inbound DST processing section 82 receives the partial results 102 via the distributed task control module 188. The inbound DST processing section 82 then processes the partial results 102 to produce a final result, or results 104. For example, if the task was to find a specific word or phrase within data, the partial results 102 indicate where in each of the prescribed portions of the data the corresponding DST execution units found the specific word or phrase. The distributed task control module 188 combines the individual partial results 102 for the corresponding portions of the data into a final result 104 for the data as a whole.

In another example of operation, the inbound DST processing section 82 is retrieving stored data from the DST execution units (i.e., the DSTN module). In this example, the DST execution units output encoded data slices 100 corresponding to the data retrieval requests. The de-grouping module 180 receives retrieved slices 100 and de-groups them to produce encoded data slices per data partition 122. The DS error decoding module 182 decodes, in accordance with DS error encoding parameters, the encoded data slices per data partition 122 to produce data partitions 120.

The data de-partitioning module 184 combines the data partitions 120 into the data 92. The control module 186 controls the conversion of retrieved slices 100 into the data 92 using control signals 190 to each of the modules. For instance, the control module 186 provides de-grouping information to the de-grouping module 180, provides the DS error encoding parameters to the DS error decoding module 182, and provides de-partitioning information to the data de-partitioning module 184.

Figure 14:
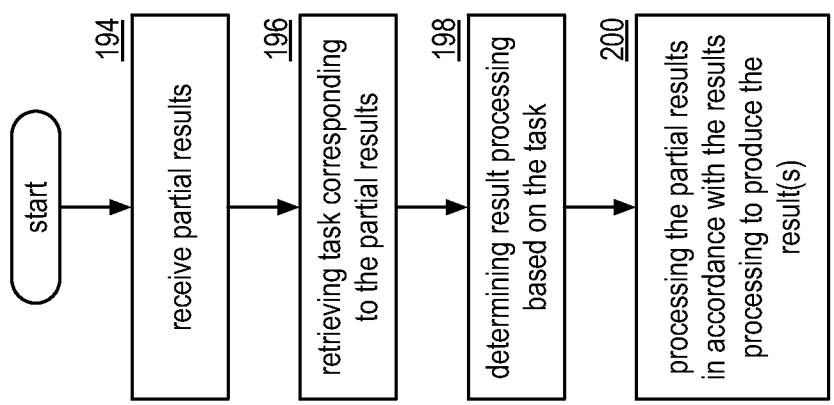
FIG. 14 is a logic diagram of an example of a method for inbound DST processing in accordance with the present invention.

FIG. 14 is a logic diagram of an example of a method that is executable by distributed storage and task (DST) client module regarding inbound DST processing. The method begins at step 194 where the DST client module receives partial results. The method continues at step 196 where the DST client module retrieves the task corresponding to the partial results. For example, the partial results include header information that identifies the requesting entity, which correlates to the requested task.

The method continues at step 198 where the DST client module determines result processing information based on the task. For example, if the task were to identify a particular word or phrase within the data, the result processing information would indicate to aggregate the partial results for the corresponding portions of the data to produce the final result. As another example, if the task were to count the occurrences of a particular word or phrase within the data, results of processing the information would indicate to add the partial results to produce the final results. The method continues at step 200 where the DST client module processes the partial results in accordance with the result processing information to produce the final result or results.

Figure 15:
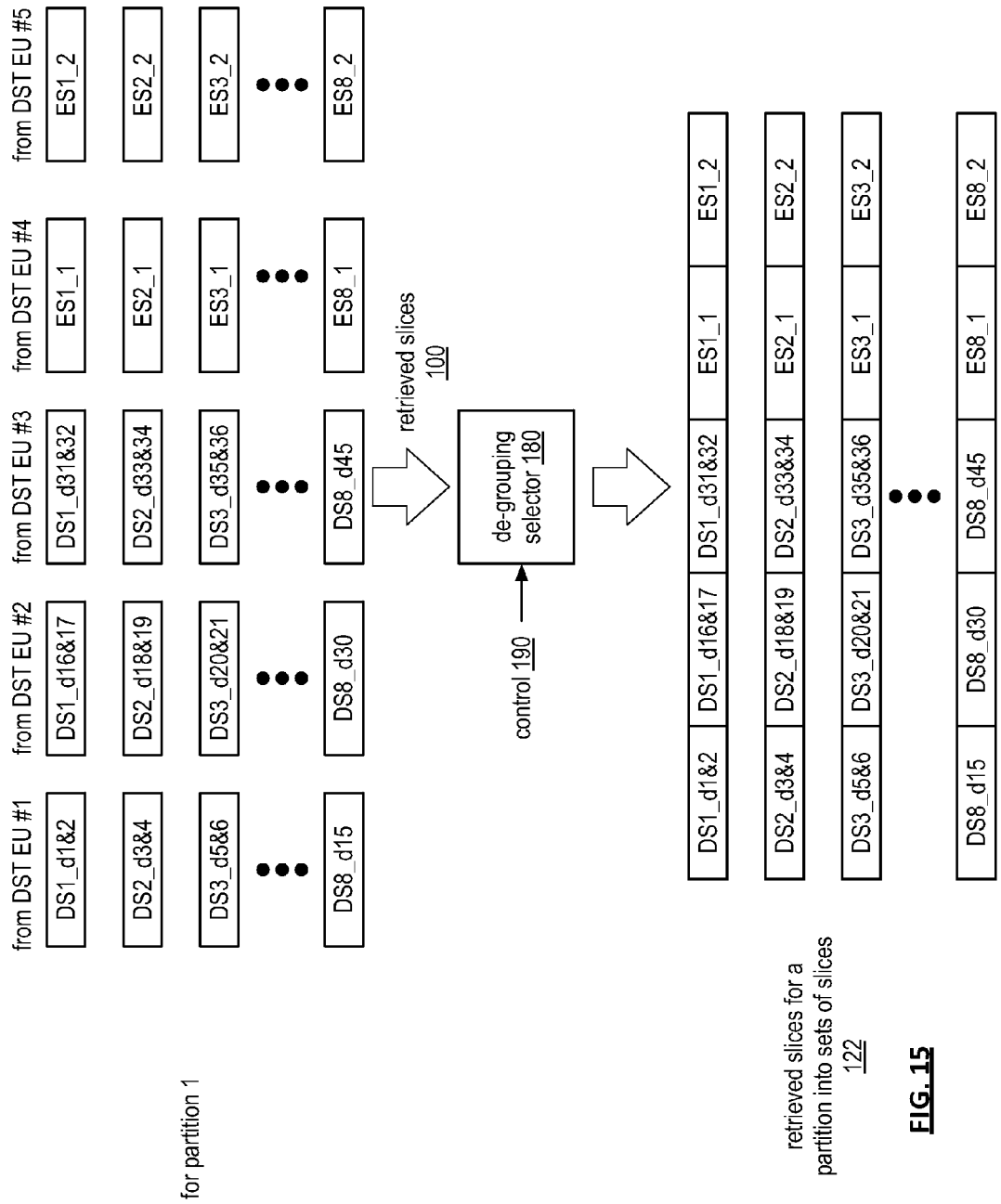
FIG. 15 is a diagram of an example of de-grouping selection processing of the inbound DST processing in accordance with the present invention.

FIG. 15 is a diagram of an example of de-grouping selection processing of an inbound distributed storage and task (DST) processing section of a DST client module. In general, this is an inverse process of the grouping module of the outbound DST processing section of FIG. 9. Accordingly, for each data partition (e.g., partition #1), the de-grouping module retrieves the corresponding slice grouping from the DST execution units (EU) (e.g., DST 1-5).

As shown, DST execution unit #1 provides a first slice grouping, which includes the first encoded slices of each of the sets of encoded slices (e.g., encoded data slices of contiguous data of data blocks 1-15); DST execution unit #2 provides a second slice grouping, which includes the second encoded slices of each of the sets of encoded slices (e.g., encoded data slices of contiguous data of data blocks 16-30); DST execution unit #3 provides a third slice grouping, which includes the third encoded slices of each of the sets of encoded slices (e.g., encoded data slices of contiguous data of data blocks 31-45); DST execution unit #4 provides a fourth slice grouping, which includes the fourth encoded slices of each of the sets of encoded slices (e.g., first encoded data slices of error coding (EC) data); and DST execution unit #5 provides a fifth slice grouping, which includes the fifth encoded slices of each of the sets of encoded slices (e.g., first encoded data slices of error coding (EC) data).

The de-grouping module de-groups the slice groupings (e.g., received slices 100) using a de-grouping selector 180 controlled by a control signal 190 as shown in the example to produce a plurality of sets of encoded data slices (e.g., retrieved slices for a partition into sets of slices 122). Each set corresponding to a data segment of the data partition.

Figure 16:
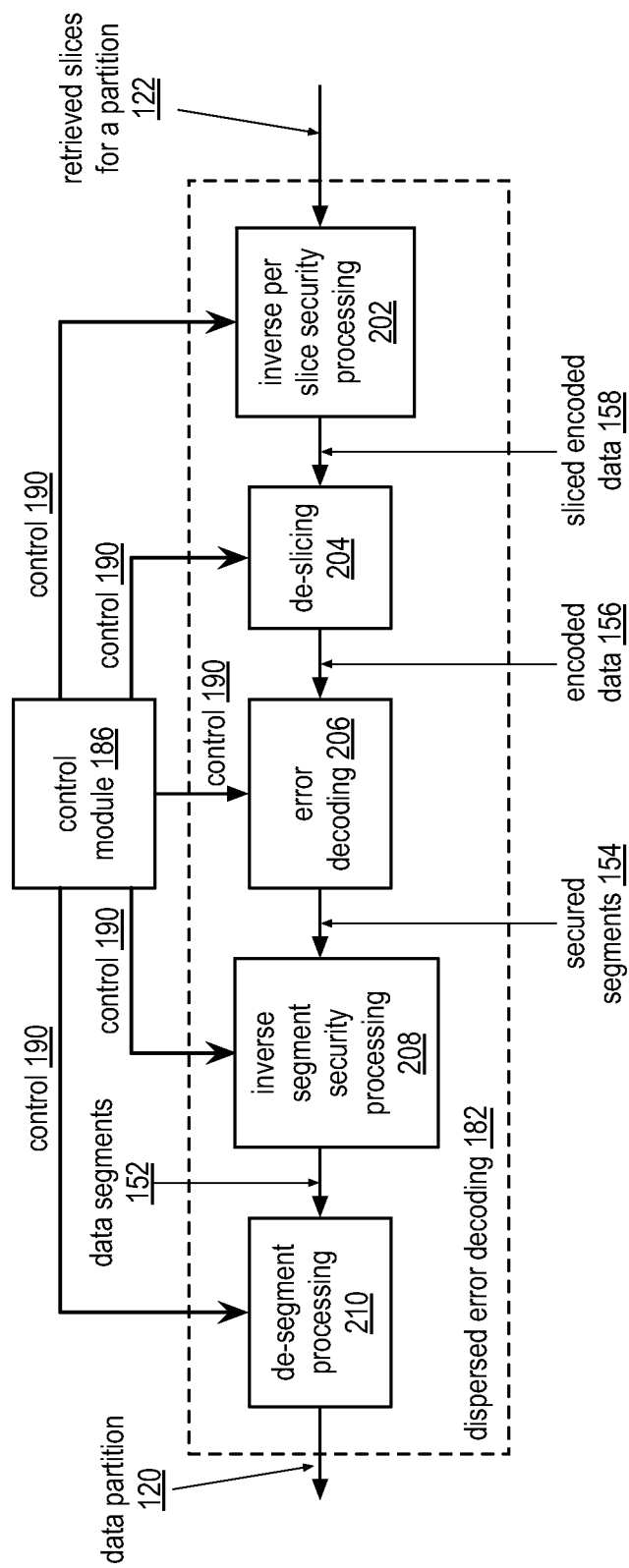
FIG. 16 is a schematic block diagram of an embodiment of a dispersed error decoding in accordance with the present invention.

FIG. 16 is a schematic block diagram of an embodiment of a dispersed storage (DS) error decoding module 182 of an inbound distributed storage and task (DST) processing section. The DS error decoding module 182 includes an inverse per slice security processing module 202, a de-slicing module 204, an error decoding module 206, an inverse segment security module 208, a de-segmenting processing module 210, and a control module 186.

In an example of operation, the inverse per slice security processing module 202, when enabled by the control module 186, unsecures each encoded data slice 122 based on slice de-security information received as control information 190 (e.g., the compliment of the slice security information discussed with reference to FIG. 6) received from the control module 186. The slice security information includes data decompression, decryption, de-watermarking, integrity check (e.g., CRC verification, etc.), and/or any other type of digital security. For example, when the inverse per slice security processing module 202 is enabled, it verifies integrity information (e.g., a CRC value) of each encoded data slice 122, it decrypts each verified encoded data slice, and decompresses each decrypted encoded data slice to produce slice encoded data 158. When the inverse per slice security processing module 202 is not enabled, it passes the encoded data slices 122 as the sliced encoded data 158 or is bypassed such that the retrieved encoded data slices 122 are provided as the sliced encoded data 158.

The de-slicing module 204 de-slices the sliced encoded data 158 into encoded data segments 156 in accordance with a pillar width of the error correction encoding parameters received as control information 190 from the control module 186. For example, if the pillar width is five, the de-slicing module 204 de-slices a set of five encoded data slices into an encoded data segment 156. The error decoding module 206 decodes the encoded data segments 156 in accordance with error correction decoding parameters received as control information 190 from the control module 186 to produce secure data segments 154. The error correction decoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction decoding parameters identify a specific error correction encoding scheme, specify a pillar width of five, and specify a decode threshold of three.

The inverse segment security processing module 208, when enabled by the control module 186, unsecures the secured data segments 154 based on segment security information received as control information 190 from the control module 186. The segment security information includes data decompression, decryption, de-watermarking, integrity check (e.g., CRC, etc.) verification, and/or any other type of digital security. For example, when the inverse segment security processing module 208 is enabled, it verifies integrity information (e.g., a CRC value) of each secure data segment 154, it decrypts each verified secured data segment, and decompresses each decrypted secure data segment to produce a data segment 152. When the inverse segment security processing module 208 is not enabled, it passes the decoded data segment 154 as the data segment 152 or is bypassed.

The de-segment processing module 210 receives the data segments 152 and receives de-segmenting information as control information 190 from the control module 186. The de-segmenting information indicates how the de-segment processing module 210 is to de-segment the data segments 152 into a data partition 120. For example, the de-segmenting information indicates how the rows and columns of data segments are to be rearranged to yield the data partition 120.

Figure 17:
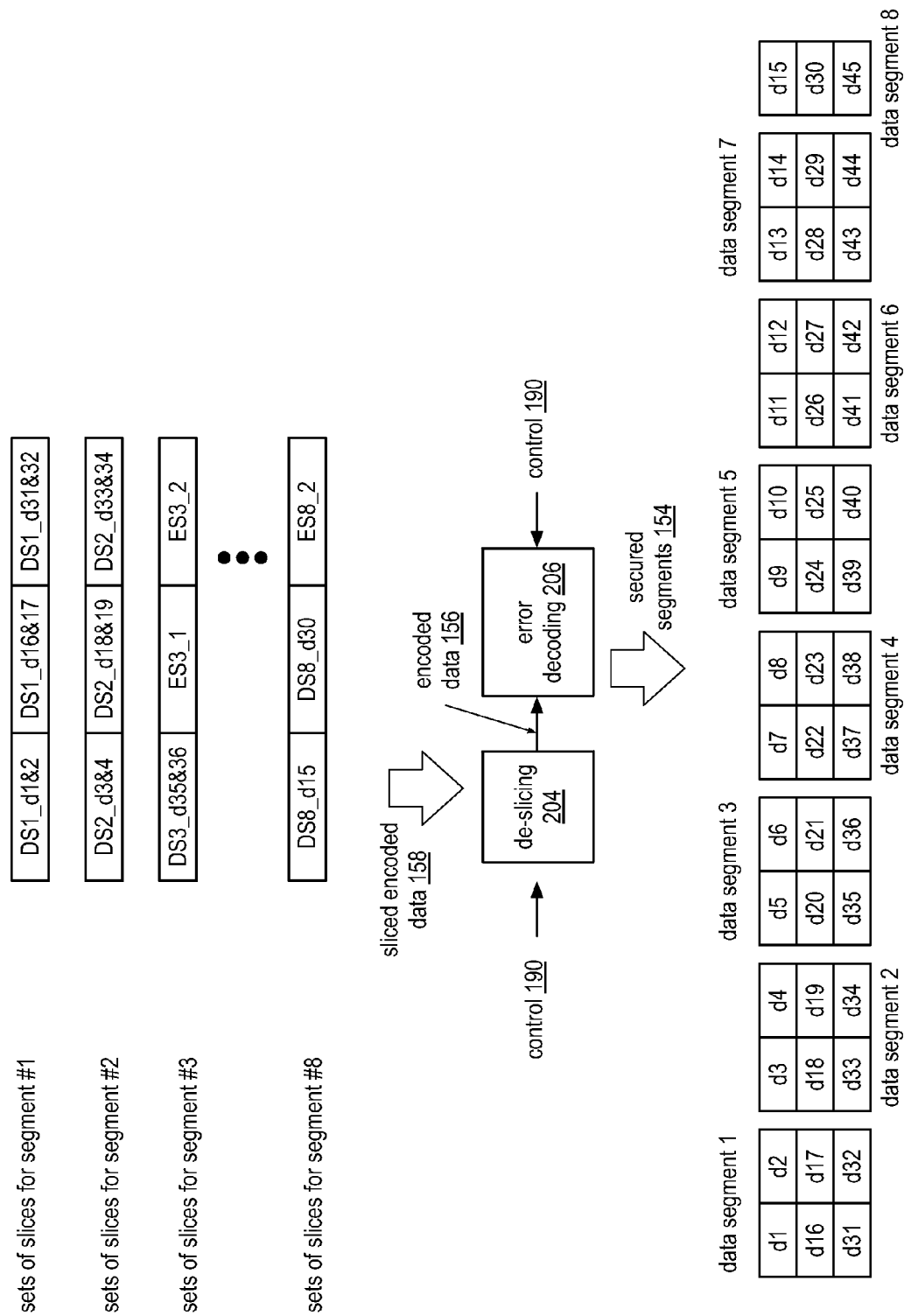
FIG. 17 is a diagram of an example of de-slicing and error decoding processing of the dispersed error decoding in accordance with the present invention.

FIG. 17 is a diagram of an example of de-slicing and error decoding processing of a dispersed error decoding module. A de-slicing module 204 receives at least a decode threshold number of encoded data slices 158 for each data segment in accordance with control information 190 and provides encoded data 156. In this example, a decode threshold is three. As such, each set of encoded data slices 158 is shown to have three encoded data slices per data segment. The de-slicing module 204 may receive three encoded data slices per data segment because an associated distributed storage and task (DST) client module requested retrieving only three encoded data slices per segment or selected three of the retrieved encoded data slices per data segment. As shown, which is based on the unity matrix encoding previously discussed with reference to FIG. 8, an encoded data slice may be a data-based encoded data slice (e.g., DS1_d1&d2) or an error code based encoded data slice (e.g., ES3_1).

An error decoding module 206 decodes the encoded data 156 of each data segment in accordance with the error correction decoding parameters of control information 190 to produce secured segments 154. In this example, data segment 1 includes 3 rows with each row being treated as one word for encoding. As such, data segment 1 includes three words: word 1 including data blocks d1 and d2, word 2 including data blocks d16 and d17, and word 3 including data blocks d31 and d32. Each of data segments 2-7 includes three words where each word includes two data blocks. Data segment 8 includes three words where each word includes a single data block (e.g., d15, d30, and d45).

Figure 18:
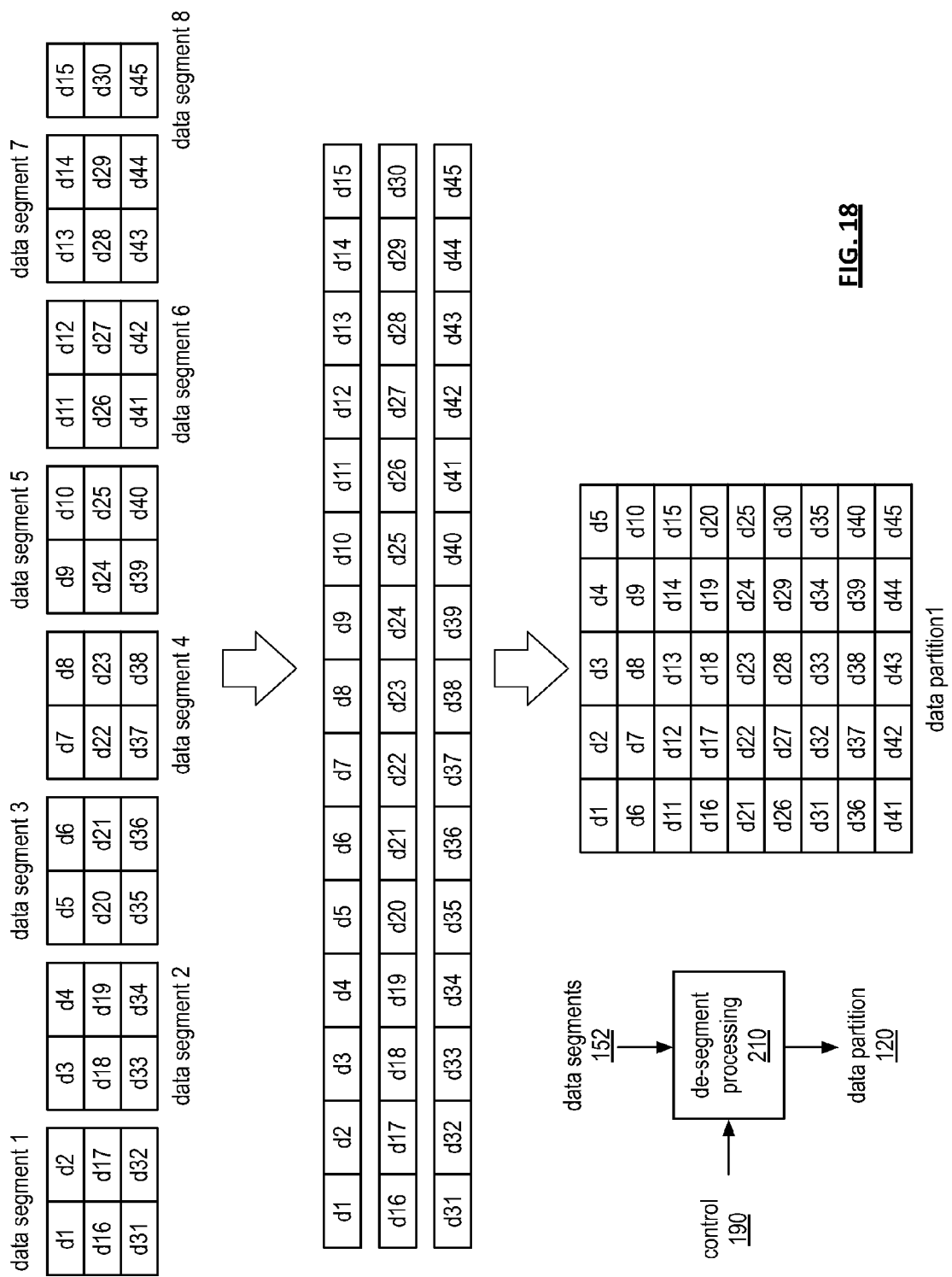
FIG. 18 is a diagram of an example of a de-segment processing of the dispersed error decoding in accordance with the present invention.

FIG. 18 is a diagram of an example of a de-segment processing of an inbound distributed storage and task (DST) processing. In this example, a de-segment processing module 210 receives data segments 152 (e.g., 1-8) and rearranges the data blocks of the data segments into rows and columns in accordance with de-segmenting information of control information 190 to produce a data partition 120. Note that the number of rows is based on the decode threshold (e.g., 3 in this specific example) and the number of columns is based on the number and size of the data blocks.

The de-segmenting module 210 converts the rows and columns of data blocks into the data partition 120. Note that each data block may be of the same size as other data blocks or of a different size. In addition, the size of each data block may be a few bytes to megabytes of data.

Figure 19:
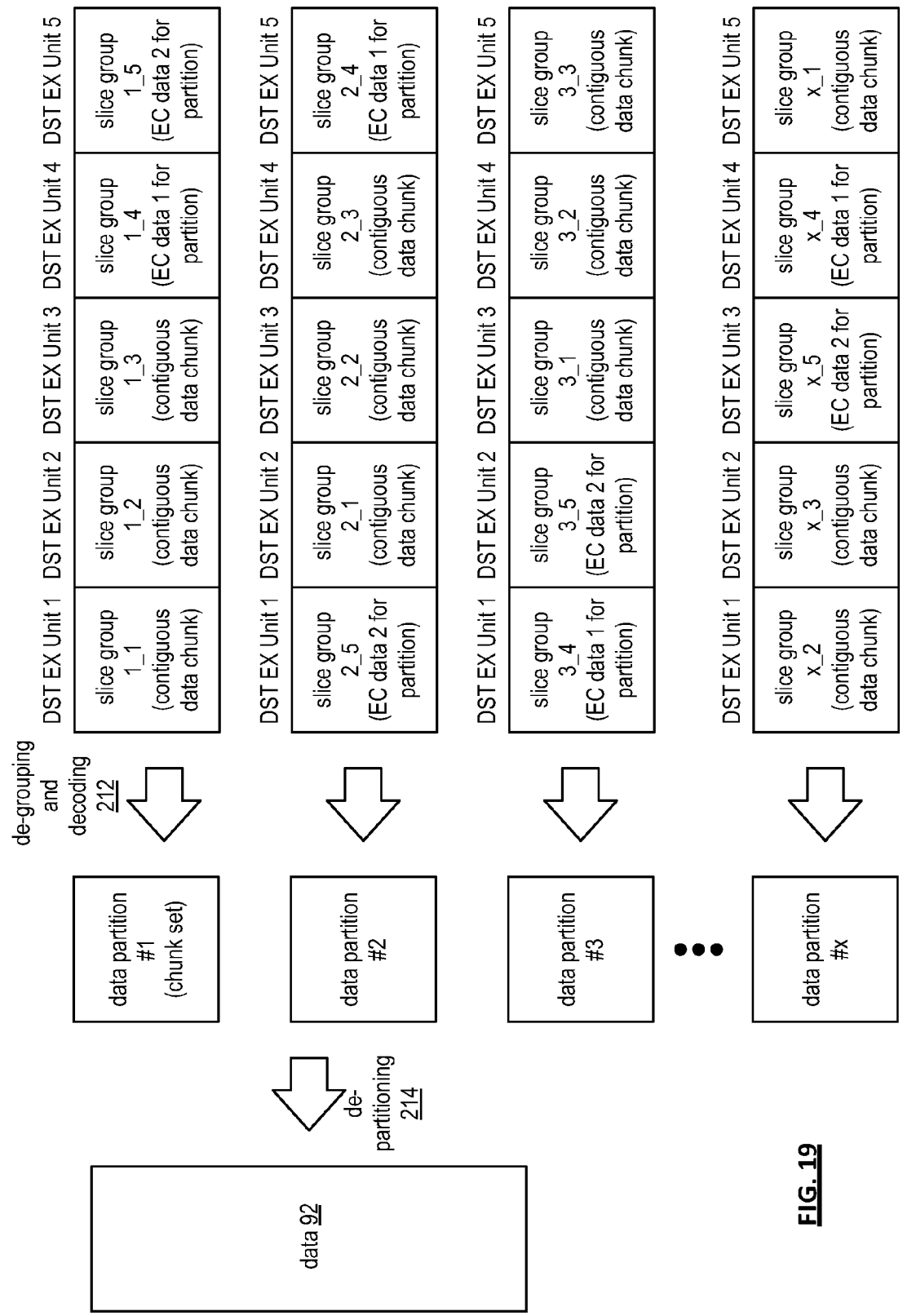
FIG. 19 is a diagram of an example of converting slice groups into data in accordance with the present invention.

FIG. 19 is a diagram of an example of converting slice groups into data 92 within an inbound distributed storage and task (DST) processing section. As shown, the data 92 is reconstructed from a plurality of data partitions (1-x, where x is an integer greater than 4). Each data partition (or chunk set of data) is decoded and re-grouped using a de-grouping and decoding function 212 and a de-partition function 214 from slice groupings as previously discussed. For a given data partition, the slice groupings (e.g., at least a decode threshold per data segment of encoded data slices) are received from DST execution units. From data partition to data partition, the ordering of the slice groupings received from the DST execution units may vary as discussed with reference to FIG. 10.

Figure 20:
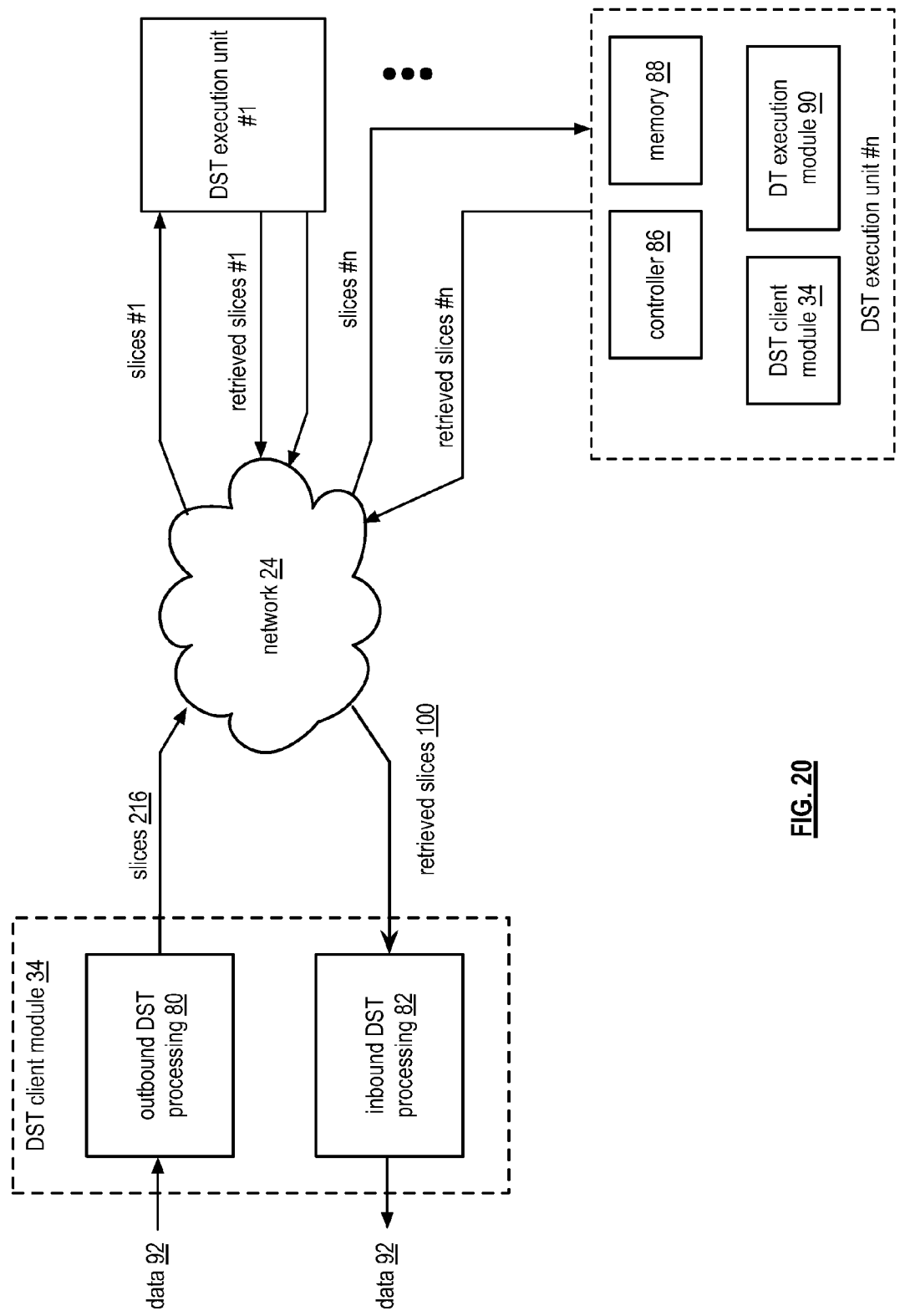
FIG. 20 is a diagram of an example of a distributed storage within the distributed computing system in accordance with the present invention.

FIG. 20 is a diagram of an example of a distributed storage and/or retrieval within the distributed computing system. The distributed computing system includes a plurality of distributed storage and/or task (DST) processing client modules 34 (one shown) coupled to a distributed storage and/or task processing network (DSTN) module, or multiple DSTN modules, via a network 24. The DST client module 34 includes an outbound DST processing section 80 and an inbound DST processing section 82. The DSTN module includes a plurality of DST execution units. Each DST execution unit includes a controller 86, memory 88, one or more distributed task (DT) execution modules 90, and a DST client module 34.

In an example of data storage, the DST client module 34 has data 92 that it desires to store in the DSTN module. The data 92 may be a file (e.g., video, audio, text, graphics, etc.), a data object, a data block, an update to a file, an update to a data block, etc. In this instance, the outbound DST processing module 80 converts the data 92 into encoded data slices 216 as will be further described with reference to FIGS. 21-23. The outbound DST processing module 80 sends, via the network 24, to the DST execution units for storage as further described with reference to FIG. 24.

In an example of data retrieval, the DST client module 34 issues a retrieve request to the DST execution units for the desired data 92. The retrieve request may address each DST executions units storing encoded data slices of the desired data, address a decode threshold number of DST execution units, address a read threshold number of DST execution units, or address some other number of DST execution units. In response to the request, each addressed DST execution unit retrieves its encoded data slices 100 of the desired data and sends them to the inbound DST processing section 82, via the network 24.

When, for each data segment, the inbound DST processing section 82 receives at least a decode threshold number of encoded data slices 100, it converts the encoded data slices 100 into a data segment. The inbound DST processing section 82 aggregates the data segments to produce the retrieved data 92.

Figure 21:
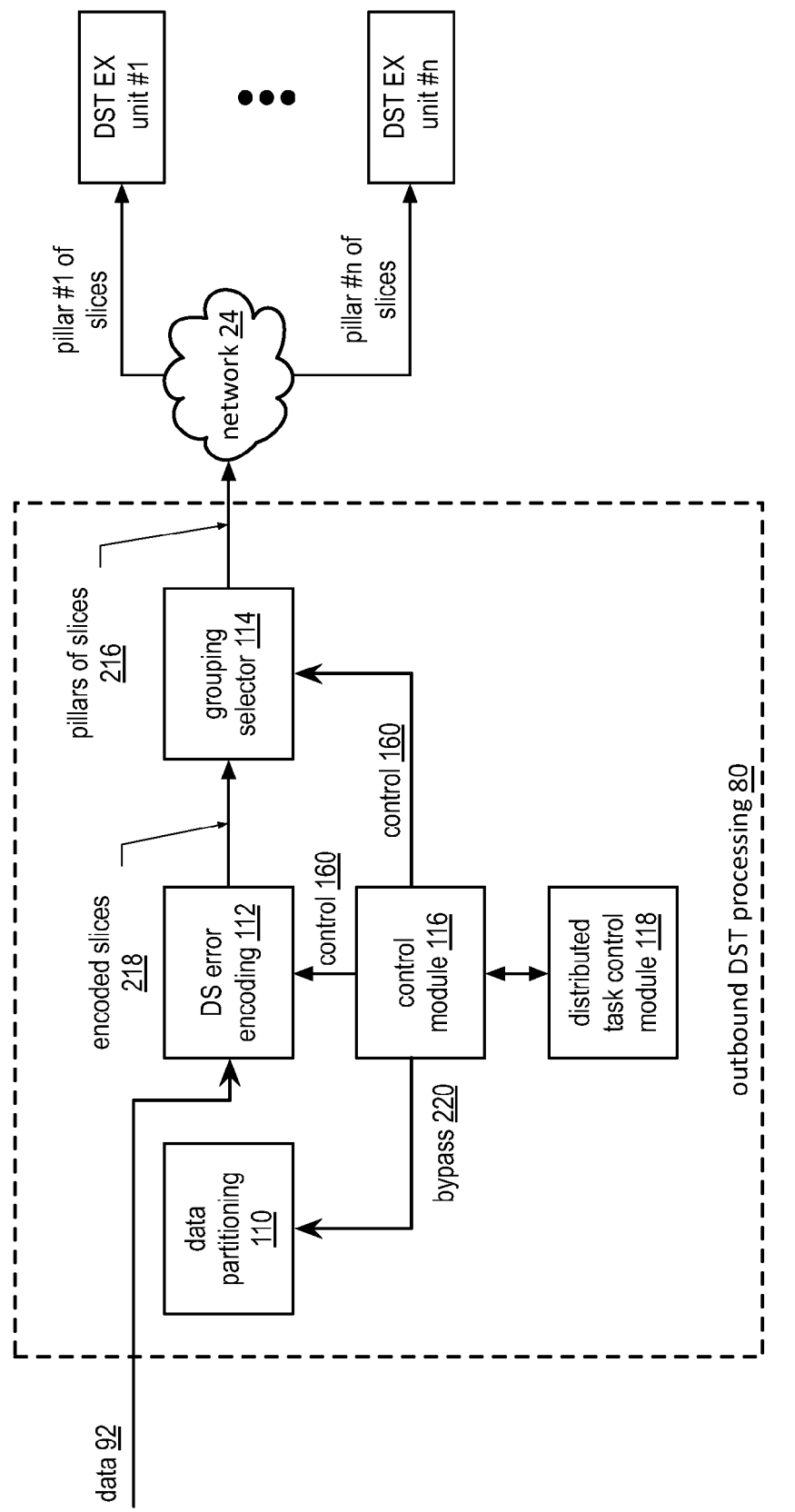
FIG. 21 is a schematic block diagram of an example of operation of outbound distributed storage and/or task (DST) processing for storing data in accordance with the present invention.

FIG. 21 is a schematic block diagram of an embodiment of an outbound distributed storage and/or task (DST) processing section 80 of a DST client module coupled to a distributed storage and task network (DSTN) module (e.g., a plurality of DST execution units) via a network 24. The outbound DST processing section 80 includes a data partitioning module 110, a dispersed storage (DS) error encoding module 112, a grouping selector module 114, a control module 116, and a distributed task control module 118.

In an example of operation, the data partitioning module 110 is by-passed such that data 92 is provided directly to the DS error encoding module 112. The control module 116 coordinates the by-passing of the data partitioning module 110 by outputting a bypass 220 message to the data partitioning module 110.

The DS error encoding module 112 receives the data 92 in a serial manner, a parallel manner, and/or a combination thereof. The DS error encoding module 112 DS error encodes the data in accordance with control information 160 from the control module 116 to produce encoded data slices 218. The DS error encoding includes segmenting the data 92 into data segments, segment security processing (e.g., encryption, compression, watermarking, integrity check (e.g., CRC, etc.)), error encoding, slicing, and/or per slice security processing (e.g., encryption, compression, watermarking, integrity check (e.g., CRC, etc.)). The control information 160 indicates which steps of the DS error encoding are active for the data 92 and, for active steps, indicates the parameters for the step. For example, the control information 160 indicates that the error encoding is active and includes error encoding parameters (e.g., pillar width, decode threshold, write threshold, read threshold, type of error encoding, etc.).

The grouping selector module 114 groups the encoded slices 218 of the data segments into pillars of slices 216. The number of pillars corresponds to the pillar width of the DS error encoding parameters. In this example, the distributed task control module 118 facilitates the storage request.

Figure 22:
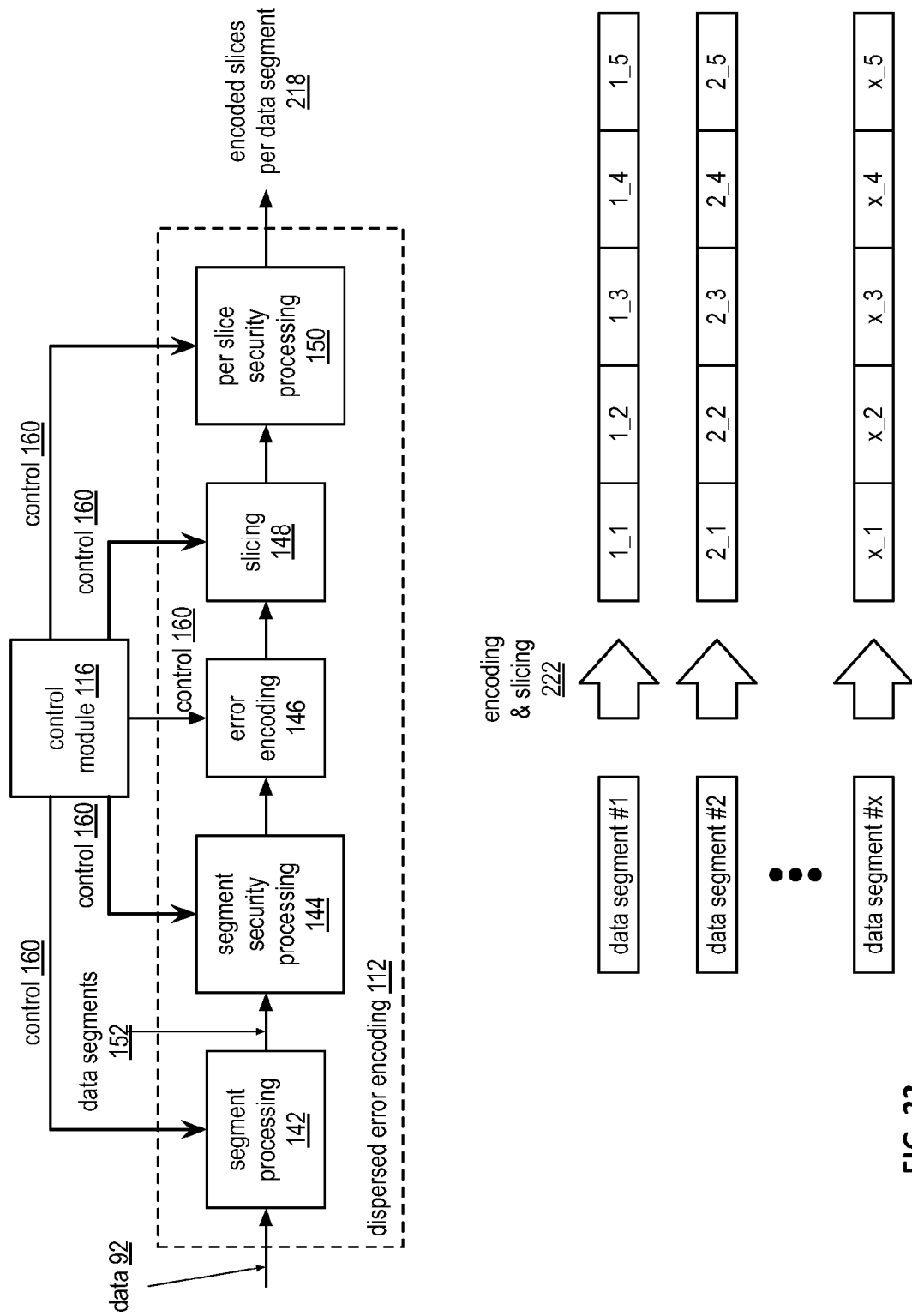
FIG. 22 is a schematic block diagram of an example of a dispersed error encoding for the example of FIG. 21 in accordance with the present invention.

FIG. 22 is a schematic block diagram of an example of a dispersed storage (DS) error encoding module 112 for the example of FIG. 21. The DS error encoding module 112 includes a segment processing module 142, a segment security processing module 144, an error encoding module 146, a slicing module 148, and a per slice security processing module 150. Each of these modules is coupled to a control module 116 to receive control information 160 therefrom.

In an example of operation, the segment processing module 142 receives data 92 and receives segmenting information as control information 160 from the control module 116. The segmenting information indicates how the segment processing module is to segment the data. For example, the segmenting information indicates the size of each data segment. The segment processing module 142 segments the data 92 into data segments 152 in accordance with the segmenting information.

The segment security processing module 144, when enabled by the control module 116, secures the data segments 152 based on segment security information received as control information 160 from the control module 116. The segment security information includes data compression, encryption, watermarking, integrity check (e.g., CRC, etc.), and/or any other type of digital security. For example, when the segment security processing module 144 is enabled, it compresses a data segment 152, encrypts the compressed data segment, and generates a CRC value for the encrypted data segment to produce a secure data segment. When the segment security processing module 144 is not enabled, it passes the data segments 152 to the error encoding module 146 or is bypassed such that the data segments 152 are provided to the error encoding module 146.

The error encoding module 146 encodes the secure data segments in accordance with error correction encoding parameters received as control information 160 from the control module 116. The error correction encoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction encoding parameters identify a specific error correction encoding scheme, specifies a pillar width of five, and specifies a decode threshold of three. From these parameters, the error encoding module 146 encodes a data segment to produce an encoded data segment.

The slicing module 148 slices the encoded data segment in accordance with a pillar width of the error correction encoding parameters. For example, if the pillar width is five, the slicing module slices an encoded data segment into a set of five encoded data slices. As such, for a plurality of data segments, the slicing module 148 outputs a plurality of sets of encoded data slices as shown within encoding and slicing function 222 as described.

The per slice security processing module 150, when enabled by the control module 116, secures each encoded data slice based on slice security information received as control information 160 from the control module 116. The slice security information includes data compression, encryption, watermarking, integrity check (e.g., CRC, etc.), and/or any other type of digital security. For example, when the per slice security processing module 150 is enabled, it may compress an encoded data slice, encrypt the compressed encoded data slice, and generate a CRC value for the encrypted encoded data slice to produce a secure encoded data slice tweaking. When the per slice security processing module 150 is not enabled, it passes the encoded data slices or is bypassed such that the encoded data slices 218 are the output of the DS error encoding module 112.

Figure 23:
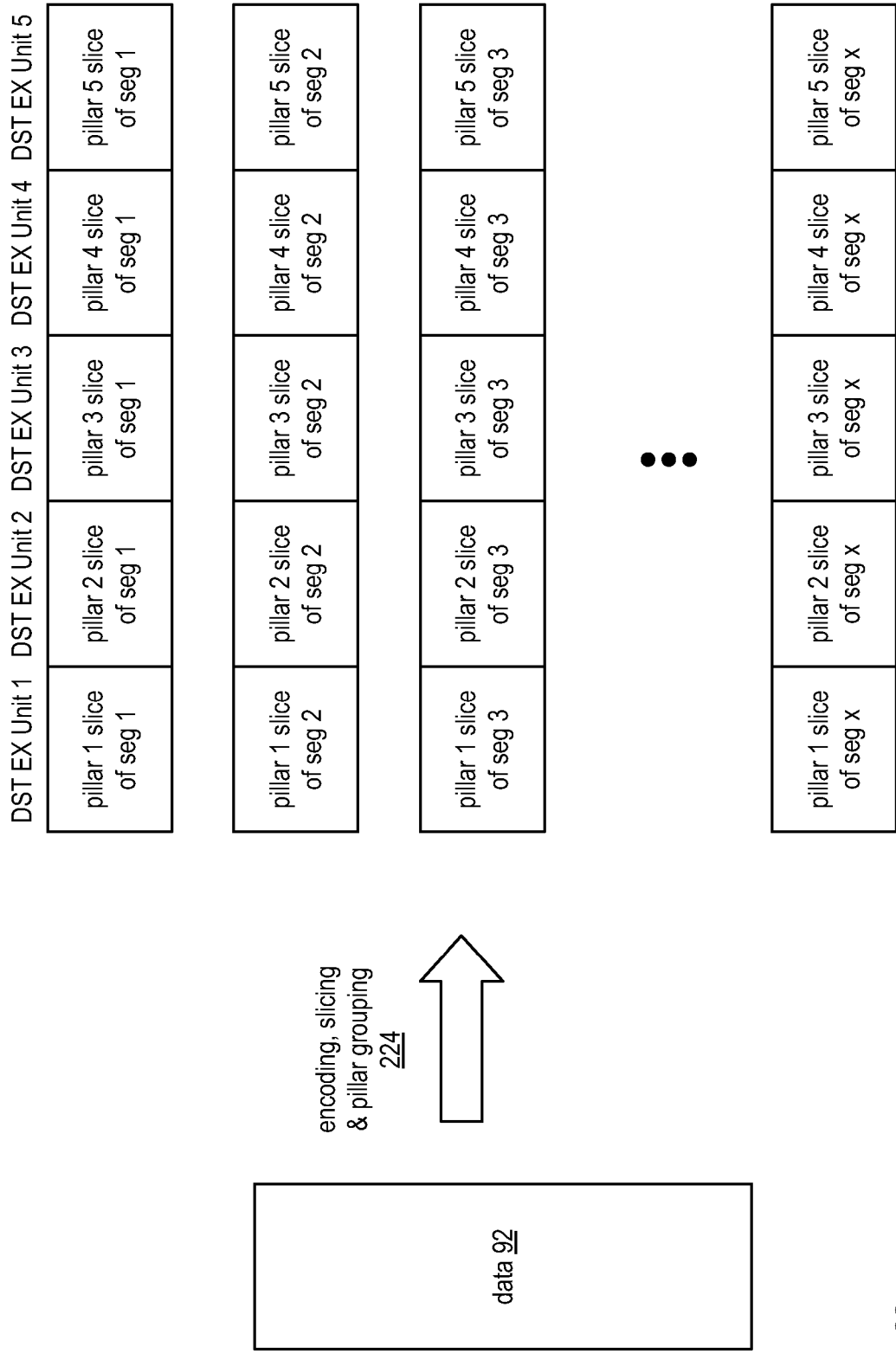
FIG. 23 is a diagram of an example of converting data into pillar slice groups for storage in accordance with the present invention.

FIG. 23 is a diagram of an example of converting data 92 into pillar slice groups utilizing encoding, slicing and pillar grouping function 224 for storage in memory of a distributed storage and task network (DSTN) module. As previously discussed the data 92 is encoded and sliced into a plurality of sets of encoded data slices; one set per data segment. The grouping selector module organizes the sets of encoded data slices into pillars of data slices. In this example, the DS error encoding parameters include a pillar width of 5 and a decode threshold of 3. As such, for each data segment, 5 encoded data slices are created.

The grouping selector module takes the first encoded data slice of each of the sets and forms a first pillar, which may be sent to the first DST execution unit. Similarly, the grouping selector module creates the second pillar from the second slices of the sets; the third pillar from the third slices of the sets; the fourth pillar from the fourth slices of the sets; and the fifth pillar from the fifth slices of the set.

FIG. 24 is a schematic block diagram of an embodiment of a distributed storage and/or task (DST) execution unit that includes an interface 169, a controller 86, memory 88, one or more distributed task (DT) execution modules 90, and a DST client module 34. A computing core 26 may be utilized to implement the one or more DT execution modules 90 and the DST client module 34. The memory 88 is of sufficient size to store a significant number of encoded data slices (e.g., thousands of slices to hundreds-of-millions of slices) and may include one or more hard drives and/or one or more solid-state memory devices (e.g., flash memory, DRAM, etc.).

In an example of storing a pillar of slices 216, the DST execution unit receives, via interface 169, a pillar of slices 216 (e.g., pillar #1 slices). The memory 88 stores the encoded data slices 216 of the pillar of slices in accordance with memory control information 174 it receives from the controller 86. The controller 86 (e.g., a processing module, a CPU, etc.) generates the memory control information 174 based on distributed storage information (e.g., user information (e.g., user ID, distributed storage permissions, data access permission, etc.), vault information (e.g., virtual memory assigned to user, user group, etc.), etc.). Similarly, when retrieving slices, the DST execution unit receives, via interface 169, a slice retrieval request. The memory 88 retrieves the slice in accordance with memory control information 174 it receives from the controller 86. The memory 88 outputs the slice 100, via the interface 169, to a requesting entity.

FIG. 25 is a schematic block diagram of an example of operation of an inbound distributed storage and/or task (DST) processing section 82 for retrieving dispersed error encoded data 92. The inbound DST processing section 82 includes a de-grouping module 180, a dispersed storage (DS) error decoding module 182, a data de-partitioning module 184, a control module 186, and a distributed task control module 188. Note that the control module 186 and/or the distributed task control module 188 may be separate modules from corresponding ones of an outbound DST processing section or may be the same modules.

In an example of operation, the inbound DST processing section 82 is retrieving stored data 92 from the DST execution units (i.e., the DSTN module). In this example, the DST execution units output encoded data slices corresponding to data retrieval requests from the distributed task control module 188. The de-grouping module 180 receives pillars of slices 100 and de-groups them in accordance with control information 190 from the control module 186 to produce sets of encoded data slices 218. The DS error decoding module 182 decodes, in accordance with the DS error encoding parameters received as control information 190 from the control module 186, each set of encoded data slices 218 to produce data segments, which are aggregated into retrieved data 92. The data de-partitioning module 184 is by-passed in this operational mode via a bypass signal 226 of control information 190 from the control module 186.

FIG. 26 is a schematic block diagram of an embodiment of a dispersed storage (DS) error decoding module 182 of an inbound distributed storage and task (DST) processing section. The DS error decoding module 182 includes an inverse per slice security processing module 202, a de-slicing module 204, an error decoding module 206, an inverse segment security module 208, and a de-segmenting processing module 210. The dispersed error decoding module 182 is operable to de-slice and decode encoded slices per data segment 218 utilizing a de-slicing and decoding function 228 to produce a plurality of data segments that are de-segmented utilizing a de-segment function 230 to recover data 92.

In an example of operation, the inverse per slice security processing module 202, when enabled by the control module 186 via control information 190, unsecures each encoded data slice 218 based on slice de-security information (e.g., the compliment of the slice security information discussed with reference to FIG. 6) received as control information 190 from the control module 186. The slice de-security information includes data decompression, decryption, de-watermarking, integrity check (e.g., CRC verification, etc.), and/or any other type of digital security. For example, when the inverse per slice security processing module 202 is enabled, it verifies integrity information (e.g., a CRC value) of each encoded data slice 218, it decrypts each verified encoded data slice, and decompresses each decrypted encoded data slice to produce slice encoded data. When the inverse per slice security processing module 202 is not enabled, it passes the encoded data slices 218 as the sliced encoded data or is bypassed such that the retrieved encoded data slices 218 are provided as the sliced encoded data.

The de-slicing module 204 de-slices the sliced encoded data into encoded data segments in accordance with a pillar width of the error correction encoding parameters received as control information 190 from a control module 186. For example, if the pillar width is five, the de-slicing module de-slices a set of five encoded data slices into an encoded data segment. Alternatively, the encoded data segment may include just three encoded data slices (e.g., when the decode threshold is 3).

The error decoding module 206 decodes the encoded data segments in accordance with error correction decoding parameters received as control information 190 from the control module 186 to produce secure data segments. The error correction decoding parameters include identifying an error correction encoding scheme (e.g., forward error correction algorithm, a Reed-Salomon based algorithm, an information dispersal algorithm, etc.), a pillar width, a decode threshold, a read threshold, a write threshold, etc. For example, the error correction decoding parameters identify a specific error correction encoding scheme, specify a pillar width of five, and specify a decode threshold of three.

The inverse segment security processing module 208, when enabled by the control module 186, unsecures the secured data segments based on segment security information received as control information 190 from the control module 186. The segment security information includes data decompression, decryption, de-watermarking, integrity check (e.g., CRC, etc.) verification, and/or any other type of digital security. For example, when the inverse segment security processing module is enabled, it verifies integrity information (e.g., a CRC value) of each secure data segment, it decrypts each verified secured data segment, and decompresses each decrypted secure data segment to produce a data segment 152. When the inverse segment security processing module 208 is not enabled, it passes the decoded data segment 152 as the data segment or is bypassed. The de-segmenting processing module 210 aggregates the data segments 152 into the data 92 in accordance with control information 190 from the control module 186.

FIG. 27 is a schematic block diagram of an example of a distributed storage and task processing network (DSTN) module that includes a plurality of distributed storage and task (DST) execution units (#1 through #n, where, for example, n is an integer greater than or equal to three). Each of the DST execution units includes a DST client module 34, a controller 86, one or more DT (distributed task) execution modules 90, and memory 88.

In this example, the DSTN module stores, in the memory of the DST execution units, a plurality of DS (dispersed storage) encoded data (e.g., 1 through n, where n is an integer greater than or equal to two) and stores a plurality of DS encoded task codes (e.g., 1 through k, where k is an integer greater than or equal to two). The DS encoded data may be encoded in accordance with one or more examples described with reference to FIGS. 3-19 (e.g., organized in slice groupings) or encoded in accordance with one or more examples described with reference to FIGS. 20-26 (e.g., organized in pillar groups). The data that is encoded into the DS encoded data may be of any size and/or of any content. For example, the data may be one or more digital books, a copy of a company's emails, a large-scale Internet search, a video security file, one or more entertainment video files (e.g., television programs, movies, etc.), data files, and/or any other large amount of data (e.g., greater than a few Terra-Bytes).

The tasks that are encoded into the DS encoded task code may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc. The tasks may be encoded into the DS encoded task code in accordance with one or more examples described with reference to FIGS. 3-19 (e.g., organized in slice groupings) or encoded in accordance with one or more examples described with reference to FIGS. 20-26 (e.g., organized in pillar groups).

In an example of operation, a DST client module of a user device or of a DST processing unit issues a DST request to the DSTN module. The DST request may include a request to retrieve stored data, or a portion thereof, may include a request to store data that is included with the DST request, may include a request to perform one or more tasks on stored data, may include a request to perform one or more tasks on data included with the DST request, etc. In the cases where the DST request includes a request to store data or to retrieve data, the client module and/or the DSTN module processes the request as previously discussed with reference to one or more of FIGS. 3-19 (e.g., slice groupings) and/or 20-26 (e.g., pillar groupings). In the case where the DST request includes a request to perform one or more tasks on data included with the DST request, the DST client module and/or the DSTN module process the DST request as previously discussed with reference to one or more of FIGS. 3-19.

In the case where the DST request includes a request to perform one or more tasks on stored data, the DST client module and/or the DSTN module processes the DST request as will be described with reference to one or more of FIGS. 28-39. In general, the DST client module identifies data and one or more tasks for the DSTN module to execute upon the identified data. The DST request may be for a one-time execution of the task or for an on-going execution of the task. As an example of the latter, as a company generates daily emails, the DST request may be to daily search new emails for inappropriate content and, if found, record the content, the email sender(s), the email recipient(s), email routing information, notify human resources of the identified email, etc.

FIG. 28 is a schematic block diagram of an example of a distributed computing system performing tasks on stored data. In this example, two distributed storage and task (DST) client modules 1-2 are shown: the first may be associated with a user device and the second may be associated with a DST processing unit or a high priority user device (e.g., high priority clearance user, system administrator, etc.). Each DST client module includes a list of stored data 234 and a list of tasks codes 236. The list of stored data 234 includes one or more entries of data identifying information, where each entry identifies data stored in the DSTN module 22. The data identifying information (e.g., data ID) includes one or more of a data file name, a data file directory listing, DSTN addressing information of the data, a data object identifier, etc. The list of tasks 236 includes one or more entries of task code identifying information, when each entry identifies task codes stored in the DSTN module 22. The task code identifying information (e.g., task ID) includes one or more of a task file name, a task file directory listing, DSTN addressing information of the task, another type of identifier to identify the task, etc.

As shown, the list of data 234 and the list of tasks 236 are each smaller in number of entries for the first DST client module than the corresponding lists of the second DST client module. This may occur because the user device associated with the first DST client module has fewer privileges in the distributed computing system than the device associated with the second DST client module. Alternatively, this may occur because the user device associated with the first DST client module serves fewer users than the device associated with the second DST client module and is restricted by the distributed computing system accordingly. As yet another alternative, this may occur through no restraints by the distributed computing system, it just occurred because the operator of the user device associated with the first DST client module has selected fewer data and/or fewer tasks than the operator of the device associated with the second DST client module.

In an example of operation, the first DST client module selects one or more data entries 238 and one or more tasks 240 from its respective lists (e.g., selected data ID and selected task ID). The first DST client module sends its selections to a task distribution module 232. The task distribution module 232 may be within a stand-alone device of the distributed computing system, may be within the user device that contains the first DST client module, or may be within the DSTN module 22.

Regardless of the task distribution module's location, it generates DST allocation information 242 from the selected task ID 240 and the selected data ID 238. The DST allocation information 242 includes data partitioning information, task execution information, and/or intermediate result information. The task distribution module 232 sends the DST allocation information 242 to the DSTN module 22. Note that one or more examples of the DST allocation information will be discussed with reference to one or more of FIGS. 29-39.

The DSTN module 22 interprets the DST allocation information 242 to identify the stored DS encoded data (e.g., DS error encoded data 2) and to identify the stored DS error encoded task code (e.g., DS error encoded task code 1). In addition, the DSTN module 22 interprets the DST allocation information 242 to determine how the data is to be partitioned and how the task is to be partitioned. The DSTN module 22 also determines whether the selected DS error encoded data 238 needs to be converted from pillar grouping to slice grouping. If so, the DSTN module 22 converts the selected DS error encoded data into slice groupings and stores the slice grouping DS error encoded data by overwriting the pillar grouping DS error encoded data or by storing it in a different location in the memory of the DSTN module 22 (i.e., does not overwrite the pillar grouping DS encoded data).

The DSTN module 22 partitions the data and the task as indicated in the DST allocation information 242 and sends the portions to selected DST execution units of the DSTN module 22. Each of the selected DST execution units performs its partial task(s) on its slice groupings to produce partial results. The DSTN module 22 collects the partial results from the selected DST execution units and provides them, as result information 244, to the task distribution module. The result information 244 may be the collected partial results, one or more final results as produced by the DSTN module 22 from processing the partial results in accordance with the DST allocation information 242, or one or more intermediate results as produced by the DSTN module 22 from processing the partial results in accordance with the DST allocation information 242.

The task distribution module 232 receives the result information 244 and provides one or more final results 104 therefrom to the first DST client module. The final result(s) 104 may be result information 244 or a result(s) of the task distribution module's processing of the result information 244.

In concurrence with processing the selected task of the first DST client module, the distributed computing system may process the selected task(s) of the second DST client module on the selected data(s) of the second DST client module. Alternatively, the distributed computing system may process the second DST client module's request subsequent to, or preceding, that of the first DST client module. Regardless of the ordering and/or parallel processing of the DST client module requests, the second DST client module provides its selected data 238 and selected task 240 to a task distribution module 232. If the task distribution module 232 is a separate device of the distributed computing system or within the DSTN module, the task distribution modules 232 coupled to the first and second DST client modules may be the same module. The task distribution module 232 processes the request of the second DST client module in a similar manner as it processed the request of the first DST client module.

FIG. 29 is a schematic block diagram of an embodiment of a task distribution module 232 facilitating the example of FIG. 28. The task distribution module 232 includes a plurality of tables it uses to generate distributed storage and task (DST) allocation information 242 for selected data and selected tasks received from a DST client module. The tables include data storage information 248, task storage information 250, distributed task (DT) execution module information 252, and task ⇔ sub-task mapping information 246.

The data storage information table 248 includes a data identification (ID) field 260, a data size field 262, an addressing information field 264, distributed storage (DS) information 266, and may further include other information regarding the data, how it is stored, and/or how it can be processed. For example, DS encoded data #1 has a data ID of 1, a data size of AA (e.g., a byte size of a few terra-bytes or more), addressing information of Addr_1_AA, and DS parameters of 3/5; SEG_1; and SLC_1. In this example, the addressing information may be a virtual address corresponding to the virtual address of the first storage word (e.g., one or more bytes) of the data and information on how to calculate the other addresses, may be a range of virtual addresses for the storage words of the data, physical addresses of the first storage word or the storage words of the data, may be a list of slices names of the encoded data slices of the data, etc. The DS parameters may include identity of an error encoding scheme, decode threshold/pillar width (e.g., 3/5 for the first data entry), segment security information (e.g., SEG_1), per slice security information (e.g., SLC_1), and/or any other information regarding how the data was encoded into data slices.

The task storage information table 250 includes a task identification (ID) field 268, a task size field 270, an addressing information field 272, distributed storage (DS) information 274, and may further include other information regarding the task, how it is stored, and/or how it can be used to process data. For example, DS encoded task #2 has a task ID of 2, a task size of XY, addressing information of Addr_2_XY, and DS parameters of 3/5; SEG_2; and SLC_2. In this example, the addressing information may be a virtual address corresponding to the virtual address of the first storage word (e.g., one or more bytes) of the task and information on how to calculate the other addresses, may be a range of virtual addresses for the storage words of the task, physical addresses of the first storage word or the storage words of the task, may be a list of slices names of the encoded slices of the task code, etc. The DS parameters may include identity of an error encoding scheme, decode threshold/pillar width (e.g., 3/5 for the first data entry), segment security information (e.g., SEG_2), per slice security information (e.g., SLC_2), and/or any other information regarding how the task was encoded into encoded task slices. Note that the segment and/or the per-slice security information include a type of encryption (if enabled), a type of compression (if enabled), watermarking information (if enabled), and/or an integrity check scheme (if enabled).

The task ⇔ sub-task mapping information table 246 includes a task field 256 and a sub-task field 258. The task field 256 identifies a task stored in the memory of a distributed storage and task network (DSTN) module and the corresponding sub-task fields 258 indicates whether the task includes sub-tasks and, if so, how many and if any of the sub-tasks are ordered. In this example, the task ⇔ sub-task mapping information table 246 includes an entry for each task stored in memory of the DSTN module (e.g., task 1 through task k). In particular, this example indicates that task 1 includes 7 sub-tasks; task 2 does not include sub-tasks, and task k includes r number of sub-tasks (where r is an integer greater than or equal to two).

The DT execution module table 252 includes a DST execution unit ID field 276, a DT execution module ID field 278, and a DT execution module capabilities field 280. The DST execution unit ID field 276 includes the identity of DST units in the DSTN module. The DT execution module ID field 278 includes the identity of each DT execution unit in each DST unit. For example, DST unit 1 includes three DT executions modules (e.g., 1_1, 1_2, and 1_3). The DT execution capabilities field 280 includes identity of the capabilities of the corresponding DT execution unit. For example, DT execution module 1_1 includes capabilities X, where X includes one or more of MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, memory information (e.g., type, size, availability, etc.), and/or any information germane to executing one or more tasks.

From these tables, the task distribution module 232 generates the DST allocation information 242 to indicate where the data is stored, how to partition the data, where the task is stored, how to partition the task, which DT execution units should perform which partial task on which data partitions, where and how intermediate results are to be stored, etc. If multiple tasks are being performed on the same data or different data, the task distribution module factors such information into its generation of the DST allocation information.

FIG. 30 is a diagram of a specific example of a distributed computing system performing tasks on stored data as a task flow 318. In this example, selected data 92 is data 2 and selected tasks are tasks 1, 2, and 3. Task 1 corresponds to analyzing translation of data from one language to another (e.g., human language or computer language); task 2 corresponds to finding specific words and/or phrases in the data; and task 3 corresponds to finding specific translated words and/or phrases in translated data.

In this example, task 1 includes 7 sub-tasks: task 1_1—identify non-words (non-ordered); task 1_2—identify unique words (non-ordered); task 1_3—translate (non-ordered); task 1_4—translate back (ordered after task 1_3); task 1_5—compare to ID errors (ordered after task 1-4); task 1_6—determine non-word translation errors (ordered after task 1_5 and 1_1); and task 1_7—determine correct translations (ordered after 1_5 and 1_2). The sub-task further indicates whether they are an ordered task (i.e., are dependent on the outcome of another task) or non-order (i.e., are independent of the outcome of another task). Task 2 does not include sub-tasks and task 3 includes two sub-tasks: task 3_1 translate; and task 3_2 find specific word or phrase in translated data.

In general, the three tasks collectively are selected to analyze data for translation accuracies, translation errors, translation anomalies, occurrence of specific words or phrases in the data, and occurrence of specific words or phrases on the translated data. Graphically, the data 92 is translated 306 into translated data 282; is analyzed for specific words and/or phrases 300 to produce a list of specific words and/or phrases 286; is analyzed for non-words 302 (e.g., not in a reference dictionary) to produce a list of non-words 290; and is analyzed for unique words 316 included in the data 92 (i.e., how many different words are included in the data) to produce a list of unique words 298. Each of these tasks is independent of each other and can therefore be processed in parallel if desired.

The translated data 282 is analyzed (e.g., sub-task 3_2) for specific translated words and/or phrases 304 to produce a list of specific translated words and/or phrases 288. The translated data 282 is translated back 308 (e.g., sub-task 1_4) into the language of the original data to produce re-translated data 284. These two tasks are dependent on the translate task (e.g., task 1_3) and thus must be ordered after the translation task, which may be in a pipelined ordering or a serial ordering. The re-translated data 284 is then compared 310 with the original data 92 to find words and/or phrases that did not translate (one way and/or the other) properly to produce a list of incorrectly translated words 294. As such, the comparing task (e.g., sub-task 1_5) 310 is ordered after the translation 306 and re-translation tasks 308 (e.g., sub-tasks 1_3 and 1_4).

The list of words incorrectly translated 294 is compared 312 to the list of non-words 290 to identify words that were not properly translated because the words are non-words to produce a list of errors due to non-words 292. In addition, the list of words incorrectly translated 294 is compared 314 to the list of unique words 298 to identify unique words that were properly translated to produce a list of correctly translated words 296. The comparison may also identify unique words that were not properly translated to produce a list of unique words that were not properly translated. Note that each list of words (e.g., specific words and/or phrases, non-words, unique words, translated words and/or phrases, etc.,) may include the word and/or phrase, how many times it is used, where in the data it is used, and/or any other information requested regarding a word and/or phrase.

FIG. 31 is a schematic block diagram of an example of a distributed storage and task processing network (DSTN) module storing data and task codes for the example of FIG. 30. As shown, DS encoded data 2 is stored as encoded data slices across the memory (e.g., stored in memories 88) of DST execution units 1-5; the DS encoded task code 1 (of task 1) and DS encoded task 3 are stored as encoded task slices across the memory of DST execution units 1-5; and DS encoded task code 2 (of task 2) is stored as encoded task slices across the memory of DST execution units 3-7. As indicated in the data storage information table and the task storage information table of FIG. 29, the respective data/task has DS parameters of 3/5 for their decode threshold/pillar width; hence spanning the memory of five DST execution units.

FIG. 32 is a diagram of an example of distributed storage and task (DST) allocation information 242 for the example of FIG. 30. The DST allocation information 242 includes data partitioning information 320, task execution information 322, and intermediate result information 324. The data partitioning information 320 includes the data identifier (ID), the number of partitions to split the data into, address information for each data partition, and whether the DS encoded data has to be transformed from pillar grouping to slice grouping. The task execution information 322 includes tabular information having a task identification field 326, a task ordering field 328, a data partition field ID 330, and a set of DT execution modules 332 to use for the distributed task processing per data partition. The intermediate result information 324 includes tabular information having a name ID field 334, an ID of the DST execution unit assigned to process the corresponding intermediate result 336, a scratch pad storage field 338, and an intermediate result storage field 340.

Continuing with the example of FIG. 30, where tasks 1-3 are to be distributedly performed on data 2, the data partitioning information includes the ID of data 2. In addition, the task distribution module determines whether the DS encoded data 2 is in the proper format for distributed computing (e.g., was stored as slice groupings). If not, the task distribution module indicates that the DS encoded data 2 format needs to be changed from the pillar grouping format to the slice grouping format, which will be done by the DSTN module. In addition, the task distribution module determines the number of partitions to divide the data into (e.g., 2_1 through 2_z) and addressing information for each partition.

The task distribution module generates an entry in the task execution information section for each sub-task to be performed. For example, task 1_1 (e.g., identify non-words on the data) has no task ordering (i.e., is independent of the results of other sub-tasks), is to be performed on data partitions 2_1 through 2_z by DT execution modules 1_1, 2_1, 3_1, 4_1, and 5_1. For instance, DT execution modules 1_1, 2_1, 3_1, 4_1, and 5_1 search for non-words in data partitions 2_1 through 2_z to produce task 1_1 intermediate results (R1-1, which is a list of non-words). Task 1_2 (e.g., identify unique words) has similar task execution information as task 1_1 to produce task 1_2 intermediate results (R1-2, which is the list of unique words).

Task 1_3 (e.g., translate) includes task execution information as being non-ordered (i.e., is independent), having DT execution modules 1_1, 2_1, 3_1, 4_1, and 5_1 translate data partitions 2_1 through 2_4 and having DT execution modules 1_2, 2_2, 3_2, 4_2, and 5_2 translate data partitions 2_5 through 2_z to produce task 1_3 intermediate results (R1-3, which is the translated data). In this example, the data partitions are grouped, where different sets of DT execution modules perform a distributed sub-task (or task) on each data partition group, which allows for further parallel processing.

Task 1_4 (e.g., translate back) is ordered after task 1_3 and is to be executed on task 1_3's intermediate result (e.g., R1-3_1) (e.g., the translated data). DT execution modules 1_1, 2_1, 3_1, 4_1, and 5_1 are allocated to translate back task 1_3 intermediate result partitions R1-3_1 through R1-3_4 and DT execution modules 1_2, 2_2, 6_1, 7_1, and 7_2 are allocated to translate back task 1_3 intermediate result partitions R1-3_5 through R1-3_z to produce task 1-4 intermediate results (R1-4, which is the translated back data).

Task 1_5 (e.g., compare data and translated data to identify translation errors) is ordered after task 1_4 and is to be executed on task 1_4's intermediate results (R4-1) and on the data. DT execution modules 1_1, 2_1, 3_1, 4_1, and 5_1 are allocated to compare the data partitions (2_1 through 2_z) with partitions of task 1-4 intermediate results partitions R1-4_1 through R1-4_z to produce task 1_5 intermediate results (R1-5, which is the list words translated incorrectly).

Task 1_6 (e.g., determine non-word translation errors) is ordered after tasks 1_1 and 1_5 and is to be executed on tasks 1_1's and 1_5's intermediate results (R1-1 and R1-5). DT execution modules 1_1, 2_1, 3_1, 4_1, and 5_1 are allocated to compare the partitions of task 1_1 intermediate results (R1-1_1 through R1-1_z) with partitions of task 1-5 intermediate results partitions (R1-5_1 through R1-5_z) to produce task 1_6 intermediate results (R1-6, which is the list translation errors due to non-words).

Task 1_7 (e.g., determine words correctly translated) is ordered after tasks 1_2 and 1_5 and is to be executed on tasks 1_2's and 1_5's intermediate results (R1-1 and R1-5). DT execution modules 1_2, 2_2, 3_2, 4_2, and 5_2 are allocated to compare the partitions of task 1_2 intermediate results (R1-2_1 through R1-2_z) with partitions of task 1-5 intermediate results partitions (R1-5_1 through R1-5_z) to produce task 1_7 intermediate results (R1-7, which is the list of correctly translated words).

Task 2 (e.g., find specific words and/or phrases) has no task ordering (i.e., is independent of the results of other sub-tasks), is to be performed on data partitions 2_1 through 2_z by DT execution modules 3_1, 4_1, 5_1, 6_1, and 7_1. For instance, DT execution modules 3_1, 4_1, 5_1, 6_1, and 7_1 search for specific words and/or phrases in data partitions 2_1 through 2_z to produce task 2 intermediate results (R2, which is a list of specific words and/or phrases).

Task 3_2 (e.g., find specific translated words and/or phrases) is ordered after task 1_3 (e.g., translate) is to be performed on partitions R1-3_1 through R1-3_z by DT execution modules 1_2, 2_2, 3_2, 4_2, and 5_2. For instance, DT execution modules 1_2, 2_2, 3_2, 4_2, and 5_2 search for specific translated words and/or phrases in the partitions of the translated data (R1-3_1 through R1-3_z) to produce task 3_2 intermediate results (R3-2, which is a list of specific translated words and/or phrases).

For each task, the intermediate result information indicates which DST unit is responsible for overseeing execution of the task and, if needed, processing the partial results generated by the set of allocated DT execution units. In addition, the intermediate result information indicates a scratch pad memory for the task and where the corresponding intermediate results are to be stored. For example, for intermediate result R1-1 (the intermediate result of task 1_1), DST unit 1 is responsible for overseeing execution of the task 1_1 and coordinates storage of the intermediate result as encoded intermediate result slices stored in memory of DST execution units 1-5. In general, the scratch pad is for storing non-DS encoded intermediate results and the intermediate result storage is for storing DS encoded intermediate results.

FIGS. 33-38 are schematic block diagrams of the distributed storage and task network (DSTN) module performing the example of FIG. 30. In FIG. 33, the DSTN module accesses the data 92 and partitions it into a plurality of partitions 1-z in accordance with distributed storage and task network (DST) allocation information. For each data partition, the DSTN identifies a set of its DT (distributed task) execution modules 90 to perform the task (e.g., identify non-words (i.e., not in a reference dictionary) within the data partition) in accordance with the DST allocation information. From data partition to data partition, the set of DT execution modules 90 may be the same, different, or a combination thereof (e.g., some data partitions use the same set while other data partitions use different sets).

For the first data partition, the first set of DT execution modules (e.g., 1_1, 2_1, 3_1, 4_1, and 5_1 per the DST allocation information of FIG. 32) executes task 1_1 to produce a first partial result 102 of non-words found in the first data partition. The second set of DT execution modules (e.g., 1_1, 2_1, 3_1, 4_1, and 5_1 per the DST allocation information of FIG. 32) executes task 1_1 to produce a second partial result 102 of non-words found in the second data partition. The sets of DT execution modules (as per the DST allocation information) perform task 1_1 on the data partitions until the "z" set of DT execution modules performs task 1_1 on the "zth" data partition to produce a "zth" partial result 102 of non-words found in the "zth" data partition.

As indicated in the DST allocation information of FIG. 32, DST execution unit 1 is assigned to process the first through "zth" partial results to produce the first intermediate result (R1-1), which is a list of non-words found in the data. For instance, each set of DT execution modules 90 stores its respective partial result in the scratchpad memory of DST execution unit 1 (which is identified in the DST allocation or may be determined by DST execution unit 1). A processing module of DST execution 1 is engaged to aggregate the first through "zth" partial results to produce the first intermediate result (e.g., R1_1). The processing module stores the first intermediate result as non-DS error encoded data in the scratchpad memory or in another section of memory of DST execution unit 1.

DST execution unit 1 engages its DST client module to slice grouping based DS error encode the first intermediate result (e.g., the list of non-words). To begin the encoding, the DST client module determines whether the list of non-words is of a sufficient size to partition (e.g., greater than a Terra-Byte). If yes, it partitions the first intermediate result (R1-1) into a plurality of partitions (e.g., R1-1_1 through R1-1_m). If the first intermediate result is not of sufficient size to partition, it is not partitioned.

For each partition of the first intermediate result, or for the first intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5).

In FIG. 34, the DSTN module is performing task 1_2 (e.g., find unique words) on the data 92. To begin, the DSTN module accesses the data 92 and partitions it into a plurality of partitions 1-z in accordance with the DST allocation information or it may use the data partitions of task 1_1 if the partitioning is the same. For each data partition, the DSTN identifies a set of its DT execution modules to perform task 1_2 in accordance with the DST allocation information. From data partition to data partition, the set of DT execution modules may be the same, different, or a combination thereof. For the data partitions, the allocated set of DT execution modules executes task 1_2 to produce a partial results (e.g., $1^{st}$ through "zth") of unique words found in the data partitions.

As indicated in the DST allocation information of FIG. 32, DST execution unit 1 is assigned to process the first through "zth" partial results 102 of task 1_2 to produce the second intermediate result (R1-2), which is a list of unique words found in the data 92. The processing module of DST execution 1 is engaged to aggregate the first through "zth" partial results of unique words to produce the second intermediate result. The processing module stores the second intermediate result as non-DS error encoded data in the scratchpad memory or in another section of memory of DST execution unit 1.

DST execution unit 1 engages its DST client module to slice grouping based DS error encode the second intermediate result (e.g., the list of non-words). To begin the encoding, the DST client module determines whether the list of unique words is of a sufficient size to partition (e.g., greater than a Terra-Byte). If yes, it partitions the second intermediate result (R1-2) into a plurality of partitions (e.g., R1-2_1 through R1-2_m). If the second intermediate result is not of sufficient size to partition, it is not partitioned.

For each partition of the second intermediate result, or for the second intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5).

In FIG. 35, the DSTN module is performing task 1_3 (e.g., translate) on the data 92. To begin, the DSTN module accesses the data 92 and partitions it into a plurality of partitions 1-z in accordance with the DST allocation information or it may use the data partitions of task 1_1 if the partitioning is the same. For each data partition, the DSTN identifies a set of its DT execution modules to perform task 1_3 in accordance with the DST allocation information (e.g., DT execution modules 1_1, 2_1, 3_1, 4_1, and 5_1 translate data partitions 2_1 through 2_4 and DT execution modules 1_2, 2_2, 3_2, 4_2, and 5_2 translate data partitions 2_5 through 2_z). For the data partitions, the allocated set of DT execution modules 90 executes task 1_3 to produce partial results 102 (e.g., $1^{st}$ through "zth") of translated data.

As indicated in the DST allocation information of FIG. 32, DST execution unit 2 is assigned to process the first through "zth" partial results of task 1_3 to produce the third intermediate result (R1-3), which is translated data. The processing module of DST execution 2 is engaged to aggregate the first through "zth" partial results of translated data to produce the third intermediate result. The processing module stores the third intermediate result as non-DS error encoded data in the scratchpad memory or in another section of memory of DST execution unit 2.

DST execution unit 2 engages its DST client module to slice grouping based DS error encode the third intermediate result (e.g., translated data). To begin the encoding, the DST client module partitions the third intermediate result (R1-3) into a plurality of partitions (e.g., R1-3_1 through R1-3_y). For each partition of the third intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 2-6 per the DST allocation information).

As further shown in FIG. 35, the DSTN module is performing task 1_4 (e.g., retranslate) on the translated data of the third intermediate result. To begin, the DSTN module accesses the translated data (from the scratchpad memory or from the intermediate result memory and decodes it) and partitions it into a plurality of partitions in accordance with the DST allocation information. For each partition of the third intermediate result, the DSTN identifies a set of its DT execution modules 90 to perform task 1_4 in accordance with the DST allocation information (e.g., DT execution modules 1_1, 2_1, 3_1, 4_1, and 5_1 are allocated to translate back partitions R1-3_1 through R1-3_4 and DT execution modules 1_2, 2_2, 6_1, 7_1, and 7_2 are allocated to translate back partitions R1-3_5 through R1-3_z). For the partitions, the allocated set of DT execution modules executes task 1_4 to produce partial results 102 (e.g., $1^{st}$ through "zth") of re-translated data.

As indicated in the DST allocation information of FIG. 32, DST execution unit 3 is assigned to process the first through "zth" partial results of task 1_4 to produce the fourth intermediate result (R1-4), which is retranslated data. The processing module of DST execution 3 is engaged to aggregate the first through "zth" partial results of retranslated data to produce the fourth intermediate result. The processing module stores the fourth intermediate result as non-DS error encoded data in the scratchpad memory or in another section of memory of DST execution unit 3.

DST execution unit 3 engages its DST client module to slice grouping based DS error encode the fourth intermediate result (e.g., retranslated data). To begin the encoding, the DST client module partitions the fourth intermediate result (R1-4) into a plurality of partitions (e.g., R1-4_1 through R1-4_z). For each partition of the fourth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 3-7 per the DST allocation information).

Figure 36:
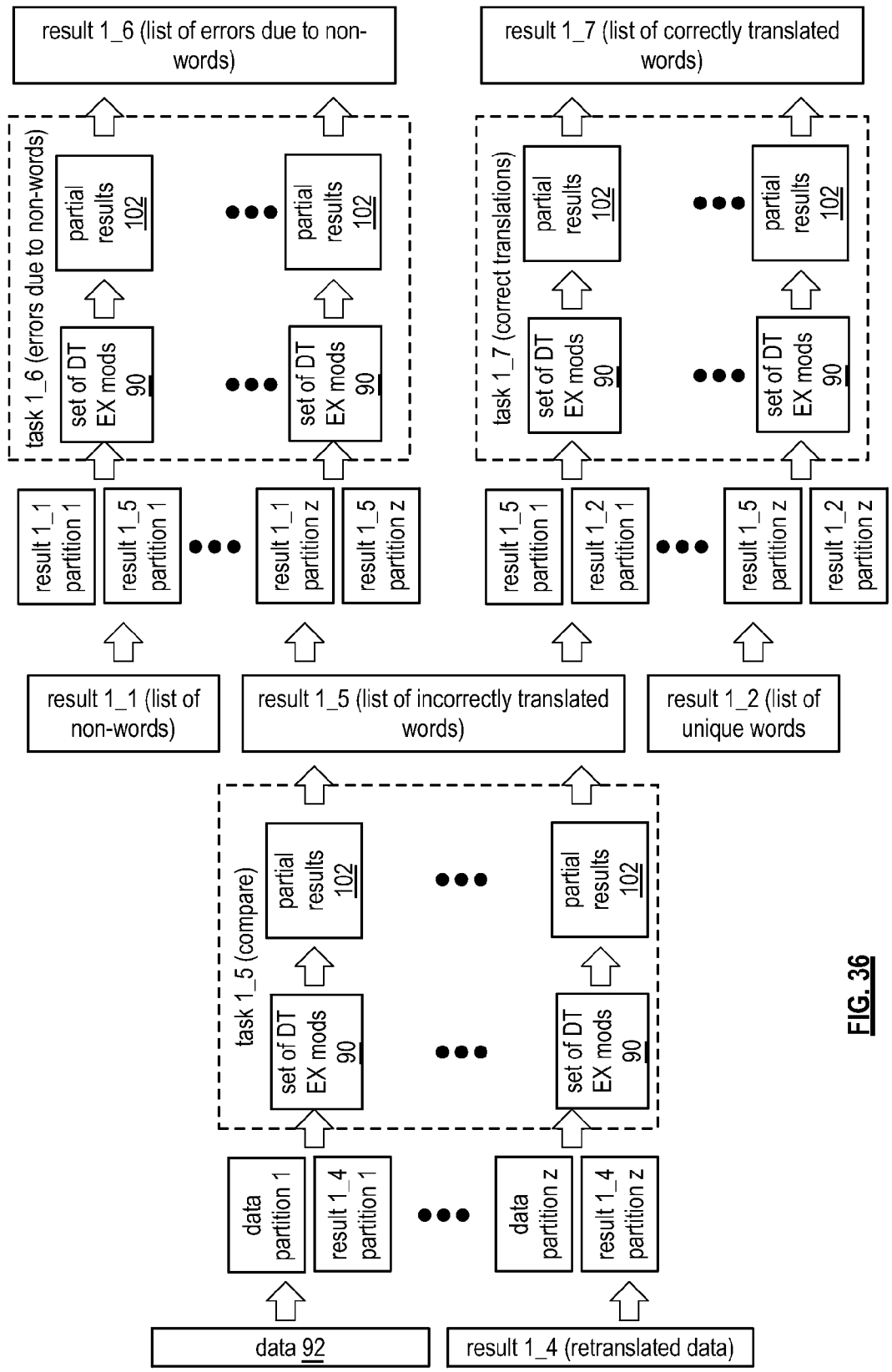

In FIG. 36, a distributed storage and task network (DSTN) module is performing task 1_5 (e.g., compare) on data 92 and retranslated data of FIG. 35. To begin, the DSTN module accesses the data 92 and partitions it into a plurality of partitions in accordance with the DST allocation information or it may use the data partitions of task 1_1 if the partitioning is the same. The DSTN module also accesses the retranslated data from the scratchpad memory, or from the intermediate result memory and decodes it, and partitions it into a plurality of partitions in accordance with the DST allocation information. The number of partitions of the retranslated data corresponds to the number of partitions of the data.

For each pair of partitions (e.g., data partition 1 and retranslated data partition 1), the DSTN identifies a set of its DT execution modules 90 to perform task 1_5 in accordance with the DST allocation information (e.g., DT execution modules 1_1, 2_1, 3_1, 4_1, and 5_1). For each pair of partitions, the allocated set of DT execution modules executes task 1_5 to produce partial results 102 (e.g., $1^{st}$ through "zth") of a list of incorrectly translated words and/or phrases.

As indicated in the DST allocation information of FIG. 32, DST execution unit 1 is assigned to process the first through "zth" partial results of task 1_5 to produce the fifth intermediate result (R1-5), which is the list of incorrectly translated words and/or phrases. In particular, the processing module of DST execution 1 is engaged to aggregate the first through "zth" partial results of the list of incorrectly translated words and/or phrases to produce the fifth intermediate result. The processing module stores the fifth intermediate result as non-DS error encoded data in the scratchpad memory or in another section of memory of DST execution unit 1.

DST execution unit 1 engages its DST client module to slice grouping based DS error encode the fifth intermediate result. To begin the encoding, the DST client module partitions the fifth intermediate result (R1-5) into a plurality of partitions (e.g., R1-5_1 through R1-5_z). For each partition of the fifth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5 per the DST allocation information).

As is further shown in FIG. 36, the DSTN module is performing task 1_6 (e.g., translation errors due to non-words) on the list of incorrectly translated words and/or phrases (e.g., the fifth intermediate result R1-5) and the list of non-words (e.g., the first intermediate result R1-1). To begin, the DSTN module accesses the lists and partitions them into a corresponding number of partitions.

For each pair of partitions (e.g., partition R1-1_1 and partition R1-5_1), the DSTN identifies a set of its DT execution modules 90 to perform task 1_6 in accordance with the DST allocation information (e.g., DT execution modules 1_1, 2_1, 3_1, 4_1, and 5_1). For each pair of partitions, the allocated set of DT execution modules executes task 1_6 to produce partial results 102 (e.g., $1^{st}$ through "zth") of a list of incorrectly translated words and/or phrases due to non-words.

As indicated in the DST allocation information of FIG. 32, DST execution unit 2 is assigned to process the first through "zth" partial results of task 1_6 to produce the sixth intermediate result (R1-6), which is the list of incorrectly translated words and/or phrases due to non-words. In particular, the processing module of DST execution 2 is engaged to aggregate the first through "zth" partial results of the list of incorrectly translated words and/or phrases due to non-words to produce the sixth intermediate result. The processing module stores the sixth intermediate result as non-DS error encoded data in the scratchpad memory or in another section of memory of DST execution unit 2.

DST execution unit 2 engages its DST client module to slice grouping based DS error encode the sixth intermediate result. To begin the encoding, the DST client module partitions the sixth intermediate result (R1-6) into a plurality of partitions (e.g., R1-6_1 through R1-6_z). For each partition of the sixth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 2-6 per the DST allocation information).

As is still further shown in FIG. 36, the DSTN module is performing task 1_7 (e.g., correctly translated words and/or phrases) on the list of incorrectly translated words and/or phrases (e.g., the fifth intermediate result R1-5) and the list of unique words (e.g., the second intermediate result R1-2). To begin, the DSTN module accesses the lists and partitions them into a corresponding number of partitions.

For each pair of partitions (e.g., partition R1-2_1 and partition R1-5_1), the DSTN identifies a set of its DT execution modules 90 to perform task 1_7 in accordance with the DST allocation information (e.g., DT execution modules 1_2, 2_2, 3_2, 4_2, and 5_2). For each pair of partitions, the allocated set of DT execution modules executes task 1_7 to produce partial results 102 (e.g., $1^{st}$ through "zth") of a list of correctly translated words and/or phrases.

As indicated in the DST allocation information of FIG. 32, DST execution unit 3 is assigned to process the first through "zth" partial results of task 1_7 to produce the seventh intermediate result (R1-7), which is the list of correctly translated words and/or phrases. In particular, the processing module of DST execution 3 is engaged to aggregate the first through "zth" partial results of the list of correctly translated words and/or phrases to produce the seventh intermediate result. The processing module stores the seventh intermediate result as non-DS error encoded data in the scratchpad memory or in another section of memory of DST execution unit 3.

DST execution unit 3 engages its DST client module to slice grouping based DS error encode the seventh intermediate result. To begin the encoding, the DST client module partitions the seventh intermediate result (R1-7) into a plurality of partitions (e.g., R1-7_1 through R1-7_z). For each partition of the seventh intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 3-7 per the DST allocation information).

In FIG. 37, the distributed storage and task network (DSTN) module is performing task 2 (e.g., find specific words and/or phrases) on the data 92. To begin, the DSTN module accesses the data and partitions it into a plurality of partitions 1-z in accordance with the DST allocation information or it may use the data partitions of task 1_1 if the partitioning is the same. For each data partition, the DSTN identifies a set of its DT execution modules 90 to perform task 2 in accordance with the DST allocation information. From data partition to data partition, the set of DT execution modules may be the same, different, or a combination thereof. For the data partitions, the allocated set of DT execution modules executes task 2 to produce partial results 102 (e.g., $1^{st}$ through "zth") of specific words and/or phrases found in the data partitions.

As indicated in the DST allocation information of FIG. 32, DST execution unit 7 is assigned to process the first through "zth" partial results of task 2 to produce task 2 intermediate result (R2), which is a list of specific words and/or phrases found in the data. The processing module of DST execution 7 is engaged to aggregate the first through "zth" partial results of specific words and/or phrases to produce the task 2 intermediate result. The processing module stores the task 2 intermediate result as non-DS error encoded data in the scratchpad memory or in another section of memory of DST execution unit 7.

DST execution unit 7 engages its DST client module to slice grouping based DS error encode the task 2 intermediate result. To begin the encoding, the DST client module determines whether the list of specific words and/or phrases is of a sufficient size to partition (e.g., greater than a Terra-Byte). If yes, it partitions the task 2 intermediate result (R2) into a plurality of partitions (e.g., R2_1 through R2_m). If the task 2 intermediate result is not of sufficient size to partition, it is not partitioned.

For each partition of the task 2 intermediate result, or for the task 2 intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-4, and 7).

In FIG. 38, the distributed storage and task network (DSTN) module is performing task 3 (e.g., find specific translated words and/or phrases) on the translated data (R1-3). To begin, the DSTN module accesses the translated data (from the scratchpad memory or from the intermediate result memory and decodes it) and partitions it into a plurality of partitions in accordance with the DST allocation information. For each partition, the DSTN identifies a set of its DT execution modules to perform task 3 in accordance with the DST allocation information. From partition to partition, the set of DT execution modules may be the same, different, or a combination thereof. For the partitions, the allocated set of DT execution modules 90 executes task 3 to produce partial results 102 (e.g., $1^{st}$ through "zth") of specific translated words and/or phrases found in the data partitions.

As indicated in the DST allocation information of FIG. 32, DST execution unit 5 is assigned to process the first through "zth" partial results of task 3 to produce task 3 intermediate result (R3), which is a list of specific translated words and/or phrases found in the translated data. In particular, the processing module of DST execution 5 is engaged to aggregate the first through "zth" partial results of specific translated words and/or phrases to produce the task 3 intermediate result. The processing module stores the task 3 intermediate result as non-DS error encoded data in the scratchpad memory or in another section of memory of DST execution unit 7.

DST execution unit 5 engages its DST client module to slice grouping based DS error encode the task 3 intermediate result. To begin the encoding, the DST client module determines whether the list of specific translated words and/or phrases is of a sufficient size to partition (e.g., greater than a Terra-Byte). If yes, it partitions the task 3 intermediate result (R3) into a plurality of partitions (e.g., R3_1 through R3_m). If the task 3 intermediate result is not of sufficient size to partition, it is not partitioned.

For each partition of the task 3 intermediate result, or for the task 3 intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-4, 5, and 7).

FIG. 39 is a diagram of an example of combining result information into final results 104 for the example of FIG. 30. In this example, the result information includes the list of specific words and/or phrases found in the data (task 2 intermediate result), the list of specific translated words and/or phrases found in the data (task 3 intermediate result), the list of non-words found in the data (task 1 first intermediate result R1-1), the list of unique words found in the data (task 1 second intermediate result R1-2), the list of translation errors due to non-words (task 1 sixth intermediate result R1-6), and the list of correctly translated words and/or phrases (task 1 seventh intermediate result R1-7). The task distribution module provides the result information to the requesting DST client module as the results 104.

FIG. 40A is a schematic block diagram of another embodiment of a distributed storage and task (DST) execution unit 350 that includes a controller 352 and a memory 354. The memory 354 includes one or more memory devices 356 and one or more alternate memory devices 358. The controller 352 functions to receive slice access requests 360 with regards to slices 364 stored in at least one of the memory devices 356 and the alternate memory devices 358. The controller 352 further functions to generate slice access responses 362 with regards to the slice access requests 360.

A slice access request 360 of the slice access requests 360 may include one or more of a slice name, a request type, and a slice 364 of slices 364. A slice access response 362 of the slice access responses 362 may include one or more of another slice name, a response type, and another slice 364 of the slices 364. Each of the one or more memory devices 356 may be mapped to a range of slice names such that corresponding slices 364 associated with the range of slice names are mapped to the memory device 356 and are stored within the memory device 356.

From time to time at least one memory device 356 of the one or more memory devices 356 may be unavailable (e.g., failed, too busy) producing an unavailable memory device 356. The alternate memory device 358 may be utilized to store a slice mapped to the unavailable memory device 356 when the unavailable memory device 356 is unavailable. For example, the controller 352 receives a slice access request 360 that includes slice name 1AB6 and a slice 364. The controller 352 identifies memory device 3 as mapped to the slice 364 based on the slice name 1AB6 utilizing a slice name to memory device identifier (ID) table lookup. When memory device 3 is unavailable, the controller 352 selects one alternate memory device 358 of the alternate memory devices 358 and stores the slice in selected alternate memory device 358.

A method of operation of the DST execution unit 350 is discussed in greater detail with reference to FIG. 40B.

FIG. 40B is a flowchart illustrating an example of storing slices. The method begins at step 366 where, for a write slice request, a processing module (e.g., of a distributed storage and task (DST) execution unit) determines whether a corresponding memory device is available. The determining includes identifying the memory device based on the write slice request (e.g., a slice name to memory device identifier (ID) table lookup) and determining whether the identified memory device is available (e.g., accessing status table for availability status, initiating a query). The method branches to step 370 when the corresponding memory device is not available. The method continues to step 368 when the corresponding memory device is available. The method continues at step 368 where the processing module stores a slice of the write slice request in the memory device.

The method continues at step 370 where the processing module selects an alternate memory device when the corresponding memory device is unavailable. The selecting includes choosing an alternate memory device of the DST execution unit that is available and has favorable storage attributes (e.g., enough available storage space). The method continues at step 372 where the processing module stores the slice in the alternate memory device. The method continues at step 374 where the processing module updates a slice location table to associate a slice name of the slice with an identifier of the alternate memory device.

When the memory device is available, the method continues at step 376 where the processing module migrates one or more slices from the alternate memory device to the memory device, where the one or more slices includes the slice as migrated slices. The method continues at step 378 where the processing module updates the slice location table to associate the migrated slices with an identifier of the memory device and to disassociate the migrated slices with the identifier of the alternate memory device.

FIG. 41A is a schematic block diagram of another embodiment of a distributed computing system that includes a distributed storage and task (DST) client module 34, a distributed storage and task network (DSTN) module 22, and a DSTN managing unit 18. Alternatively, a dispersed storage processing module may substitute for the DST client module 34, a dispersed storage network managing unit may substitute for the DSTN managing unit, and a dispersed storage network memory may substitute for the DSTN module 22. The DSTN module 22 includes a plurality of DST execution units 36. The DST client module 34 functions to send slice access requests 380 to the DSTN module 22 to gain access to slices stored one or more DST execution units 36. The DSTN module 22 generates slice access responses 382 to send to the DST client module 34 in response to one or more slice access requests 380.

The DSTN managing unit 18 is operable to generate a slice access restriction indicator 386 with regards to access of one or more slices stored in the DSTN module 22. The slice access restricted indicator 386 indicates restricted access to one or more slices. The restricted access includes one or more of at least one slice name associated with the one or more slices, a time restriction, a requesting unit identifier (ID) restriction, and an access type restriction. The access type restriction may include one or more of a client access restriction and a slice rebuilding restriction. A restriction may indicate whether access is allowed or disallowed. The DSTN managing unit 18 generates the slice access restriction based on one or more of an indication of nonpayment for utilization of storage services, an account freeze indicator, a security breach indicator, an improper access indicator, and an over utilization of storage resources indicator. For example, a slice access restriction indicator 386 may indicate that reading a slice associated with slice name B457 is not allowed by a client requesting entity and is allowed for a slice rebuilding access type. The DSTN managing unit 18 sends the slice access restriction indicator 386 to the DSTN module 22 to enable utilization of the slice access restriction indicator 386 by one or more of the DST execution units 36 upon receiving each of the slice access request 380.

In an example of operation, a first DST execution unit 36 receives the slice access restriction indicator 386 from the DSTN managing unit 18 that restricts access to the slice associated with slice name B457 such that client access is disallowed and rebuilding access is allowed. Subsequent to receiving the slice access restriction indicator 386, the first DST execution unit 36 receives a slice access request 380 from the DST client module 34 for the slice associated with slice name B457. The first DST execution unit 36 does not allow access to the slice by the DST client module 34 in accordance with the slice access restriction indicator 386. Alternatively, or in addition to, the first DST execution unit 36 generates a corresponding slice access response 382 indicating that access is denied. In another example of operation, the first DST execution unit 36 receives a rebuilding slice access request 384 from a second DST execution unit 36 for the slice associated with slice name B457. The first DST execution unit 36 allows access to the slice by processing the rebuilding slice access request 384 in accordance with the slice access restriction indicator 386. For instance, the first DST execution unit 36 retrieves the slice from a memory of the first DST execution unit 36 and sends the slice to the second DST execution unit 36. The method of operation of the system is described in greater detail with reference to FIG. 41B.

FIG. 41B is a flowchart illustrating an example of accessing a stored slice. The method begins at step 388 where a processing module (e.g., of a distributed storage and task (DST) execution unit) receives a slice access request. The slice access request includes one more of an access type indicator, a requesting entity identifier (ID), a rebuilding indicator, a client indicator, and data. The method continues at step 390 where the processing module determines whether the slice access request is associated with an access restriction. The determining includes receiving an access restriction indicator, comparing a slice name of the indicator with a slice name of the slice access request, and comparing the slice access request with restrictions of indicator. For example, the processing module determines that the slice access request is associated with the access restriction when the slice name of the indicator is substantially the same as the slice name of the slice access request. The method branches to step 394 when the slice access request is associated with the access restriction. The method continues to step 392 when the slice access request is not associated with the access restriction. The method continues at step 392 where the processing module executes the access request (e.g., process the access request).

The method continues at step 394 where the processing module determines whether the slice access request is associated with rebuilding when the slice access request is associated with the access restriction. The determining includes identifying a requesting entity as at least one of a client/user device, another DST execution unit, and a rebuilding module. The determining may be based on one or more of the access type indicator, the requesting entity ID, the rebuilding indicator, and the client indicator. For example, the processing module determines that the slice access request is associated with rebuilding when the requesting entity ID is associated with another DST execution unit. As another example, the processing module determines that the slice access request is not associated with rebuilding when the requesting entity ID is associated with a user device and the client indicator is true. The method branches to step 398 when the access request is associated with rebuilding. The method continues to step 396 when the slice access request is not associated with rebuilding. The method continues at step 396 where the processing module sends an error message. The sending includes generating a message to indicate an access restriction violation and outputting the message (e.g., to a requesting entity, to a DST managing unit). The method continues at step 398 where the processing module executes the rebuilding access request when the access request is associated with rebuilding. For example, the processing module retrieves a slice associated with the rebuilding access request and outputs the slice to the requesting entity (e.g., another DST execution unit associated with rebuilding).

FIG. 42 is a flowchart illustrating an example of establishing a billing rate. The method begins at step 400 where a processing module (e.g., a distributed storage and task (DST) client module) receives a rebuild slice request that includes a slice name corresponding to a slice error. The slice error includes at least one of a missing slice error and a slice error associated with an unfavorable integrity value (e.g., corrupted slice, tampered slice). The method continues at step 402 where the processing module identifies a failure root cause associated with the slice error. The identifying may be based on one or more of an error message, an event log, a query, and a test. The method continues at step 404 where the processing module determines whether the root cause is user-centric. The user-centric root causes includes at least one of a slice not written, a slice that committed, and old slice revision was not deleted, and an integrity value mismatch. Non-user-centric root causes includes at least one of a memory device failure, a DST execution unit failure, a network outage, an un-trusted DST execution unit, and a maliciously corrupted slice. The method branches to step 408 when the root cause is not user-centric. The method continues to step 406 when the root cause is user-centric.

The method continues at step 406 where the processing module establishes a user pricing level when the root cause is user-centric. The establishing includes at least one of a lookup, a query, and receiving. For example, the processing module accesses a registry to extract the user pricing level based on a vault identifier (ID) associated with the slice of the slice error. The method branches to step 410. The method continues at step 408 where the processing module establishes a non-user pricing level when the root cause is not user-centric. The establishing includes at least one of a lookup, a query, and receiving. For example, the processing module accesses a registry to extract the non-user pricing level for the system. The method continues to step 410.

The method continues at step 410 where the processing module facilitates rebuilding the slice of the slice error. The facilitating includes at least one of directly rebuilding the slice and outputting a rebuild slice request that includes the slice name of the slice error. The method continues at step 412 where the processing module generates billing information for the rebuilding based on one of the user pricing level and the non-user pricing level. Alternatively, or in addition to, the generating of the billing information may be based on a magnitude of resources utilized to rebuild the slice of the slice error.

FIG. 43A is a schematic block diagram of another embodiment of a distributed storage and task (DST) execution unit 36 that includes a controller 414 and a memory 416. The memory 416 may be implemented as one more of random access memory, dynamic random access memory, a magnetic disk drive, and an optical disk drive. The memory 416 may be organized into a plurality of N contiguous memory blocks 1-N. For example, N=1000 memory blocks and each block is 510 bytes. The controller 414 receives a data identifier (ID) 418 for data 420 to store in the memory 416. The controller 414 encodes the data 420 using a dispersed storage error coding function to produce a set of encoded data slices. The controller 414 identifies a set of storage locations within the memory 416 for storing the set of encoded data slices based on one or more of the data ID 418 and available storage locations within the memory 416. The identifying may be accomplished in a variety of ways. In a first way, the set of storage locations are contiguous within an available portion of the memory 416. In a second way, the sets of storage locations are equidistant from each other across the memory 416. Next, the controller stores the set of encoded data slices at the set of storage locations within the memory 416. A method to store the data 420 in the memory 416 is discussed in greater detail with reference to FIG. 43B.

FIG. 43B is a flowchart illustrating an example of storing data. The method begins at step 422 where a processing module (e.g., of a distributed storage and task (DST) execution unit) receives a write request to store a data block of data. The write request includes one of more of a virtual memory identifier (ID), an offset, the data block, a data segment, a data slice, and a data object. A size of the data block may be selected to be substantially the same as a size of memory blocks of a memory (e.g., 510 bytes). Two or more data blocks may be generated when a size of the data is greater than a size of the data block.

The method continues at step 424 where the processing module obtains encoding parameters in accordance with a virtual memory approach. The obtaining includes at least one of retrieving, receiving, and determining. For example, the processing module retrieves the encoding parameters from a registry associated with the DST execution unit. The encoding parameters includes one or more of a pillar width and a decode threshold. The method continues at step 426 where the processing module encodes the data block using a dispersed storage error coding function in accordance with the encoding parameters to produce a set of encoded data slices. For example, the processing module encodes the data block to produce 20 slices that are 51 bytes each when the data block is 510 bytes, the decode threshold is 10, and the pillar width is 20.

The method continues at step 428 where the processing module identifies one or more physical memory devices for storage of the set of encoded data slices. The identifying may be based on one or more of a lookup and the encoding parameters. For example, the processing module identifies 20 storage locations equidistant (e.g., 20 memory blocks every 50th memory block) across 1000 memory blocks of a memory that includes the one or more physical memory devices. Next, the processing module identifies the one or more physical memory devices based on identifiers of the 20 memory blocks.

The method continues at step 430 where the processing module maps an offset to the set of storage locations within the identified one or more physical memory devices in accordance with the encoding parameters to produce a mapping. The offset includes a common offset into each of the 20 memory blocks based on one of more of a received offset, a lookup, a next available offset within the 20 memory blocks, and a message. For example, there are 10 offsets within each block when slice sizes are 51 bytes and the block size is 510 bytes. For instance, a virtual memory ID 1 starts with offset zero in memory blocks 1, 51, 101, etc. As another instance, a virtual memory ID 2 starts with offset 1 in the memory blocks 1, 51, 101, etc. As yet another instance, a virtual memory ID 11 starts with offset zero in memory blocks 2, 52, 102, etc. The method continues at step 432 where the processing module facilitates storage of the set of encoded data slices at the set of storage locations in accordance with the mapping. For example, the processing module stores the set of 20 51 byte slices at a common offset within each of the 20 memory blocks which are each spaced apart by 50 memory blocks.

FIG. 44A is a schematic block diagram of an embodiment of a dispersed storage network (DSN) system that includes a computing device 434 and a dispersed storage network (DSN) 436. The DSN 436 includes a plurality of storage nodes 440. Alternatively, the DSN 436 may be implemented utilizing one or more of a distributed storage and task network (DSTN), a DSTN module, a dispersed storage network memory, and a plurality of dispersed storage (DS) units. Each storage node 440 may be implemented utilizing at least one of a DS unit, a storage server, a storage unit, a storage module, a memory device, a memory, a distributed storage and task (DST) execution unit, a user device, a DST processing unit, and a DST processing module. The computing device 434 may be implemented utilizing at least one of a server, a storage unit, a storage node of the plurality of storage nodes 440, a DSTN managing unit, a DSN managing unit, a DS unit, a storage server, a storage module, a DS processing unit, a DST execution unit, a user device, a DST processing unit, a storage integrity processing unit, a DSTN storage integrity processing unit, and a DST processing module. For example, the computing device 434 is implemented as a first storage node of the plurality of storage nodes 440. The computing device 434 includes a dispersed storage (DS) module 442. The DS module 442 includes an error detection module 444, a traits module 446, a priority error detection module 448, and a rebuilding module 450.

The system functions to detect a storage error of an encoded data slice, identify encoded data slices having at least one storage trait in common with the encoded data slice to produce identified encoded data slices 458, prioritize storage error detection analysis of the identified encoded data slices 458, and rebuild encoded data slices associated with storage errors. With regards to the detecting of the storage error of the encoded data slice, the error detection module 444 detects, in accordance with a rebuilding process, the storage error of the encoded data slice stored in a storage node 440 of the DSN 436 and identifies the encoded data slice for rebuilding (e.g., provides an identity (ID) of the encoded data slice for rebuilding 452).

The detecting and identifying includes the error detection module 444 performing a series of detection steps in accordance with the rebuilding process. In a first detection step, the error detection module 444 scans addresses of the DSN 436. The scanning includes identifying the addresses of the DSN 436 based on one or more of a scanning address range assignment, a request, and receiving an error message. In a second detection step, the error detection module 444 identifies the storage node 440 in accordance with the scanning of the addresses of the DSN 436. The identifying includes at least one of accessing a DSN address-to-storage node identity table, initiating a query, receiving a response, and extracting an identity of an error message. In a third detection step, the error detection module 444 sends a rebuilding feedback request 454 to the storage node 440. For example, the error detection module 444 sends a list slice request as the rebuilding feedback request 454. As another example, the error detection module 444 sends a list slice digest request as the rebuilding feedback request 454.

In a fourth detection step of the series of detection steps in accordance with the rebuilding process, the error detection module 444 receives a rebuilding feedback response 456 from the storage unit 440, where the rebuilding feedback response 456 includes information that identifies encoded data slices stored in the storage node 440. For example, rebuilding feedback response 456 includes slice names of encoded data slices stored in the storage node 440 that are not associated with the storage error and slice names of encoded data slices stored in the storage node associated with the storage error (e.g., failing an encoded data slice integrity test). In a fifth detection step, the error detection module 444 tests validity of the encoded data slices identified by the storage node 440 based on the rebuilding feedback response 456 and comparative encoded data slice information (e.g., rebuilding feedback responses 456 from other storage nodes 440). For example, the error detection module 444 compares a slice name list from the storage node 440 to other slice name lists from other storage nodes 440, where a set of storage nodes stores a set of encoded data slices that includes the encoded data slice and the set of storage nodes includes the storage node and the other storage nodes. When the comparative encoded data slice information for the encoded data slice indicates a validity issue (e.g., a missing slice, a storage error associated with a corrupted slice), in a sixth detection step, the error detection module 444 identifies the encoded data slice as having the storage error to produce the ID of the encoded data slice for rebuilding 452.

With regards to the identifying the encoded data slices having the at least one storage trait in common with the encoded data slice to produce the identified encoded data slices, the traits module 446 identifies one or more storage traits associated with the encoded data slice and identifies encoded data slices having at least one storage trait in common with the one or more storage traits of the encoded data slice to produce identified encoded data slices 458. A storage trait of the storage traits includes one or more of a write timeframe, a writing entity identifier, a data owner identifier, a vault identifier, previous rebuilding operations, a common network connection (e.g., end to end connection), a common network path (e.g., portion of end to end path in common), and an address being in an address range. The traits module 446 identifies the encoded data slices having the at least one storage trait in common with the one or more storage traits of the encoded data slice by identifying first priority encoded data slices of the identified encoded data slices 458 that have more than one storage trait in common with the one or more storage traits of the encoded data slice and identifying second priority encoded data slices of the identified encoded data slices 458 that have one storage trait in common with the one or more storage traits of the encoded data slice, where the first priority encoded data slices have a higher priority than the second priority encoded data slices.

With regards to the prioritizing the storage error detection analysis of the identified encoded data slices 458, the priority error detection module 448 prioritizes, within the rebuilding process, storage error detection analysis of the identified encoded data slices 458 over other encoded data slices stored in the DSN 436 and when a storage error is detected for one of the identified encoded data slices 458, identifies the one of the identified encoded data slices for rebuilding to produce and ID of the one of the identified encoded data slices for rebuilding 460. The priority error detection module 448 prioritizes the storage error detection analysis of the identified encoded data slices 458 by a series of prioritizing steps. A first prioritizing step includes the priority error detection module 448 pausing scanning addresses of the DSN 436. A second prioritizing step includes the priority error detection module 448 identifying addresses of the encoded data slices having at least one storage trait in common with the one or more storage traits of the encoded data slice. A third prioritizing step includes the priority error detection module 448 sending rebuilding feedback requests 454 to storage nodes 440 of the DSN 436 storing the encoded data slices based on the addresses of the encoded data slices. A fourth prioritizing steps includes the priority error detection module 448 receiving rebuilding feedback responses 456 from the storage nodes 440 of the DSN 436. Alternatively, or in addition to, the error detection module 444 performs the series of prioritizing steps.

With regards to the rebuilding the encoded data slices associated with the storage errors, the rebuilding module 450 facilitates rebuilding of the encoded data slice and facilitates rebuilding of the one of the identified encoded data slices. The facilitating, by the rebuilding module 450, includes one or more of sending identifiers of the encoded data slice and the one of the identified encoded data slices to a rebuilding function and directly rebuilding. The directly rebuilding includes retrieving at least a decode threshold number of encoded data slices 462 of a set of encoded data slices that includes a subject encoded data slice for rebuilding (e.g., the subject encoded data slice for rebuilding includes one of the encoded data slice and the one of the identified encoded data slices), decoding the decode threshold number of encoded data slices to reproduce a data segment, re-encoding the data segment to reproduce the subject encoded data slice for rebuilding, and sending the subject encoded data slice for rebuilding (e.g., rebuilt slice 464) to a corresponding storage node 440 for storage therein.

The system may further function to identify further storage errors. When identifying further storage errors, the traits module 446 performs a series of further trait steps. When the storage error is detected for the one of the identified encoded data slices, in a first further trait step, the traits module 446 determines storage traits for the one of the identified encoded data slices. In a second further trait step, the traits module 446 generates updated storage traits based on the storage traits for the one of the identified encoded data slices and the one or more storage traits of the encoded data slice. In a third further trait step, the traits module 446 adjusts the identifying the encoded data slices based on the updated storage traits to produce updated identified encoded data slices (e.g., to expand or contract identify encoded data slices). When identifying further storage errors, the priority error detection module 448 prioritizes, within the rebuilding process, storage error detection analysis of the updated identified encoded data slices.

FIG. 44B is a flowchart illustrating an example of detecting storage errors. The method begins at step 470 where a processing module of one or more computing devices (e.g., a server of a dispersed storage network (DSN)) detects, in accordance with a rebuilding process, a storage error of an encoded data slice stored in a storage node of a dispersed storage network (DSN). The rebuilding process includes a series of detecting steps. A first step includes scanning addresses of the DSN. A second step includes identifying the storage node in accordance with the scanning of the addresses of the DSN. A third step includes sending a rebuilding feedback request to the storage node. A fourth step includes receiving a rebuilding feedback response from the storage unit, where the rebuilding feedback response includes information that identifies encoded data slices stored in the storage node. A fifth step includes testing validity of the encoded data slices identified by the storage node based on the rebuilding feedback response and comparative encoded data slice information (e.g., other slices in a set of slices having common DSN addresses including a common source name, a common generation, and a common revision number). When the comparative encoded data slice information for the encoded data slice indicates a validity issue, a sixth step includes identifying the encoded data slice as having the storage error.

The method continues at step 472 where the processing module identifies the encoded data slice for rebuilding. The method continues at step 474 where the processing module identifies one or more storage traits associated with the encoded data slice. The method continues at step 476 where the processing module identifies encoded data slices having at least one storage trait in common with the one or more storage traits of the encoded data slice to produce identified encoded data slices. The identifying the encoded data slices having at the least one storage trait in common with the one or more storage traits of the encoded data slice includes identifying first priority encoded data slices of the identified encoded data slices that have more than one storage trait in common with the one or more storage traits of the encoded data slice and identifying second priority encoded data slices of the identified encoded data slices that have one storage trait in common with the one or more storage traits of the encoded data slice, wherein the first priority encoded data slices have a higher priority than the second priority encoded data slices.

The method continues at step 478 where the processing module prioritizes, within the rebuilding process, storage error detection analysis of the identified encoded data slices over other encoded data slices stored in the DSN. The prioritizing the storage error detection analysis of the identified encoded data slices includes a series of prioritizing steps. A first prioritizing step includes pausing scanning addresses of the DSN. A second prioritizing step includes identifying addresses of the encoded data slices having at least one storage trait in common with the one or more storage traits of the encoded data slice. A third prioritizing step includes sending rebuilding feedback request to storage nodes of the DSN storing the encoded data slices based on the addresses of the encoded data slices.

When a storage error is detected for one of the identified encoded data slices, the method continues at step 480 where the processing module identifies the one of the identified encoded data slices for rebuilding. When the storage error is detected for the one of the identified encoded data slices, the method continues at step 482 where the processing module determines storage traits for the one of the identified encoded data slices. The method continues at step 484 where the processing module generates updated storage traits based on the storage traits for the one of the identified encoded data slices and the one or more storage traits of the encoded data slice. The method continues at step 486 where the processing module adjusts the identifying the encoded data slices based on the updated storage traits to produce updated identified encoded data slices (e.g., expand or contract identified encoded data slices). The method continues at step 488 where the processing module prioritizes, within the rebuilding process, storage error detection analysis of the updated identified encoded data slices. The method continues at step 490 where the processing module facilitates rebuilding of the encoded data slice (e.g., issue a request to a rebuilding entity and/or directly rebuild). The method continues at step 492 where the processing module facilitates rebuilding of the one of the identified encoded data slices and the updated identified encoded data slices when identified.

FIG. 44C is a schematic block diagram of another embodiment of a dispersed storage network (DSN) system that includes a computing device 500 and a dispersed storage network (DSN) 436. The DSN 436 includes a plurality of storage nodes 440. Alternatively, the DSN 436 may be implemented utilizing one or more of a distributed storage and task network (DSTN), a DSTN module, a dispersed storage network memory, and a plurality of dispersed storage (DS) units. The computing device 500 may be implemented utilizing at least one of a server, a storage unit, a storage node of the plurality of storage nodes 440, a DSTN managing unit, a DSN managing unit, a DS unit, a storage server, a storage module, a DS processing unit, a DST execution unit, a user device, a DST processing unit, a storage integrity processing unit, a DSTN storage integrity processing unit, and a DST processing module. For example, the computing device 500 is implemented as a first storage node of the plurality of storage nodes 440. The computing device 500 includes a dispersed storage (DS) module 502. The DS module 502 includes a common traits module 504 and a storage error detection module 506.

The system functions to determine common storage traits of encoded data slices stored in the DSN 436 and to perform storage error detection analysis on some of the encoded data slices. With regards to the determining the common storage traits of the encoded data slices stored in the DSN 436, the common traits module 504 determines the common storage traits of the encoded data slices stored in the DSN 436 to produce groups of common storage trait encoded data slices 508 (e.g., identities by group of the common storage trait encoded data slices are produced).

With regards to the performing storage error detection analysis on some of the encoded data slices, the storage error detection module 506 performs a series of detecting steps. In a first detecting step, the storage error detection module 506 executes the storage error detection analysis on a sampling of encoded data slices (e.g., 1%) of one of the groups of common storage trait encoded data slices 508. The storage error detection module 506 executes the storage error detection analysis on the sampling of encoded data slices by a series of execution steps. A first execution step includes the storage error detection module 506 sending a rebuilding feedback request 454 to one or more storage nodes 440 of the DSN 436 storing the sampling of the encoded data slices. A second execution step includes the storage error detection module 506 receiving rebuilding feedback responses 456 from the one or more storage units 440, where one of the rebuilding feedback responses 456 includes storage information regarding the encoded data slice. A third execution step includes the storage error detection module 506 testing validity of the sampling of the encoded data slices based on the one of the rebuilding feedback responses 456 and comparative encoded data slice information (e.g., rebuilding feedback responses 456 from other storage nodes 440 with regards to other encoded data slices of a set of encoded data slices corresponding to a common DSN address including a common source name, a common generation number, and a common revision number). When the comparative encoded data slice information for the encoded data slice indicates a validity issue (e.g., a storage error), a fourth execution step includes the storage error detection module 506 identifying the encoded data slice as having the detected storage error (e.g., a slice error 510). Alternatively, or in addition to, the storage error detection module 506 facilitates rebuilding of the identified encoded data slice having the detected storage error.

When the sampling of the encoded data slices passes the storage error detection analysis, in a second detecting step, the storage error detection module 506 executes the storage error detection analysis on another sampling of encoded data slices of another one of the groups of common storage trait encoded data slices 508. When an encoded data slice of the sampling of encoded data slices has a detected storage error, in a third detecting step, the storage error detection module 506 executes the storage error detection analysis on a substantial number (e.g., all, nearly all of the encoded data slices) of the encoded data slices of the one of the groups of common storage trait encoded data slices 508. Alternatively, or in addition to, the storage error detection module 506 facilitates rebuilding of the encoded data slice having the detected storage error. In a similar fashion, the storage error detection module 506 may facilitate rebuilding of any of the substantial number of the encoded data slices of the one of the groups of common storage trait encoded data slices 508 when further storage errors are detected.

FIG. 44D is a flowchart illustrating another example of detecting storage errors. The method begins at step 520 where a processing module of one or more computing devices (e.g., a server of a dispersed storage network (DSN)) determines common storage traits of encoded data slices stored in a dispersed storage network (DSN) to produce groups of common storage trait encoded data slices. The method continues at step 522 where the processing module sends a rebuilding feedback request to one or more storage nodes of the DSN storing a sampling of the encoded data slices to initiate executing a storage error detection analysis on the sampling of encoded data slices of one of the groups of common storage trait encoded data slices. The method continues at step 524 where the processing module receives rebuilding feedback responses from the one or more storage units, where one of the rebuilding feedback responses includes storage information regarding an encoded data slice.

The method continues at step 526 where the processing module tests validity of the sampling of the encoded data slices based on the one of the rebuilding feedback responses and comparative encoded data slice information. The method continues at step 528 where the processing module determines whether the testing indicates a validity issue. The processing module determines that the testing indicates the validity issue when the comparative encoded data slice information for the encoded data slice indicates the validity issue. When the sampling of the encoded data slices passes the storage error detection analysis (e.g., no validity issue), the method loops back to step 522 where the processing module executes the storage error detection analysis on another sampling of encoded data slices of another one of the groups of common storage trait encoded data slices. When the testing indicates the validity issue, the method continues to step 530. The method continues at step 530 where the processing module identifies the encoded data slice as having the detected storage error. When the encoded data slice of the sampling of encoded data slices has the detected storage error, the method continues at step 532 where the processing module executes the storage error detection analysis on a substantial number of the encoded data slices of the one of the groups of common storage trait encoded data slices.

FIG. 45 is a flowchart illustrating an example of upgrading software. The method begins at step 534 where a processing module (e.g., a distributed storage and task (DST) client module) receives an upgrade request for software of a set of DST execution units. The request includes one or more of a storage set identifier (ID), a DST execution unit ID, software, a software ID, and a software storage location. The method continues at step 536 where the processing module identifies available DST execution units of the set of DST execution units. The identifying includes at least one of a query, a test, receiving an error message, and a status lookup.

The method continues at step 538 where the processing module determines a number of active DST execution units of the set of DST execution units. The number of active DST execution units is utilized to maintain a minimal number of DST execution units while a software upgrade sequence is executed. The minimal number of DST execution units may be substantially the same as a largest decode threshold number associated with a vault of a plurality of vaults supported by the set of DST execution units. The determining may be based on one or more of a vault list associated with the set of DST execution units, a lookup, a predetermination, and receiving. For example, the processing module determines the number of active DST execution units as 10 when the set of DST execution units supports two vaults, where a first vault is associated with a decode threshold of 6 and a second vault is associated with a decode threshold of 10.

The method continues at step 540 where the processing module selects one or more DST execution units of the set of DST execution units for software upgrading based on the available DST execution units such that at least an active number of DST execution units of the set of DST execution units remain active during an upgrade sequence. The selecting includes identifying DST execution units that have not previously been upgraded with the latest revision of software. The selecting further includes identifying DST execution units that are available (e.g., active and capable of performing an upgrade sequence).

The method continues at step 542 where the processing module facilitates upgrading software of the selected one or more DST execution units in accordance with the upgrade request. The facilitating includes one or more of forwarding the upgrade request to the selected units, sending the software to the selected units, sending the software location to the selected units, verifying that the software upgrade sequence is complete, and indicating that the software upgrade sequence is complete when verified (e.g., outputting a message). The method continues at step 544 where the processing module determines whether the set of DST execution units have all been upgraded. The determining may be based on one or more of accessing a list, receiving a message, and initiating a query. The method ends at step 546 when the set of DST execution units have all been upgraded. The method loops back to step 536 when the set of DST execution units have not all been upgraded.

FIG. 46 is a flowchart illustrating an example of authenticating a client of a client and server combination. For example, a user device of a distributed storage and task network (DSTN) authenticates with a distributed storage and task (DST) processing unit to gain access to data stored in a DSTN module. The method begins at step 548 where the client generates a certificate request. The certificate request indicates request of at least one of a certificate chain and a public key of the server. The method continues at step 550 where the client sends the certificate request to the server. The method continues at step 552 where the server generates a certificate response that includes a certificate chain and a server public key. The generating includes receiving the certificate request.

The method continues at step 554 where the client verifies the certificate chain and the server public key utilizing public key infrastructure techniques (e.g., compare a calculated hash over content of the certificate chain to a decrypted signature utilizing the server public key) and/or a direct match of the key (e.g., matching a public key of the certificate chain and the server public key). When verified, the method continues at step 556 where the client generates an authentication header that includes client credentials. The client credentials includes at least one of a username, a password, a verification value (e.g., a deterministic function of part of a message) and a client public key. The deterministic function includes at least one of a hashing function, a hash-based message authentication code (HMAC) function, a digital signature function, a cyclic redundancy check (CRC) function, a checksum function, and a masked generating function (MGF).

The method continues at step 558 where the client encrypts the authentication header utilizing the server public key to produce an encrypted authentication header. The method continues at step 560 where the client sends the encrypted authentication header and an access request to the server. The access request includes a DSTN access request to gain access to the DSTN module (e.g., a read request, a write request, etc.). The method continues at step 562 where the server decrypts the encrypted authentication header utilizing a server private key of a public/private key pair that includes the server public key and the server private key. The method continues at step 564 where the server verifies the authentication header. The authentication includes at least one of verifying the client credentials (e.g., matching the user name and password to a list) and verifying the verification value (e.g., a received hash value compared to a calculated hash value of the part of the message). When verified, the method continues at step 566 where the server processes the access request to enable access by the client to the DSTN module.

FIG. 47A is a schematic block diagram of another embodiment of a distributed storage and task network module that includes a first vault 1 of storage and a second vault 2 of storage. Each vault includes a plurality of distributed storage and task (DST) execution units 36. The vaults may share one or more common DST execution units 36. For example, vault 1 includes five DST execution units 36, one of which is a common DST execution unit 36 of a set of five DST execution is 36 that are included in vault 2 when a pillar width is 5.

From time to time one or more of the DST execution units 36 may be associated with degraded performance and/or fail. System impact is greater from a failure or degradation of a common DST execution unit 36 as compared to a non-common DST execution unit 36 with impact to two or more vaults. A failure abatement approach may be utilized to address degradation and failure of the one or more DST execution units. The failure abatement approach includes migrating slices from a degraded DST execution unit 36 to a non-degraded DST execution unit 36 and rebuilding slices associated with a failed DST execution unit 36 for at least temporary storage in a non-failed DST execution unit 36.

Determination of the failure abatement approach may be based on one or more of detection of the degraded DST execution unit 36, detection of a failed DST execution unit 36, how many vaults are associated with a degraded or failed DST execution unit 36, a decode threshold number associated with each vault, and how many non-failed DST execution units 36 are available per vault. For example, slices are migrated from a common degraded DST execution unit 36 to a non-degraded DST execution unit 36 when the common degraded DST execution unit 36 is associated with a vault where a number of available DST execution units 36 is less than a low threshold number (e.g., a decode threshold number). As another example, slices associated with a common failed DST execution unit 36 are rebuilt and stored to a non-failed DST execution unit 36 when the common failed DST execution unit 36 is associated with the vault where the number of available DST execution units 36 is less than the low threshold number.

A method of operation of the system is discussed in greater detail with reference to FIG. 47B.

FIG. 47B is a flowchart illustrating an example of protecting data. The method begins at step 568 where a processing module (e.g., of a distributed storage and task (DST) client module) detects a failing DST execution unit. The detecting includes one or more of receiving an error message, initiating a query, performing a test, and detecting one or more slice errors associated with the failing DST execution unit. The method continues at step 570 where the processing module identifies one or more vaults associated with the failing DST execution unit. The identifying includes at least one of receiving identities, performing a lookup (e.g., a registry), and initiating a query. For each of the one or more vaults, the method continues at step 572 where the processing module identifies other DST execution units associated with a storage set of DST execution units of the vault. The identifying includes at least one of receiving identifiers, performing a lookup, and initiating a query. The method continues at step 574 where the processing module determines status of the other DST execution units. The determining includes at least one of receiving status information, performing a lookup, and initiating a query.

For each of the one or more vaults, the method continues at step 576 where the processing module determines whether a number of DST execution units compares unfavorably to a low threshold. The low threshold may be based on a decode threshold associated with the vault. For example, the low threshold may be calculated by adding one to the decode threshold. The processing module determines that the comparison is unfavorable when the number of DST execution units is less than the low threshold. The method branches to step 580 when the comparison is unfavorable. The method continues to step 578 when the comparison is favorable. The method continues at step 578 where the processing module indicates the failing DST execution unit. The indicating may include one or more of generating and sending an error message, initiating rebuilding, and sending a request to replace the failing DST execution unit. The method continues at step 580 where the processing module facilitates activation of at least one replacement DST execution unit to include storing data associated with the failing DST execution unit when the number of DST execution units compares unfavorably with the low threshold. The facilitating includes at least one of migrating slices from the failing DST execution unit to the at least one replacement DST execution unit and rebuilding slices of the failing DST execution unit for storage in the at least one replacement DST execution unit.

FIG. 48A is a schematic block diagram illustrating another embodiment of a distributed storage and task execution unit 582 that includes a controller 584 and a memory 586. The memory 586 includes slice memory 588 and temporary slice memory 590. The controller 584 functions to receive slice access requests 592 with regards to slices 596 stored in the memory 586. The controller 584 further functions to generate slice access responses 594 with regards to the slice access requests 592. The slice access request 592 may include one or more of a slice name, a request type, and a slice. The slice access response 594 may include one or more of a slice name, a response type, and a slice.

A slice storage lifecycle includes storing a slice, reading the slice, and deleting the slice when it is believed the slice is no longer required. From time to time it may be desired to read a slice subsequent to deletion of the slice when the slice was deleted prematurely. The DST execution unit 582 supports a reversibility approach to support a level of slice availability when the slice has been deleted. The reversibility approach may be accomplished in a variety of ways. In a first way, the slice is stored in the slice memory 588 and a flag is set to indicate a deletion request when a delete slice request is received (e.g., but the slice is not physically deleted from the slice memory 588). The slice is retrieved from the slice memory 588 and utilized to form a slice access response 594 when a slice read request is received subsequent to the delete slice request. The slice may be deleted from the slice memory 588 upon an expiration time period after receiving the delete slice request.

In a second way, the slice is moved from the slice memory 588 to the temporary slice memory 590 when the delete slice request is received. The slice is retrieved from the temporary slice memory 590 and utilized to form the slice access response 594 when the slice read request is received subsequent to the delete slice request. The slice may be deleted from the temporary slice memory 590 upon the expiration of the time period after receiving the delete slice request. A method of operation of the DST execution unit is discussed in greater detail with reference to FIG. 48B.

FIG. 48B is a flowchart illustrating an example of processing a slice access request. The method begins at step 598 where a processing module (e.g., of a distributed storage and task (DST) execution unit) receives a slice access request. The slice access request includes one or more of a requesting entity identifier (ID), a request type, a slice, a revision number, a priority indicator, and a certainty level indicator. The method continues at step 600 where the processing module determines whether the slice access request may result in destructive modification of a slice stored in the slice memory. The determining includes comparing the request type to a list of request types associated with the destructive modification of the slice. The list of request types includes one or more of a delete type, an overwrite type, a modification type, and a new revision type.

When the slice access request will result in destructive modification of the slice stored in the slice memory, the method continues at step 602 where the processing module determines whether to facilitate reversibility of the slice access request. The determining may be based on one or more of the request type, the requesting entity ID, the priority indicator, the certainty level indicator, and a memory availability level indicator. For example, the processing module determines to facilitate reversibility of the slice access request when the certainty indicator indicates a low level of certainty that subsequent brief read slice requests will be issued to the DST execution unit with regards to the slice. As another example, the processing module determines not to facilitate reversibility of the slice access request when the memory availability level indicator indicates that less than a memory level threshold amount of available memory is available.

The method branches to step 606 when the processing module determines to facilitate reversibility. The method continues to step 604 when the processing module determines not to facilitate reversibility. The method continues at step 604 where the processing module facilitates execution of a corresponding slice access request operation (e.g., resulting indestructible edification of the slice). The method continues at step 606 where the processing module facilitates moving the slice from the slice memory to a temporary slice memory when the processing module determines to facilitate reversibility. The facilitating includes one or more of retrieving the slice from the slice memory, storing the slice in the temporary slice memory, obtaining metadata associated with the slice (e.g., slicing, revision number, timestamp, etc.), and storing the metadata in the temporary slice memory.

FIG. 49 is a flowchart illustrating an example of verifying slice integrity. The method begins at step 608 where a processing module (e.g., of a distributed storage and task (DST) execution unit) retrieves a slice from a slice memory to produce a retrieved slice. The retrieving may include selecting the slice based on at least one of a next slice of a test sequence, an error message, and a request. The method continues at step 610 where the processing module retrieves a slice integrity value associated with the slice from the slice memory to produce a retrieved slice integrity value. The slice integrity value was previously generated and stored in the slice memory in association with the storing of the slice. The generating of the slice integrity value includes performing a deterministic function on the slice to produce the slice integrity value.

The method continues at step 612 where the processing module generates a second slice integrity value based on the retrieved slice. The method continues at step 614 where the processing module determines whether the second slice integrity value compares favorably to the retrieved slice integrity value. For example, the processing module determines that the comparison is favorable when the second slice integrity value is substantially the same as the retrieved slice integrity value. The method branches to step 616 when the comparison is unfavorable. The method loops back to step 608 when the comparisons favorable.

The method continues at step 616 where the processing module facilitates rebuilding of the slice to produce a rebuilt slice when the comparison of the second slice integrity value to the retrieved slice integrity value is unfavorable. The facilitating includes sending a rebuild request includes a slice name of the slice and directly rebuilding the slice. The method continues at step 618 where the processing module stores the slice (e.g., error slice) in a temporary slice memory. The storing may include generating a timestamp and storing the timestamp in the temporary slice memory. The slice may be retrieved from the temporary slice memory for further inspection to determine a root cause of an error. The method continues at step 620 where the processing module stores the rebuilt slice in the slice memory (e.g. to replace the slice of the slice error).

FIG. 50A is a schematic block diagram of another embodiment of a distributed computing system that includes a distributed storage and task (DST) client module 34, and a vault 622. The vault 622 includes a storage set of a pillar width number of DST execution units 36 utilized to store a set of encoded data slices 1-5. For example, the set of DST execution units 36 includes five DST execution units to store slices 1-5 of the set of encoded data slices when the pillar width number is five. The DST client module 34 functions to encode data 624 into the set of encoded data slices producing slices 1-5. The DST client module 34 further functions to generate an integrity value for each slice of the set of encoded data slices to produce a set of integrity values as an integrity list 626. For each DST execution unit 36 of the set of DST execution units 36, the DST client module 34 outputs a corresponding slice of the set of encoded data slices and the integrity list 626 to the DST execution unit 36. For example, the DST client module 34 sends slice 2 and the integrity list 626 to a second DST execution unit 36 of the set of DST execution units 36.

A rebuilding DST execution unit 36 of the set of DST execution units 36 may rebuild a slice associated with a storage error to produce a rebuilt slice 628 when the storage error is associated with the slice. Any DST execution unit 36 may assume a rebuilding DST execution unit 36 role to rebuild a slice for any of the DST execution units 36 of the set of DST execution units 36. Alternatively, a rebuilding server may perform the rebuilding DST execution unit 36 role. The rebuilding DST execution unit 36 sends the rebuilt slice 628 to a receiving DST execution unit 36 associated with storage of the slice of the storage error. The receiving DST execution unit 36 validates the rebuilt slice 628 prior to storing the rebuilt slice 628 in a memory of the receiving DST execution unit 36. The validating may be accomplished in a variety of ways. In a first way, the receiving DST execution unit 36 establishes a level of trust with the rebuilding DST execution unit 36 and stores the rebuilt slice in the memory of the receiving DST execution unit 36 when the level of trust is favorable. In a second way, the receiving DST execution unit 36 calculates an integrity value of the rebuilt slice and compares the calculated integrity value to a retrieved integrity value of the integrity list 626 retrieved from the memory of the receiving DST execution unit 36. The receiving DST execution unit 36 stores rebuilt slice in the memory when the comparisons favorable (e.g., substantially the same).

In a third way, the receiving DST execution unit 36 receives copies of the integrity list 626 from a portion (e.g., majority) of the set of DST execution units 36 and produces a majority view of the integrity value of the slice (e.g., a common integrity value of a majority). Next, the receiving DST execution unit 36 compares the majority view of the integrity value to the calculated integrity value and stores the rebuilt slice 628 in the memory when the comparison is favorable.

FIG. 50B is a schematic block diagram of another embodiment of a dispersed storage network (DSN) system that includes a computing device 630 and a dispersed storage network (DSN) 632. The DSN 632 includes one or more storage device sets 634. The DSN 632 may be implemented utilizing one or more of a distributed storage and task network (DSTN), a DSTN module, a dispersed storage network memory, a plurality of distributed storage and task (DST) execution units, and a plurality of dispersed storage (DS) units. Each of the one or more storage device sets 634 includes a set of storage devices 636. Each storage device 636 may be implemented utilizing at least one of a DS unit, a storage node, a storage server, a storage unit, a storage module, a memory device, a memory, a DST execution unit, a user device, a DST processing unit, and a DST processing module. The computing device 630 may be implemented utilizing at least one of a server, a storage unit, a storage device 636, a DS unit, a storage server, a storage module, a DS processing unit, a DST execution unit, a user device, a DST processing unit, a DS processing module, and a DST processing module. For example, the computing device 630 is implemented as a first storage device 636 of the storage device set 634. The computing device 630 includes a dispersed storage (DS) module 638 and a memory 640. The memory 640 may be implemented utilizing one or more of a solid-state memory, an optical disk memory, and a magnetic disk memory. The DS module 638 includes a slice module 642, a comparative integrity module 644, and a storage module 646.

The system functions to obtain an encoded data slice 648 and an integrity value 650 of the encoded data slice, generate a comparative integrity value 654 based on integrity information 652, and store the encoded data slice 648 when integrity of the encoded data slice is favorably verified. A data segment is encoded using a dispersed storage error coding function to produce a set of encoded data slices that includes the encoded data slice 648, where the set of encoded data slices has an associated set of integrity values. The integrity information 652 is generated from the set of integrity values. For example, the integrity information 652 includes each integrity value of the set of integrity values. An integrity value of the set of integrity values may be generated by performing a deterministic function on an associated encoded data slice of the set of encoded data slices. The deterministic function includes at least one of a hashing function, a cyclic redundancy code function, a hash based message authentication code, a digital signature function, a mask generating function, and a sponge function. The set of encoded data slices and the integrity information 652 may be stored in the set of storage devices 636 of the storage device set 634. For example, a first slice of the set of encoded data slices and the integrity information 652 is stored in a first storage device 636, a second slice of the set of encoded data slices and the integrity information 652 is stored in a second storage device 636 etc.

With regards to the obtaining of the encoded data slice 648 and the integrity value 650 of the encoded data slice, the slice module 642 performs a series of obtaining steps. In a first obtaining step, the slice module 642 receives, from a requesting entity (e.g., from a rebuilding storage device 636, from a DS processing module), the encoded data slice 648 of the set of encoded data slices. Alternatively, the slice module 642 receives the encoded data slice 648 as a function of a rebuilding process, where the encoded data slice 648 corresponds to a rebuilt encoded data slice of a corrupt encoded data slice and the integrity information 652 corresponds to the set of encoded data slices that included the corrupt encoded data slice. In a second obtaining step, the slice module 642 generates an integrity value for the encoded data slice 648. For example, the slice module 642 performs the deterministic function on the encoded data slice 648 to generate the integrity value 650.

With regards to the generating the comparative integrity value 654, the comparative integrity module 644 obtains at least a portion of the integrity information 652 from another storage device 636 and generates the comparative integrity value 654 for the encoded data slice based on the at least a portion of the integrity information 652. The comparative integrity module 644 may generate the comparative integrity value 654 based on one or more obtained integrity values corresponding to the encoded data slice 648. For example, the comparative integrity module 644 establishes the comparative integrity value 654 based on a majority of the one or more obtained integrity values that are substantially the same. The comparative integrity module 644 generates the comparative integrity value 654 by a variety of approaches. In a first approach, the comparative integrity module 644 obtains, via a request, a retrieved integrity value of the encoded data slice from the other storage device 636, where the other storage device 636 produced the retrieved integrity value from the integrity information 652 and generates the comparative integrity value 654 by equating the comparative integrity value 654 to the retrieved integrity value. In a second approach, the comparative integrity module 644 obtains, via a request, the integrity information 652 from the other storage device 636, produces the retrieved integrity value from the integrity information 652, and generates the comparative integrity value 654 by equating the comparative integrity value 654 to the retrieved integrity value. In a third approach, the comparative integrity module 644 obtains a second at least a portion of the integrity information 652 from a second other storage device 636 and generates the comparative integrity value 654 for the encoded data slice based on the at least a portion of the integrity information 652 and the second at least a portion of the integrity information 652. For example, the comparative integrity module 644 generates the comparative integrity value 654 as a common obtained integrity value associated with the encoded data slice extracted from the at least a portion of the integrity information 652 and the second at least a portion of the integrity information 652.

With regards to the storing the encoded data slice 648, the storage module 646 facilitates storage of the encoded data slice in the memory 640 of the computing device 630 (e.g., storage device when the computing device 630 is implemented as the first storage device 636) when the integrity value 650 compares favorably to the comparative integrity value 654 (e.g., substantially the same). The storage module 646 may generate an error message 656 when the integrity value 650 compares unfavorably to the comparative integrity value 654. The error message 656 may include an identifier for the encoded data slice and an error status indicator.

FIG. 50C is a flowchart illustrating an example of verifying a slice. The method begins at step 660 where a processing module (e.g., of a storage device of a dispersed storage network (DSN) receives, from a requesting entity (e.g., a rebuilding storage device, a dispersed storage processing unit), an encoded data slice of a set of encoded data slices, where a data segment is encoded using a dispersed storage error coding function to produce the set of encoded data slices. The set of encoded data slices has an associated set of integrity values such that integrity information is generated from the set of integrity values. The receiving includes the processing module receiving the encoded data slice as a function of a rebuilding process, where the encoded data slice corresponds to a rebuilt encoded data slice of a corrupt encoded data slice and the integrity information corresponds to the set of encoded data slices that included the corrupt encoded data slice.

The method continues at step 662 where the processing module generates an integrity value for the encoded data slice. For example, the processing module performs a deterministic function on the encoded data slice to produce the integrity value. The method continues at step 664 where the processing module obtains at least a portion of the integrity information from another storage device by a variety of approaches. A first approach includes obtaining, via a request, a retrieved integrity value of the encoded data slice from the other storage device, where the other storage device produced the retrieved integrity value from the integrity information. A second approach includes obtaining, via a request, the integrity information from the other storage device and producing the retrieved integrity value from the integrity information. A third approach includes obtaining a second at least a portion of the integrity information from a second other storage device. Alternatively, the processing module may obtain integrity information from each of a set of storage devices that includes the storage device.

The method continues at step 666 where the processing module generates a comparative integrity value for the encoded data slice based on the at least a portion of the integrity information by a variety of approaches. A first approach includes generating the comparative integrity value by equating the comparative integrity value to the retrieved integrity value when the retrieved integrity value is retrieved from the other storage device. A second approach includes generating the comparative integrity value by equating the comparative integrity value to the retrieved integrity value when the retrieved integrity value is produced from the integrity information from the other storage device. A third approach includes generating the comparative integrity value for the encoded data slice based on the at least a portion of the integrity information and the second at least a portion of the integrity information when the second at least a portion of the integrity information is obtained from the second other storage device. A fourth approach includes generating the comparative integrity value for the encoded data slice based on integrity information from each storage device of the set of storage devices.

The method continues at step 668 where the processing module determines whether the integrity value compares favorably to the comparative integrity value. The processing module indicates that the integrity value compares favorably to the comparative integrity value when the integrity value is substantially the same as the comparative integrity value. The method branches to step 672 when the comparison is favorable. The method continues to step 670 when the comparison is unfavorable. The method continues at step 670 where the processing module generates an error message when the integrity value compares unfavorably to the comparative integrity value. The method continues at step 672 where the processing module facilitates storage of the encoded data slice in memory of the storage device when the integrity value compares favorably to the comparative integrity value FIG. 50D is a schematic block diagram of another embodiment of a dispersed storage network (DSN) system that includes a computing device 680 and a dispersed storage network (DSN) 632. The DSN 632 includes one or more storage device sets 634. The DSN 632 may be implemented utilizing one or more of a distributed storage and task network (DSTN), a DSTN module, a dispersed storage network memory, a plurality of distributed storage and task (DST) execution units, and a plurality of dispersed storage (DS) units. Each of the one or more storage device sets 634 includes a set of storage devices 636. Each storage device 636 may be implemented utilizing at least one of a DS unit, a storage node, a storage server, a storage unit, a storage module, a memory device, a memory, a DST execution unit, a user device, a DST processing unit, and a DST processing module. The computing device 680 may be implemented utilizing at least one of a server, a storage unit, a storage device 636, a DS unit, a storage server, a storage module, a DS processing unit, a DST execution unit, a user device, a DST processing unit, a DS processing module, and a DST processing module. For example, the computing device 680 is implemented as a first storage device 636 of the storage device set 634. The computing device 680 includes a dispersed storage (DS) module 682 and a memory 684. The memory 684 may be implemented utilizing one or more of a solid-state memory, an optical disk memory, and a magnetic disk memory. The DS module 682 includes a receive module 686, and integrity copy module 688, and a validate module 690.

The system functions to obtain integrity information 652 and an encoded data slice 648, obtain a copy of the integrity information 692, and store the encoded data slice 648 when the integrity information 652 and the copy of the integrity information 692 compare favorably. A data segment is encoded using a dispersed storage error coding function to produce a set of encoded data slices that includes the encoded data slice 648, where the set of encoded data slices has an associated set of integrity values. The integrity information 652 is generated from the set of integrity values. For example, the integrity information 652 includes each integrity value of the set of integrity values. An integrity value of the set of integrity values may be generated by performing a deterministic function on an associated encoded data slice of the set of encoded data slices. The set of encoded data slices and the integrity information 652 may be stored in the set of storage devices 636 of the storage device set 634. For example, a first slice of the set of encoded data slices and the integrity information 652 is stored in a first storage device 636, a second slice of the set of encoded data slices and the integrity information 652 is stored in a second storage device 636 etc.

Subsequent to storage, the integrity information 652 may be available for retrieval from a storage device 636 as a copy of the integrity information 692.

With regards to the obtaining the integrity information 652 and the encoded data slice 648, the receive module 686 receives, from a requesting entity (e.g., a DS processing module, a rebuilding storage device 636), the integrity information 652 and the encoded data slice 648. The receiving includes the receive module 686 receiving the encoded data slice 648 as a function of a rebuilding process, where the encoded data slice 648 corresponds to a rebuilt encoded data slice of a corrupt encoded data slice and the integrity information 652 corresponds to the set of encoded data slices that included the corrupt encoded data slice. Alternatively, or in addition to, the receive module 686 may generate an integrity value 650 for the encoded data slice 648. For example, the receive module 686 performs the deterministic function on the encoded data slice 648 to generate the integrity value 650.

With regards to the obtaining the copy of the integrity information 692, the integrity copy module 688 obtains at least a portion of the copy of the integrity information 692 from another storage device 636. For example, the integrity copy module 688 receives the at least a portion of the copy of the integrity information 692 from a second storage device 636 of the storage device set 634. Alternatively, the integrity copy module 688 obtains, via a request, a retrieved integrity value of the encoded data slice from the other storage device 636, where the other storage device 636 produced the retrieved integrity value from the copy of the integrity information 692. Alternatively, the integrity copy module 688 obtains the copy of the integrity information 692 from the other storage device 636 (e.g., all portions).

With regards to the storing the encoded data slice 648, the validate module 690 compares the at least a portion of the copy of the integrity information 692 with a corresponding at least a portion of the received integrity information 652. For example, the validate module 690 compares a subject integrity value of the at least a portion of the copy of the integrity information 692 that corresponds to the encoded data slice 648 to a subject integrity value of the at least a portion of the received integrity information 652 that corresponds to the encoded data slice 648. Alternatively, the validate module 690 compares the integrity value 650 as the corresponding at least a portion of the received integrity information 652 with the retrieved integrity value as the at least a portion of the copy of the integrity information 692 when the receive module 686 generates the integrity value 650 and the integrity copy module 688 obtains the retrieved integrity value of the encoded data slice from the other storage device 636. Alternatively, the validate module 690 compares the copy of the integrity information 692 with the received integrity information 652 when the integrity copy module 688 obtains the copy of the integrity information 692 from the other storage device 636. The validate module 690 facilitates storage of the encoded data slice 648 in the memory 684 of the storage device 636 when the comparison of the at least a portion of the copy of the integrity information 692 with the corresponding at least a portion of the received integrity information 652 is favorable (e.g., substantially the same).

FIG. 50E is a flowchart illustrating another example of verifying a slice. The method begins at step 700 where a processing module (e.g., of a storage device of a dispersed storage network (DSN)) receives, from a requesting entity (e.g., a dispersed storage processing unit, a rebuilding storage device), integrity information and an encoded data slice of a set of encoded data slices, where a data segment is encoded using a dispersed storage error coding function to produce the set of encoded data slices that includes the encoded data slice. The integrity information is generated from a set of integrity values, where the set of integrity values are associated with the set of encoded data slices. The receiving may include receiving the encoded data slice as a function of a rebuilding process, wherein the encoded data slice corresponds to a rebuilt encoded data slice of a corrupt encoded data slice and the integrity information corresponds to the set of encoded data slices that included the corrupt encoded data slice. The receiving may further include the processing module generating an integrity value for the encoded data slice. For example, the processing module performs a deterministic function on the encoded data slice to produce the integrity value.

The method continues at step 702 where the processing module obtains at least a portion of a copy of the integrity information from another storage device. The obtaining includes a variety of obtaining approaches. A first obtaining approach includes obtaining, via a request, a retrieved integrity value of the encoded data slice from the other storage device, where the other storage device produced the retrieved integrity value from the copy of the integrity information. A second obtaining approach includes obtaining, by the processing module, the copy of the integrity information from the other storage device.

The method continues at step 704 where the processing module compares the at least a portion of the copy of the integrity information with a corresponding at least a portion of the received integrity information. The comparing includes a variety of comparing approaches. A first comparing approach includes comparing the integrity value as the corresponding at least a portion of the received integrity information with the retrieved integrity value as the at least a portion of the copy of the integrity information when the processing module generates the integrity value and obtains the retrieved integrity value. A second comparing approach includes comparing the copy of the integrity information with the received integrity information when the processing module obtains the copy of the integrity information. The method continues at step 706 where the processing module facilitate storage of the encoded data slice in memory of the storage device when the comparison is favorable.

FIG. 51A is a schematic block diagram of another embodiment of a distributed computing system that includes a distributed storage and task (DST) client module 34 and a distributed storage and task network (DSTN) module 22. Alternatively, the DST client module 34 is implemented as a dispersed storage processing module and the DSTN module 22 is implemented as a dispersed storage network memory. The DST client module 34 receives data 710 for storage in the DSTN module 22. The DST client module 34 partitions the data 710 into at least two data partitions. For each data partition of the at least two data partitions, the DST client module 34 encodes the data partition to produce a plurality of sets of encoded data slices. The DST client module 34 outputs each plurality of sets of encoded data slices to the DSTN module 22 for storage therein. For example, the DST client module 34 generates and sends a first plurality of sets of encoded data slices 712, corresponding to a first data partition, to the DSTN module 22 and generates and sends a second plurality of sets of encoded data slices 714, corresponding to a second data partition, to the DSTN module 22 when two data partitions are included in the at least two data partitions.

The DST client module 34 updates a directory to associate the data 710 with storage of the two or more plurality of sets of encoded data slices. For example, the DST client module 34 generates a segment allocation table (SAT) vault source name for each data partition of the least two data partitions to produce at least two SAT vault source names. The DST client module 34 generates a SAT vault source name for the data 710. The DST client module 34 updates the directory to include the at least two SAT vault source names and for each SAT vault source name a corresponding object descriptor of a data partition associated with the corresponding plurality of sets of encoded data slices. The DST client module 34 updates the directory to include the SAT vault source name for the data 710. Such a directory is discussed in greater detail with reference to FIG. 51B.

For each SAT vault source name associated with the at least two data partitions, the DST client module 34 generates a SAT. The DST client module 34 generates a SAT for the data 710 that includes a SAT corresponding to each of the at least two data partitions. Such a set of SATs is discussed in greater detail with reference to FIG. 51C.

FIG. 51B is a diagram illustrating an example of a directory 716 that includes an entry for data storage to a distributed storage and task network (DSTN) module and an entry for each data partition of the data when two or more data partitions are utilized to store the data in the DSTN module. Each entry includes an object entry of an object field 718 and a segment allocation table (SAT) vault source name entry of a SAT vault source name field 720. The object entry includes a descriptor of the data or each data protection. The SAT vault source name entry includes a vault source name generated to store a corresponding SAT in the DSTN module. For example, data is partitioned into two data partitions and represented as data partition 1 and data partition 2. A SAT corresponding to data partition 1 is stored in a SAT vault source name of 1A6B, a SAT corresponding to data partition 2 is stored in a SAT vault source name of 48D2, and a SAT corresponding to the data is stored in a SAT vault source name of 34FA.

FIG. 51C is a set of diagrams illustrating examples of segment allocation tables (SATs) corresponding to storage of data in a distributed storage and task network (DSTN) module when the data is partitioned into two or more data partitions. Storage of a first partition of data is associated with a SAT stored at vault source name 1A6B and storage of a second partition of data is associated with a SAT stored at vault source name 48D2. Another SAT is stored at vault source name 34FA that represents storage of the data as the two data partitions.

Each SAT includes a start segment vault source name entry of a start segment vault source name field 722, a segment size entry of a segment size field 724, and a total length entry of a total length field 726. The start segment vault source name entry indicates a vault source name associated with storage of a set of encoded data slices of a first segment of one or more segments associated with the SAT. The segment size entry indicates a number of bytes of each segment of the one or more segments. The total length entry indicates a number of bytes of all of the one or more segments. For example, the first data partition is stored as one or more segments starting with a first segment stored at a vault source name of AA01 where each segment is 100 bytes and a total number of bytes of the first data partition is 500 bytes. As another example, the second data partition is stored as one of more segments starting with a first segment stored at a vault source name of BB05 where each segment is 100 bytes and a total number of bytes of the second data partition is 600 bytes.

The SAT associated with the data indicates the SAT information of the two or more data partitions as two or more regions of the SAT of the data. The first region includes the start segment vault source name of AA01 corresponding to the first data partition. The second region includes the start segment all source name of BB05 corresponding to the second data partition.

FIG. 51D is a flowchart illustrating an example of parallel storage of data in a dispersed storage network. The method begins at step 728 where a processing module (e.g., of a distributed storage and task (DST) client module) partitions data for storage into two or more data partitions. The partitioning may be based on a partitioning scheme lookup, receiving the partitioning scheme, and an attribute of the data (e.g., size). For each partition, the method continues at step 730 where the processing module encodes the partition utilizing a dispersed storage error coding function to produce a plurality of encoded data slices. The encoding may be accomplished in a substantially parallel method such that while a first partition is being encoded a second partition is simultaneously being encoded by another encoding resource potentially resulting in a system performance improvement.

For each partition, the method continues at step 732 where the processing module facilitates generating and storing a segment allocation table (SAT) at a corresponding SAT vault source name. The generating includes generating an entry for each field including a start segment vault source name field, a number of bytes per second field, and a number of total bytes for the partition field. For each partition, the method continues at step 734 where the processing module facilitates storing a corresponding plurality of encoded data slices in a distributed storage and task network (DSTN) module in accordance with a corresponding SAT (e.g., storing starting with the start segment vault source name). The facilitating includes generating write slice requests that includes the plurality of sets of encoded data slices and sending the write slice requests to the DSTN module.

For each partition, the method continues at step 736 where the processing module facilitates updating a directory to include a corresponding SAT vault source name. For example, a corresponding data partition identifier is associated with the SAT vault source name of the data partition. The method continues at step 740 where the processing module facilitates generating and storing an SAT for the data that includes SAT information for the two or more data partition's and a corresponding SAT vault source name for the data. For example, the processing module combines information from the two or more SATs in the SAT for the data. The method continues at step 742 where the processing module updates the directory to include the SAT vault source name of the data. The updating includes establishing an association between the SAT vault source name of the data and a data identifier of the data.

FIG. 52A is a schematic block diagram of another embodiment of a distributed storage and task (DST) execution unit 36 that includes a controller 744 and a memory 746. The memory may include a plurality of containers 1-N. Each container of the plurality of containers 1-N may be implemented utilizing one or more memory devices. Each container of the plurality of containers 1-N is operable to store slices 748 received by the controller 744. The controller 744 selects a container of the plurality of containers 1-N to produce a selected container to store a slice 748 based on a slice name 750 associated with the slice 748. Each container of the plurality of containers 1-N may be mapped to an address range that includes the slice name 750. For example, the controller 744 selects container 2 when a slice name 750 maps to a second range of slice names. As another example, the controller 744 selects container 150 when the slice name 750 maps to a 150th range of slice names. The N address ranges may be defined by n most significant bits of the slice name 750 in accordance with an expression of: $N=2^n$. The slice name structure is discussed in greater detail with reference to FIG. 52B.

FIG. 52B is a diagram illustrating an example of a slice name structure 752 that includes a container identifier (ID) field 754, a vault ID field 756, an object number field 758, and a segment number field 760. The container ID field 754 is utilized for a container ID entry signifying a container identifier of a plurality of containers of a memory. The vault ID field 756 is utilized for a vault ID entry, where a vault corresponding to the vault ID is associated with a requesting entity accessing a slice associated with the slice name. The object number field 758 is utilized for any object number entry associated with data associated with the slice corresponding to the slice name. The object number entry may be generated in a variety of ways. In a first way, the object number is generated as a random number. In a second way, a deterministic function is performed on a data ID of the data to produce the object number. A directory and/or index is utilized to associate the data ID and the object number (e.g., a portion of the slice name that includes the vault ID and the number may be stored as a source name). The segment number field 760 is utilized for a segment number entry associated with the slice name to denote one or more data segments associated with the data.

A table may be generated to store associations between container IDs and storage locations of each of the containers in the memory. For example, an entry of the table includes a container ID and a corresponding memory offset within the memory associated with the container of the container ID. A slice may be stored at a container offset within the container. A relationship between a slice and the container offset within the container may be stored in a container directory. The container directory structure is discussed in greater detail with reference to FIG. 52C.

FIG. 52C is a diagram illustrating an example of a container directory 762 that includes a plurality of entries, where each entry of the plurality of entries is associated with a slice stored in a container of a plurality of containers within a memory. Each entry of the plurality of entries includes a slice name entry of a slice name field 752, a slice size entry of a slice size field 764, and a container offset entry of a container offset field 766. The slice name entry corresponds to a slice name of an associate slice stored in the container. The slice size entry corresponds to a size (e.g., number of bytes) of the slice. The container offset entry corresponds to an offset within the container where the slice is stored (e.g., the first byte starts at an offset location within a container). For example, a slice of slice name 43 DB is 10,000 bytes in size and is stored at an offset of 02 DB within a container associated with the container directory. As another example, a slice of slice name 59D5 is 4,000 bytes in size and is stored at an offset of 4390 within the container. Container offsets may be determined in a variety of ways. In a first way, an available location within the container that includes enough space to store the slice is associated with the slice. In a second way, a deterministic function is performed on the slice name to provide an index into the container directory when the container is organized as a plurality of sections evenly distributed and utilizing a contiguous plurality of container offsets.

FIG. 52D is a flowchart illustrating an example of accessing memory. The method begins at step 768 where a processing module (e.g., of a distributed storage and task (DST) execution unit) receives a slice access request that includes a slice name. The method continues at step 770 where the processing module identifies a container based on the slice name. The identifying may be based on at least one of a container identifier (ID) table lookup to produce a container ID table based on the slice name and extracting the container ID from the slice name (e.g., from a container ID field). The method continues at step 772 where the processing module performs a deterministic function on the slice name to produce an index into a container table. The deterministic function includes at least one of a mathematical deterministic function, a hash function, a hash-based message authentication code function, and a masked generating function (MGF). The method continues at step 774 where the processing module extracts a container offset corresponding to an entry of the container table utilizing the index into the container table. The method continues at step 776 where the processing module accesses the container utilizing extracting offset. The accessing includes combining the container access with a storage location associated with the container to reduce an access address and accessing the container at the access address.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a processing module, a functional block, hardware, and/or software stored on memory for performing one or more functions as may be described herein. Note that, if the module is implemented via hardware, the hardware may operate independently and/or in conjunction software and/or firmware. As used herein, a module may contain one or more sub-modules, each of which may be one or more modules.

While particular combinations of various functions and features of the present invention have been expressly described herein, other combinations of these features and functions are likewise possible. The present invention is not limited by the particular examples disclosed herein and expressly incorporates these other combinations.

What is claimed is:

1. A method for execution by a processing module of one or more computing devices, the method comprises:
   detecting, in accordance with a rebuilding process, a storage error of an encoded data slice stored in a storage node of a dispersed storage network (DSN);
   identifying the encoded data slice for rebuilding;
   identifying one or more storage traits associated with the encoded data slice;
   identifying encoded data slices having at least one storage trait in common with the one or more storage traits of the encoded data slice to produce identified encoded data slices;
   prioritizing, within the rebuilding process, storage error detection analysis of the identified encoded data slices over other encoded data slices stored in the DSN; and
   when a storage error is detected for one of the identified encoded data slices, identifying the one of the identified encoded data slices for rebuilding.

2. The method of claim 1, wherein the rebuilding process comprises:
   scanning addresses of the DSN;
   identifying the storage node in accordance with the scanning of the addresses of the DSN;
   sending a rebuilding feedback request to the storage node;
   receiving a rebuilding feedback response from the storage node, wherein the rebuilding feedback response includes information that identifies encoded data slices stored in the storage node;
   testing validity of the encoded data slices identified by the storage node based on the rebuilding feedback response and comparative encoded data slice information; and
   when the comparative encoded data slice information for the encoded data slice indicates a validity issue, identifying the encoded data slice as having the storage error.

3. The method of claim 1, wherein the prioritizing the storage error detection analysis of the identified encoded data slices comprises:
   pausing scanning addresses of the DSN;
   identifying addresses of the encoded data slices having at least one storage trait in common with the one or more storage traits of the encoded data slice; and
   sending rebuilding feedback request to storage nodes of the DSN storing the encoded data slices based on the addresses of the encoded data slices.

4. The method of claim 1, wherein a storage trait of the storage traits comprises one or more of:
   a write timeframe;
   a writing entity identifier;
   a data owner identifier;
   a vault identifier;
   previous rebuilding operations;
   a common network connection;
   a common network path; and
   an address being in an address range.

5. The method of claim 1, wherein the identifying the encoded data slices having at the least one storage trait in common with the one or more storage traits of the encoded data slice comprises:
   identifying first priority encoded data slices of the identified encoded data slices that have more than one storage trait in common with the one or more storage traits of the encoded data slice; and
   identifying second priority encoded data slices of the identified encoded data slices that have one storage trait in common with the one or more storage traits of the encoded data slice, wherein the first priority encoded data slices have a higher priority than the second priority encoded data slices.

6. The method of claim 1 further comprises:
   when the storage error is detected for the one of the identified encoded data slices, determining storage traits for the one of the identified encoded data slices;
   generating updated storage traits based on the storage traits for the one of the identified encoded data slices and the one or more storage traits of the encoded data slice;
   adjusting the identifying the encoded data slices based on the updated storage traits to produce updated identified encoded data slices; and
   prioritizing, within the rebuilding process, storage error detection analysis of the updated identified encoded data slices.

7. The method of claim 1 further comprises:
   facilitating rebuilding of the encoded data slice; and
   facilitating rebuilding of the one of the identified encoded data slices.

8. A method for execution by a processing module of one or more computing devices, the method comprises:
   determining common storage traits of encoded data slices stored in a dispersed storage network (DSN) to produce groups of common storage trait encoded data slices;
   executing storage error detection analysis on a sampling of encoded data slices of one of the groups of common storage trait encoded data slices;
   when the sampling of the encoded data slices passes the storage error detection analysis, executing the storage error detection analysis on another sampling of encoded data slices of another one of the groups of common storage trait encoded data slices; and
   when an encoded data slice of the sampling of encoded data slices has a detected storage error, executing the storage error detection analysis on a substantial number of the encoded data slices of the one of the groups of common storage trait encoded data slices.

9. The method of claim 8, wherein a storage trait of the storage traits comprises one or more of:
- a write timeframe;
- a writing entity identifier;
- a data owner identifier;
- a vault identifier;
- previous rebuilding operations;
- a common network connection;
- a common network path; and
- an address being in an address range.

10. The method of claim 8, wherein the executing the storage error detection analysis on the sampling of encoded data slices comprises:
- sending a rebuilding feedback request to one or more storage nodes of the DSN storing the sampling of the encoded data slices;
- receiving rebuilding feedback responses from the one or more storage nodes, wherein one of the rebuilding feedback responses includes storage information regarding the encoded data slice;
- testing validity of the sampling of the encoded data slices based on the one of the rebuilding feedback responses and comparative encoded data slice information; and
- when the comparative encoded data slice information for the encoded data slice indicates a validity issue, identifying the encoded data slice as having the detected storage error.

11. A dispersed storage (DS) module comprises:
- a first module, when operable within a computing device, causes the computing device to:
  - detect, in accordance with a rebuilding process, a storage error of an encoded data slice stored in a storage node of a dispersed storage network (DSN); and
  - identify the encoded data slice for rebuilding;
- a second module, when operable within the computing device, causes the computing device to:
  - identify one or more storage traits associated with the encoded data slice; and
  - identify encoded data slices having at least one storage trait in common with the one or more storage traits of the encoded data slice to produce identified encoded data slices; and
- a third module, when operable within the computing device, causes the computing device to:
  - prioritize, within the rebuilding process, storage error detection analysis of the identified encoded data slices over other encoded data slices stored in the DSN; and
  - when a storage error is detected for one of the identified encoded data slices, identify the one of the identified encoded data slices for rebuilding.

12. The DS module of claim 11, wherein the rebuilding process comprises:
- the first module further functions to:
  - scan addresses of the DSN;
  - identify the storage node in accordance with the scanning of the addresses of the DSN;
  - sending a rebuilding feedback request to the storage node;
  - receive a rebuilding feedback response from the storage node, wherein the rebuilding feedback response includes information that identifies encoded data slices stored in the storage node;
  - test validity of the encoded data slices identified by the storage node based on the rebuilding feedback response and comparative encoded data slice information; and
  - when the comparative encoded data slice information for the encoded data slice indicates a validity issue, identify the encoded data slice as having the storage error.

13. The DS module of claim 11, wherein the third module functions to prioritize the storage error detection analysis of the identified encoded data slices by:
- pausing scanning addresses of the DSN;
- identifying addresses of the encoded data slices having at least one storage trait in common with the one or more storage traits of the encoded data slice; and
- sending rebuilding feedback request to storage nodes of the DSN storing the encoded data slices based on the addresses of the encoded data slices.

14. The DS module of claim 11, wherein a storage trait of the storage traits comprises one or more of:
- a write timeframe;
- a writing entity identifier;
- a data owner identifier;
- a vault identifier;
- previous rebuilding operations;
- a common network connection;
- a common network path; and
- an address being in an address range.

15. The DS module of claim 11, wherein the second module functions to identify the encoded data slices having at the least one storage trait in common with the one or more storage traits of the encoded data slice by:
- identifying first priority encoded data slices of the identified encoded data slices that have more than one storage trait in common with the one or more storage traits of the encoded data slice; and
- identifying second priority encoded data slices of the identified encoded data slices that have one storage trait in common with the one or more storage traits of the encoded data slice, wherein the first priority encoded data slices have a higher priority than the second priority encoded data slices.

16. The DS module of claim 11 further comprises:
- the second module further functions to:
  - when the storage error is detected for the one of the identified encoded data slices, determine storage traits for the one of the identified encoded data slices;
  - generate updated storage traits based on the storage traits for the one of the identified encoded data slices and the one or more storage traits of the encoded data slice; and
  - adjust the identifying the encoded data slices based on the updated storage traits to produce updated identified encoded data slices; and
- the third module further functions to:
  - prioritize, within the rebuilding process, storage error detection analysis of the updated identified encoded data slices.

17. The DS module of claim 11 further comprises:
- the third module further functions to:
  - facilitate rebuilding of the encoded data slice; and
  - facilitate rebuilding of the one of the identified encoded data slices.

18. A dispersed storage (DS) module comprises:
- a first module, when operable within a computing device, causes the computing device to:
  - determine common storage traits of encoded data slices stored in a dispersed storage network (DSN) to produce groups of common storage trait encoded data slices; and a second module, when operable within the computing device, causes the computing device to:
  execute storage error detection analysis on a sampling of encoded data slices of one of the groups of common storage trait encoded data slices;
  when the sampling of the encoded data slices passes the storage error detection analysis, execute the storage error detection analysis on another sampling of encoded data slices of another one of the groups of common storage trait encoded data slices; and
  when an encoded data slice of the sampling of encoded data slices has a detected storage error, execute the storage error detection analysis on a substantial number of the encoded data slices of the one of the groups of common storage trait encoded data slices.

19. The DS module of claim 18, wherein a storage trait of the storage traits comprises one or more of:
  a write timeframe;
  a writing entity identifier;
  a data owner identifier;
  a vault identifier;
  previous rebuilding operations;
  a common network connection;
  a common network path; and
  an address being in an address range.

20. The DS module of claim 18, wherein the second module executes the storage error detection analysis on the sampling of encoded data slices by:
  sending a rebuilding feedback request to one or more storage nodes of the DSN storing the sampling of the encoded data slices;
  receiving rebuilding feedback responses from the one or more storage nodes, wherein one of the rebuilding feedback responses includes storage information regarding the encoded data slice;
  testing validity of the sampling of the encoded data slices based on the one of the rebuilding feedback responses and comparative encoded data slice information; and
  when the comparative encoded data slice information for the encoded data slice indicates a validity issue, identifying the encoded data slice as having the detected storage error.

* * * * *